US008553444B2

(12) United States Patent
Muraoka et al.

(10) Patent No.: US 8,553,444 B2
(45) Date of Patent: Oct. 8, 2013

(54) VARIABLE RESISTANCE NONVOLATILE STORAGE DEVICE AND METHOD OF FORMING MEMORY CELL

(75) Inventors: Shunsaku Muraoka, Osaka (JP); Yoshihiko Kanzawa, Osaka (JP); Satoru Mitani, Osaka (JP); Koji Katayama, Nara (JP); Kazuhiko Shimakawa, Osaka (JP); Satoru Fujii, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 499 days.

(21) Appl. No.: 12/743,472

(22) PCT Filed: Aug. 20, 2009

(86) PCT No.: PCT/JP2009/003969
§ 371 (c)(1),
(2), (4) Date: May 18, 2010

(87) PCT Pub. No.: WO2010/021134
PCT Pub. Date: Feb. 25, 2010

(65) Prior Publication Data
US 2011/0044088 A1 Feb. 24, 2011

(30) Foreign Application Priority Data
Aug. 20, 2008 (JP) ................................. 2008-212256

(51) Int. Cl.
G11C 11/00 (2006.01)
(52) U.S. Cl.
USPC ........................................................ 365/148
(58) Field of Classification Search
USPC ........................................................ 365/148
See application file for complete search history.

(56) References Cited

U.S. PATENT DOCUMENTS 6,995,999 B2  2/2006  Morimoto
7,206,216 B2  4/2007  Osada et al.
(Continued)

FOREIGN PATENT DOCUMENTS

EP  2 063 467  5/2009
JP  60-140749  7/1985
(Continued)

OTHER PUBLICATIONS

International Search Report issued Nov. 17, 2009 in International (PCT) Application No. PCT/JP2009/003969.
(Continued)

Primary Examiner — Hoai V Ho
Assistant Examiner — Jay Radke
(74) Attorney, Agent, or Firm — Wenderoth, Lind & Ponack, L.L.P.

(57) ABSTRACT

A variable resistance nonvolatile storage device which includes (i) a semiconductor substrate (301), (ii) a variable resistance element (309) having: lower and upper electrodes (309a, 309c); and a variable resistance layer (309b) whose resistance value reversibly varies based on voltage signals each of which has a different polarity and is applied between the electrodes (309a, 309c), and (iii) a MOS transistor (317) formed on the substrate (301), wherein the variable resistance layer (309b) includes: oxygen-deficient transition metal oxide layers (309b-1, 309b-2) having compositions $MO_x$ and $MO_y$ (where x<y) and in contact with the electrodes (309a, 309c) respectively, and a diffusion layer region (302b) is connected with the lower electrode (309a) to form a memory cell (300), the region (302b) serving as a drain of the transistor (317) upon application of a voltage signal which causes a resistance change to high resistance state in the variable resistance layer (309b).

26 Claims, 36 Drawing Sheets

(56) References Cited

U.S. PATENT DOCUMENTS

| | | |
|---|---|---|
| 7,385,838 B2 | 6/2008 | Osada et al. |
| 2004/0264244 A1 | 12/2004 | Morimoto |
| 2005/0185445 A1 | 8/2005 | Osada et al. |
| 2006/0023497 A1* | 2/2006 | Kawazoe et al. ............. 365/158 |
| 2006/0289942 A1 | 12/2006 | Horii et al. |
| 2007/0159871 A1 | 7/2007 | Osada et al. |
| 2007/0200158 A1* | 8/2007 | Genrikh et al. ............... 257/306 |
| 2007/0240995 A1 | 10/2007 | Odagawa et al. |
| 2007/0267675 A1 | 11/2007 | Cho et al. |
| 2008/0111245 A1 | 5/2008 | Osano et al. |
| 2008/0117664 A1 | 5/2008 | Kinoshita et al. |
| 2009/0102598 A1 | 4/2009 | Yamazaki et al. |
| 2009/0250678 A1 | 10/2009 | Osano et al. |
| 2009/0283736 A1* | 11/2009 | Kanzawa et al. ................. 257/2 |

FOREIGN PATENT DOCUMENTS

| | | |
|---|---|---|
| JP | 2005-25914 | 1/2005 |
| JP | 2005-267837 | 9/2005 |
| JP | 2006-190376 | 7/2006 |
| JP | 2007-5609 | 1/2007 |
| JP | 2007-27537 | 2/2007 |
| JP | 2007-173515 | 7/2007 |
| JP | 2007-287761 | 11/2007 |
| JP | 2007-311798 | 11/2007 |
| JP | 2008-235427 | 10/2008 |
| JP | 2008-305889 | 12/2008 |
| JP | 2009-21524 | 1/2009 |
| JP | 2009-135370 | 6/2009 |
| JP | 2010-21381 | 1/2010 |
| WO | 2006/075574 | 7/2006 |
| WO | 2007/013174 | 2/2007 |
| WO | 2007/138646 | 12/2007 |
| WO | 2007/141865 | 12/2007 |
| WO | 2008/126365 | 10/2008 |
| WO | 2008/149484 | 12/2008 |
| WO | 2009/001534 | 12/2008 |
| WO | 2009/050833 | 4/2009 |
| WO | 2009/050861 | 4/2009 |
| WO | 2009/072213 | 6/2009 |
| WO | 2010/004705 | 1/2010 |

OTHER PUBLICATIONS

Akira Usami et al., "*Semiconductor Engineering for Integrated Circuits*", Kougyou Chousakai, 1992, pp. 46-49 with its partial English translation (p. 47, line 1 to 6 and p. 48, Fig. 2.1).

Z. Wei et al., "*Highly Reliable TaOx ReRAM and Direct Evidence of Redox Reaction Mechanism*", Electron Devices Meeting, 2008, IEDM 2008, IEEE International Dec. 15-17, 2008, pp. 293-296.

\* cited by examiner

FIG. 3
(a)
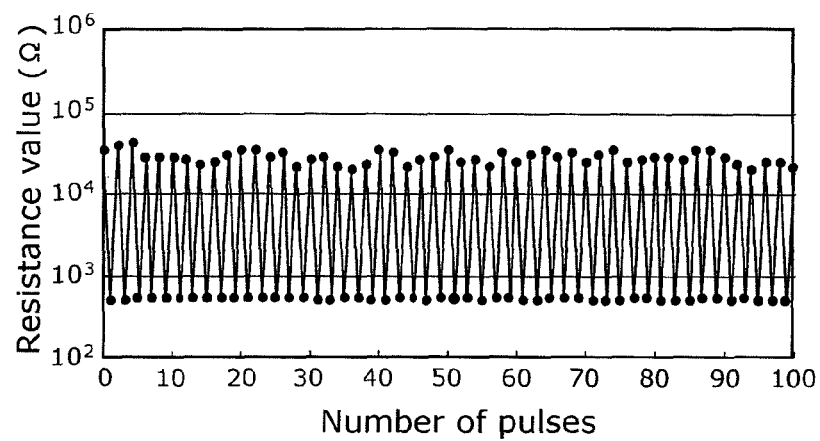
(b)
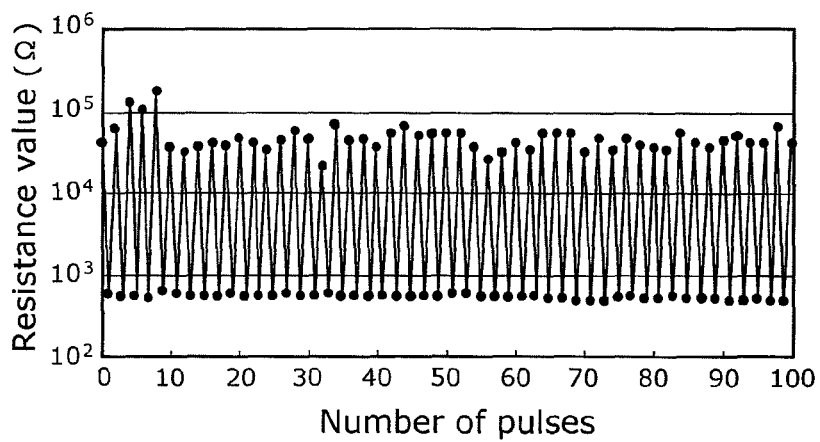

FIG. 13
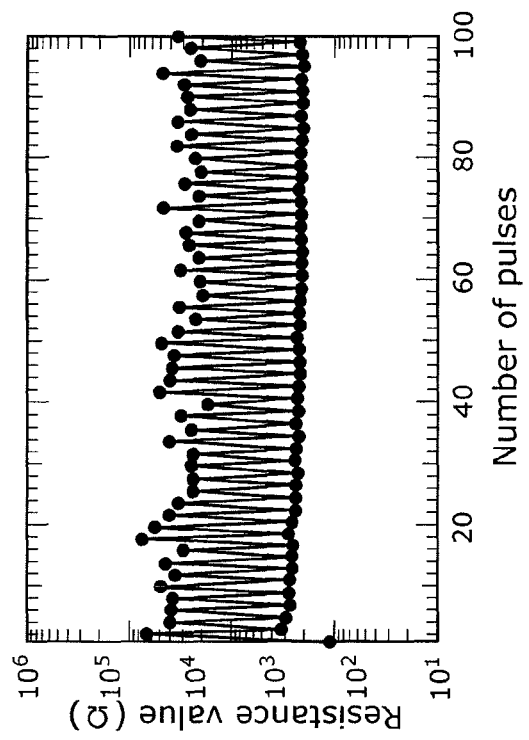
(b)
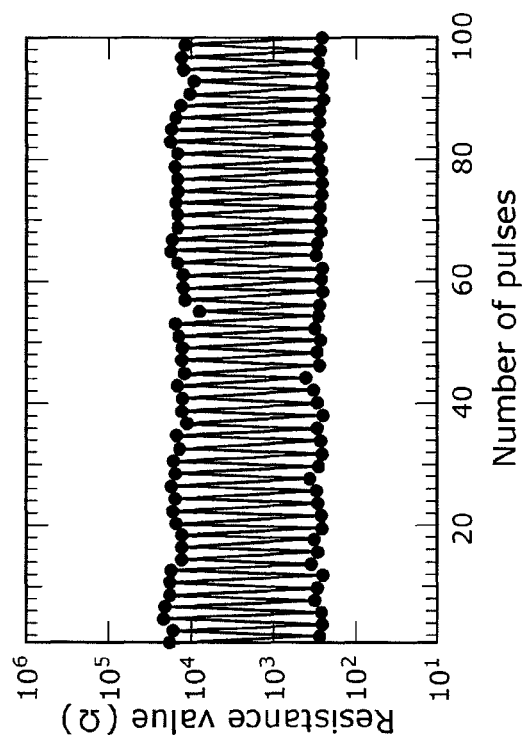
(a)

FIG. 27
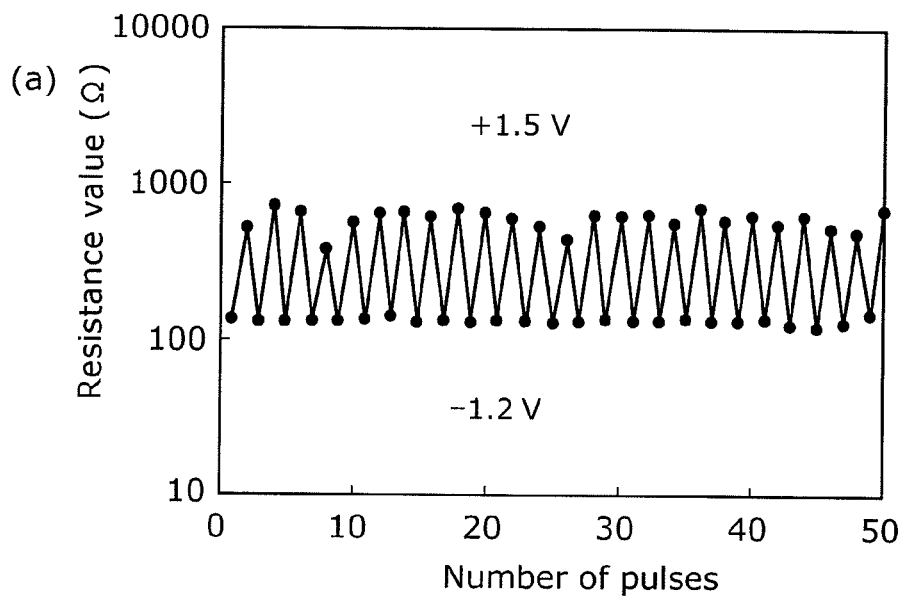
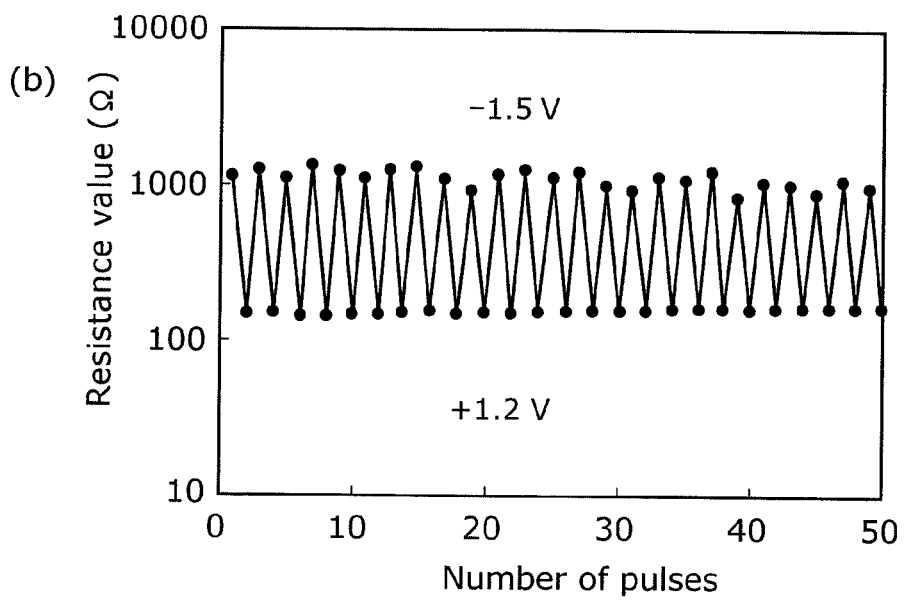

FIG. 28
(a)
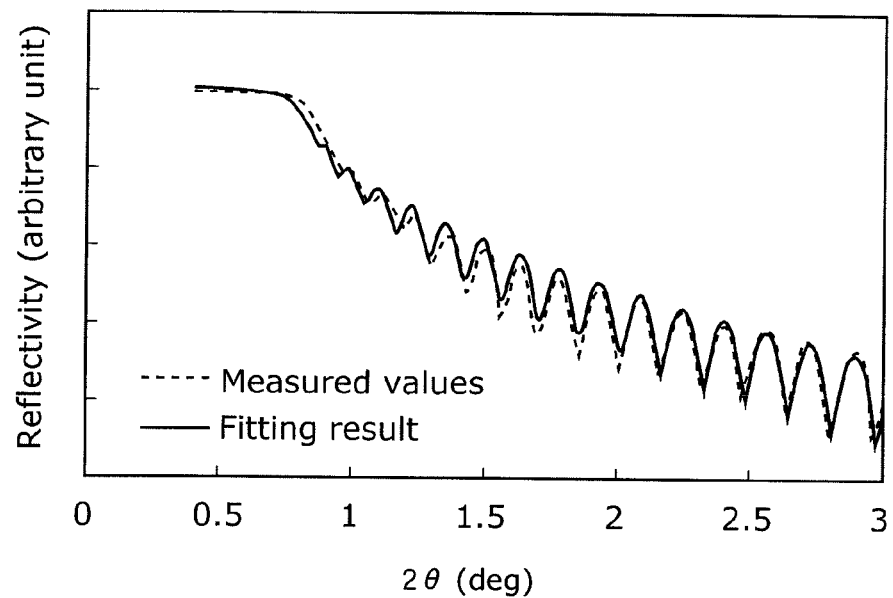
(b)
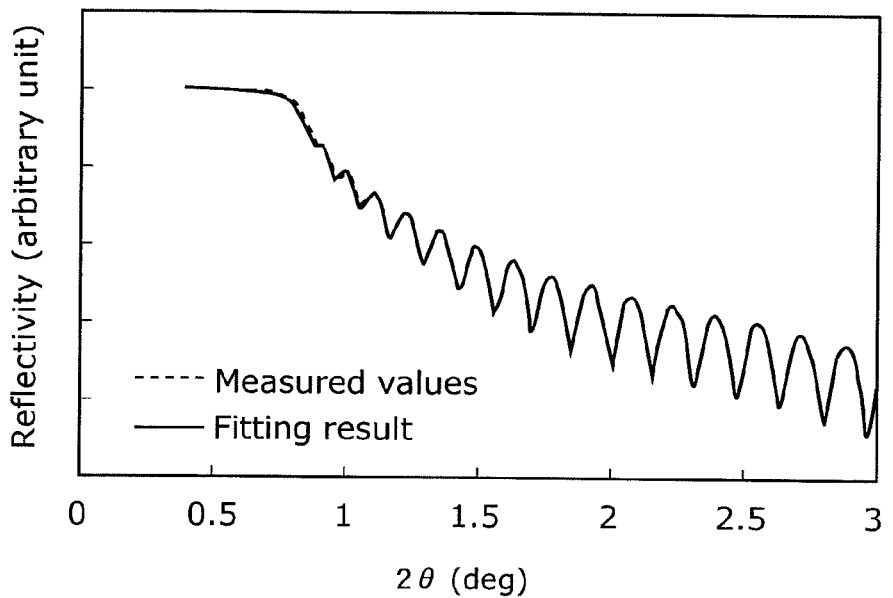

FIG. 31
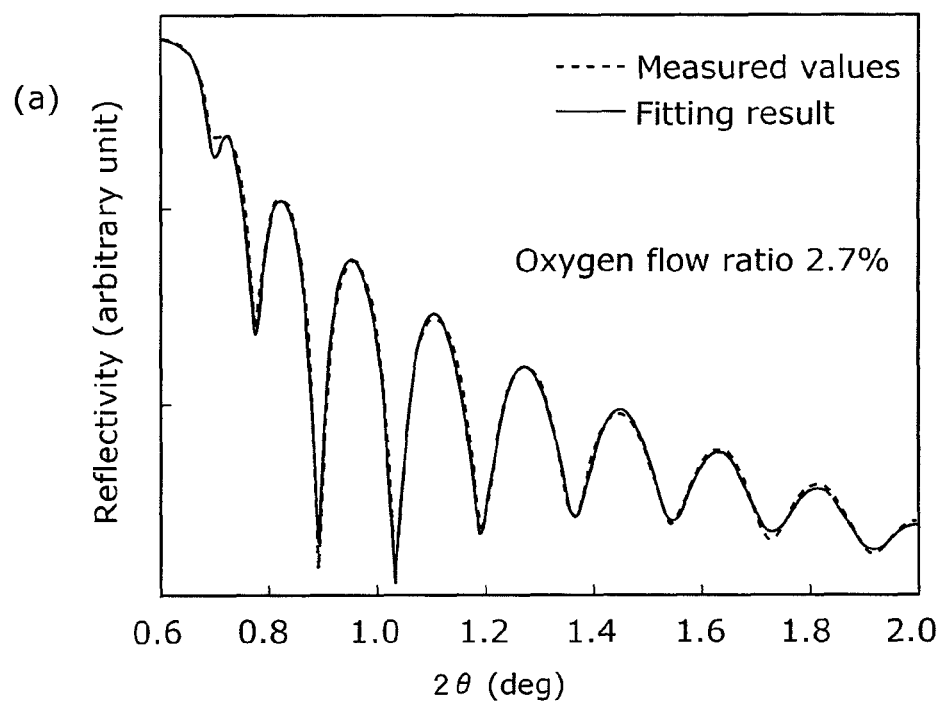
(a)
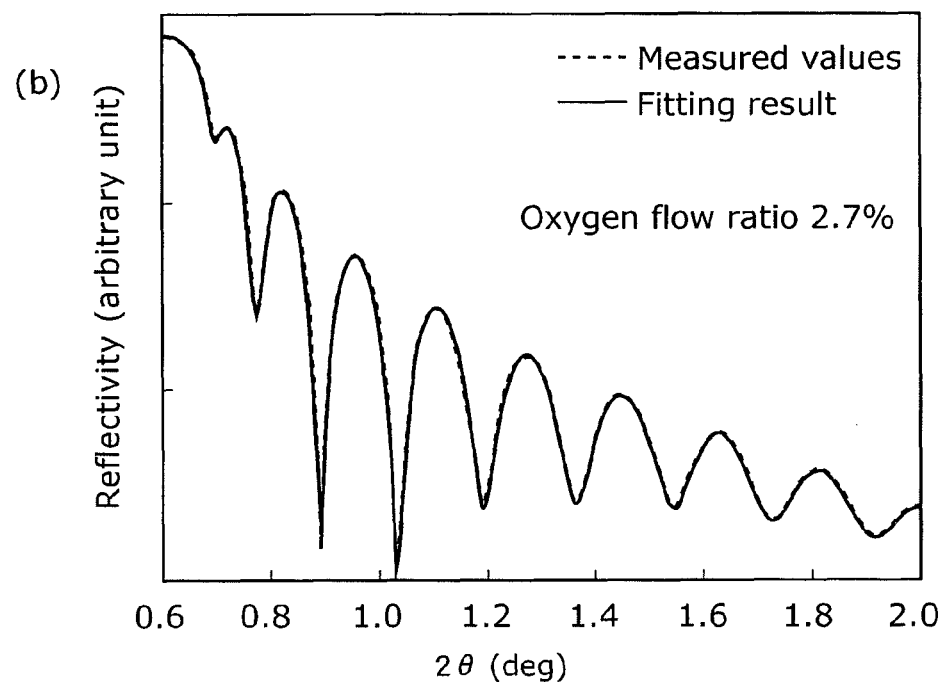
(b)

FIG. 33
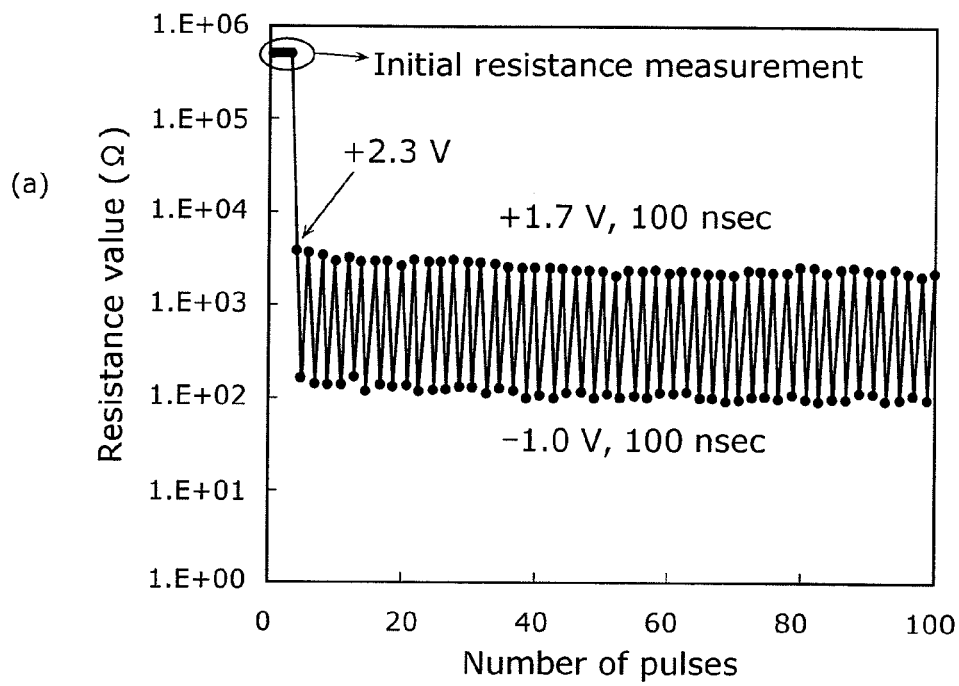
(a)
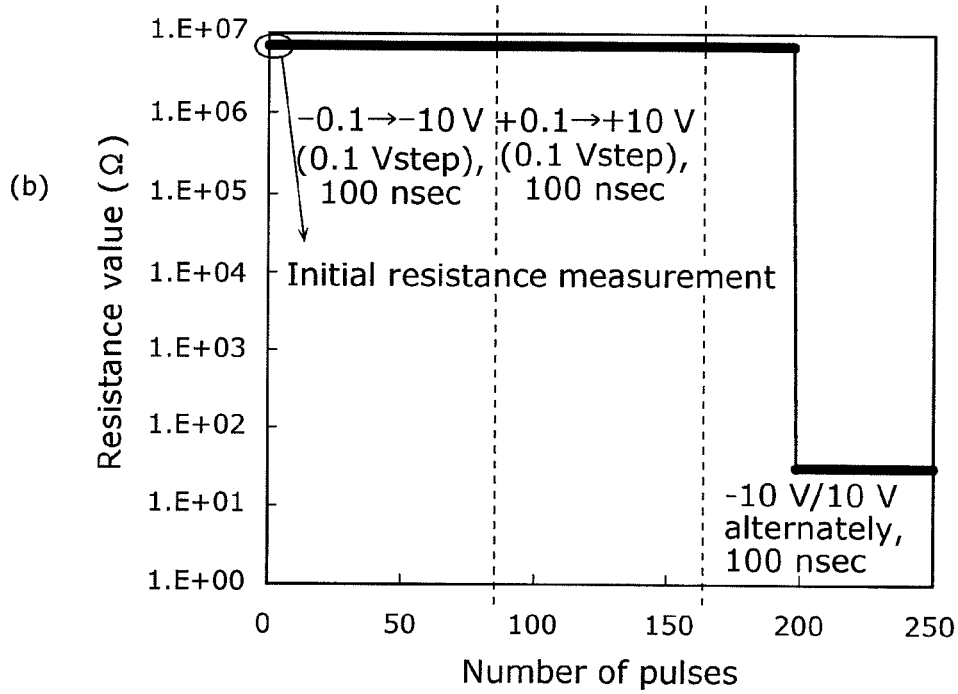
(b)

VARIABLE RESISTANCE NONVOLATILE STORAGE DEVICE AND METHOD OF FORMING MEMORY CELL

TECHNICAL FIELD

The present invention relates to a variable resistance nonvolatile storage device having memory cells each of which includes a transistor and a variable resistance element whose resistance value reversibly changes based on electrical signals, and a method of forming such memory cells.

BACKGROUND ART

In recent years, research and development of nonvolatile storage devices having memory cells formed with variable resistance elements has moved forward. A variable resistance element is an element with a property that its resistance value reversibly changes based on electrical signals, and can store data corresponding to the resistance value in a nonvolatile manner.

Commonly known as a nonvolatile storage device that includes variable resistance elements is a nonvolatile storage device which includes memory cells known as 1T1R memory cells arranged in a matrix at positions at which bit lines intersect with word lines and source lines that are arranged orthogonally to the bit lines. Here, the 1T1R memory cells refer to memory cells each of which is formed by connecting in series a MOS (metal oxide semiconductor) transistor and a variable resistance element.

Patent Literature 1 discloses a nonvolatile storage device including 1T1R memory cells in which oxides having a perovskite-type crystalline structure are used as variable resistance elements.

FIG. 35 is a schematic cross-sectional view of a memory cell described in Patent Literature 1.

A memory cell 1011 is formed by electrically connecting a transistor 1006 and a variable resistance element 1010 in series.

The transistor 1006 includes, on a semiconductor substrate 1001, a source region 1002 serving as a first diffusion layer region, a drain region 1003 serving as a second diffusion layer region, and a gate electrode 1005 formed on a gate oxide film 1004.

The variable resistance element 1010 is formed by having a variable resistance layer 1008 between a lower electrode 1007 and an upper electrode 1009. Here, the variable resistance layer 1008 is a layer whose resistance value changes upon voltage application.

The drain region 1003 and the lower electrode 1007 are electrically connected.

The upper electrode 1009 is connected to a metal line serving as a bit line 1012, the gate electrode 1005 is connected to a word line, and the source region 1002 is connected to a metal line serving as a source line 1013.

Here, although Patent Literature 1 discloses $Pr_{1-x}Ca_xMnO_3$ (PCMO), $La_{1-x}Ca_xMnO_3$ (LCMO) and so on as the materials of the variable resistance layer 1008, there is no particular mention of electrode materials.

Furthermore, as to a method for writing into the memory cell 1011, Patent Literature 1 discloses that: application of a pulse voltage Vpp, a pulse voltage Vss, and a pulse voltage having a predetermined voltage amplitude Vwp to the upper electrode 1009, the source region 1002, and the gate electrode, respectively, changes the state from a low resistance state to a high resistance state; and inversely, application of the pulse voltage Vss, the pulse voltage Vpp, and the pulse voltage having a predetermined voltage amplitude Vwe to the upper electrode 1009, the source region 1002, and the gate electrode, respectively, changes the state from the high resistance state to the low resistance state.

Patent Literature 2 discloses a nonvolatile storage device which includes 1T1R memory cells having variable resistance elements that exhibit changes in the resistance based on a principle that is different from that of the above-mentioned variable resistance elements that exhibit changes in the resistance according to electrical signals. This storage device is called a phase-change memory.

The phase-change memory stores data by making use of the fact that a phase-change material called a chalcogenide material has different resistance between the crystalline state and the amorphous state. Data is rewritten by changing the state of the phase-change material through passage of a current therein so as to cause heat generation near its melting point. A resistance change to high resistance state (amorphization) called a reset operation is performed by control of maintaining the phase-change material at a relatively high temperature, and a resistance change to low resistance state (crystallization) called a set operation is performed by control of maintaining the phase-change material at a relatively low temperature for a sufficient period.

Moreover, Patent Literature 2 discloses that with the phase-change memory, a current necessary for data rewriting is different between the reset operation and the set operation, and the reset operation requires a relatively large current.

FIG. 36 is a cross-sectional view of the phase-change memory disclosed in Patent Literature 2.

A memory cell 1021 has a 1T1R structure in which a storage unit 1022 and an NMOS (N-channel metal oxide semiconductor) transistor 1027 are used. The NMOS transistor 1027 includes N-type diffusion layer regions 1029 and 1030 each of which can be any of a source and a drain, and a gate electrode 1031 located between the N-type diffusion layer regions 1029 and 1030.

The storage unit 1022 includes a phase change element 1024, a second metal line layer 1023 above the phase change element 1024, and a contact via 1025 and a first metal line layer 1026 below the phase change element 1024, and is connected to the N-type diffusion layer region 1029 of the NMOS transistor 1027.

The other N-type diffusion layer region 1030 of the NMOS transistor 1027 is connected to a third metal line layer 1028 via each of line layers.

Here, the second metal line layer 1023, the third metal line layer 1028, and the gate electrode 1031 of the NMOS transistor 1027 correspond to a source line, a bit line, and a word line, respectively.

Patent Literature 2 discloses adopting into a phase-change memory device a mechanism for controlling the source line and switching the current passage direction in a set operation and a reset operation.

In the reset operation requiring passage of a relatively large current, the source line is set to a predetermined high level and the bit line to a low level, and in the set operation requiring only a relatively small current, the bit line is set to a predetermined high level and the source line to a low level.

With such settings, the current direction in the reset operation is a direction in which the electric potential at the source of the NMOS transistor 1027 of the memory cell (in this case, corresponding to the electric potential at the N-type diffusion layer region 1030) is maintained at a low level almost equal to the electric potential at the semiconductor substrate. This reduces the influence of a so-called substrate bias effect in the MOS transistor, and thus the reset operation is performed with a driving capability of the transistor being high (a large current can be obtained).

On the other hand, the current direction in the set operation is a direction in which the electric potential at the source of the NMOS transistor 1027 of the memory cell (in this case, corresponding to the electric potential at the N-type diffusion layer region 1029) rises to a voltage value that is determined according to a divided voltage relationship between an on-resistance value of the NMOS transistor 1027 and a resistance value of the phase-change element 1024. This increases the influence of the substrate bias effect in the MOS transistor, and thus the set operation is performed with the current flowing in the transistor kept relatively small.

The above structure makes it easier to separately supply a current of different magnitudes suitable for each of the set operation and the reset operation, thereby allowing the outcome of each operation to be stably obtained.

Generally, to form a high density memory cell array, memory cells need to be formed in the smallest possible areas, and thus it is important to form a transistor, as well as a variable resistance element which is another structural element of each memory cell, in the smallest possible areas.

An effective way of forming a transistor in the smallest possible area is to make a gate length L of the transistor as short as possible and a gate width W of the transistor as small as possible in an efficient manner.

The following considers application of the above structure to the nonvolatile storage device disclosed in Patent Literature 1.

According to Patent Literature 1, the nonvolatile storage device shown in FIG. 35 changes the state of the memory cell 1011 from a low resistance state to a high resistance state (resistance change to high resistance state) by applying a positive voltage to the upper electrode 1009 with reference to the lower electrode 1007, that is, by setting the bit line 1012 to Vpp and the source line 1013 to 0 V.

Here, the electric potential at the source region 1002 serving as the first diffusion layer region of the transistor 1006 (in this case, the source region 1002 functions as the source of the transistor 1006) is almost equal to the electric potential at the semiconductor substrate 1001, that is, 0 V, and the substrate bias effect in the transistor 1006 is small.

On the other hand, the nonvolatile storage device changes the state of the memory cell 1011 from the high resistance state to the low resistance state (resistance change to low resistance state) by setting the bit line 1012 to 0 V and the source line 1013 to Vpp.

Here, the electric potential at the drain region 1003 that is the second diffusion layer region (in this case, the drain region 1003 functions as the source of the transistor 1006) rises to a voltage determined according to a divided voltage relationship between the resistance value of the variable resistance element 1010 and the on-resistance of the transistor 1006, and the substrate bias effect in the transistor 1006 becomes greater than in the case of the resistance change to high resistance state.

As described above, it is rational, in terms of forming the transistor of the memory cell in an optimum size, to perform the resistance change to high resistance state, which requires a current larger than for the resistance change to low resistance state, by using a current flowing in the direction in which the substrate bias effect in the transistor is smaller, because that way the transistor does not need to have a driving capability with an unnecessary margin.

It is to be noted that the semiconductor device disclosed in Patent Literature 2 also adopts the same concept that the reset operation requiring a larger current is performed using a current flowing in a direction in which the substrate bias effect in the transistor is smaller.

CITATION LIST

Patent Literature

[PTL 1]
[Patent Literature 1] Japanese Unexamined Patent Application Publication No. 2005-25914 (FIG. 2)
[PTL 2]
[Patent Literature 2] Japanese Unexamined Patent Application Publication No. 2005-267837 (FIGS. 7 and 8)

SUMMARY OF INVENTION

Technical Problem

The inventors of the present application have examined, as one of variable resistance nonvolatile storage devices, a variable resistance nonvolatile storage device which includes 1T1R memory cells each having a variable resistance layer comprising an oxygen-deficient transition metal oxide.

Here, the oxygen-deficient oxide is an oxide whose composition is deficient in oxygen compared to its stoichiometric composition. Taking tantalum, one of transition metals, as an example, $Ta_2O_5$ is an oxide having a stoichiometric composition. $Ta_2O_5$ contains oxygen 2.5 times more than tantalum, and has an oxygen content percentage of 71.4%. An oxide having an oxygen content percentage lower than 71.4%, that is, a tantalum oxide having a non-stoichiometric composition which satisfies $0<x<2.5$ when expressed as $TaO_x$, is called an oxygen-deficient tantalum oxide.

To facilitate description of problems to be solved, the following describes some properties which have been measured of a variable resistance element having an oxygen-deficient tantalum oxide as a variable resistance layer.

FIG. 1 is a schematic diagram showing a basic structure of a variable resistance element used for the measurement. The variable resistance element includes a variable resistance layer 3302 comprising an oxygen-deficient tantalum oxide, and the variable resistance layer 3302 is located between a lower electrode 3301 comprising Pt and an upper electrode 3303 comprising Pt, so as to create a top-bottom symmetry.

FIG. 2 is a graph illustrating hysteretic current-voltage characteristics which show an example of how the resistance of the variable resistance element changes. The horizontal axis represents the voltage applied to the upper electrode 3303 with reference to the lower electrode 3301, and the vertical axis represents the value of a current flowing in the variable resistance element.

As FIG. 2 shows, gradually applying a positive voltage to the upper electrode 3303 with reference to the lower electrode 3301 increases the current almost in proportion to the voltage, and the current rapidly decreases when the positive voltage exceeds the voltage at the point A. That is, it shows a change from a low resistance state to a high resistance state (resistance change to high resistance state).

On the other hand, in gradual application of a negative voltage to the upper electrode 3303 with reference to the lower electrode 3301 (equivalent to application of a positive voltage to the lower electrode 3301 with reference to the upper electrode 3303) in the high resistance state, the current rapidly increases when the negative voltage exceeds the voltage at the point B. That is, it shows a change from the high resistance state to a low resistance state (resistance change to low resistance state).

The variable resistance element exhibiting the characteristics shown in FIG. 2 and the variable resistance element disclosed in Patent Literature 1 differ in material of the variable resistance layer. However, they are the same in that they both: perform a bipolar operation, that is, switch between the high resistance state and the low resistance state upon bidirectional voltage application; perform the resistance change to high resistance state upon application of a positive voltage to the upper electrode with reference to the lower electrode; and perform the resistance change to low resistance state upon application of a negative voltage to the upper electrode with reference to the lower electrode.

Further, the characteristics shown in FIG. 2 indicate that the resistance change to high resistance state does not occur before the point A and the resistance change to low resistance state does not occur before the point B. These characteristics show that the resistance change to high resistance state of the variable resistance element according to the present invention requires a current larger than that required for the resistance change to low resistance state.

As described above, it is rational, in terms of forming the transistor of the memory cell in an optimum size, to perform the resistance change to high resistance state, which requires a larger current, by applying a voltage of a polarity that reduces the substrate bias effect in the transistor, and to perform the resistance change to low resistance state, which requires a smaller current, by applying a voltage of the reversed polarity.

However, the inventors of the present application have discovered during the examination that the voltage application direction (driving polarity) stably causing a resistance change in one direction (resistance change to low resistance state or resistance change to high resistance state) is not always the same, and that the driving polarity is different in some of the variable resistance elements which are made of the same materials, that is, Pt for the upper and lower electrodes and an oxygen-deficient tantalum oxide for the variable resistance layer.

For instance, it has been verified that a variable resistance element undergoes the resistance change to low resistance state upon application of a pulse voltage of +2.0 V in amplitude and 100 ns in width between the upper electrode 3303 and the lower electrode 3301, and the resistance change to high resistance state upon application of a pulse voltage of −2.6 V in amplitude and 100 ns in width between the upper electrode 3303 and the lower electrode 3301, given that a voltage applied between the upper electrode 3303 and the lower electrode 3301 is positive when the voltage at the upper electrode 3303 is higher than the voltage at the lower electrode 3301.

It has also been verified that another variable resistance element undergoes the resistance change to low resistance state upon application of a pulse voltage of −2.0 V in amplitude and 100 ns in width between the upper electrode 3303 and the lower electrode 3301, and the resistance change to high resistance state upon application of a pulse voltage of +2.7 V in amplitude and 100 ns in width between the upper electrode 3303 and the lower electrode 3301, given that a voltage applied between the upper electrode 3303 and the lower electrode 3301 is positive when the voltage at the upper electrode 3303 is higher than the voltage at the lower electrode 3301.

FIGS. 3(a) and (b) are graphs each showing the resistance value of such a variable resistance element in the case of continuously applying a pulse voltage which causes the resistance change to low resistance state and a pulse voltage which causes the resistance change to high resistance state alternately. The horizontal axis represents the number of electrical pulses, and the vertical axis represents the resistance value.

As shown in FIG. 3(a), a variable resistance element which is initially in a high resistance state of approximately 33 kΩ changes into a low resistance of approximately 500 kΩ upon application of a pulse voltage of +2.0 V, and then changes into a high resistance state of approximately 40 kΩ upon application of a pulse voltage of −2.6 V. After that, the variable resistance element repeats the resistance change to low resistance state upon application of a positive pulse voltage to the upper electrode 3303 with reference to the lower electrode 3301 and the resistance change to high resistance state upon application of a negative pulse voltage to the upper electrode 3303 with reference to the lower electrode 3301.

This relationship between the direction of the resistance change and the polarity of the applied voltage is called A mode for descriptive purposes.

As shown in FIG. 3(b), another variable resistance element which is initially in a high resistance state of approximately 42 kΩ changes into a low resistance state of approximately 600Ω upon application of a pulse voltage of −2.0 V, and then changes into a high resistance-state of approximately 40 kΩ upon application of a pulse voltage of +2.7 V. After that, the variable resistance element repeats the resistance change to low resistance state upon application of a negative pulse voltage to the upper electrode 3303 with reference to the lower electrode 3301 and the resistance change to high resistance state upon application of a positive pulse voltage to the upper electrode 3303 with reference to the lower electrode 3301.

This relationship between the direction of the resistance change and the polarity of the applied voltage is called B mode for descriptive purposes. The hysteretic current-voltage characteristics shown in FIG. 2 correspond to this B mode.

It is to be noted that the above pulse voltage values denote output voltage values set for a pulse generator, and that an effective voltage value applied between the end terminals of the variable resistance element is considered to be a voltage value smaller than a corresponding one of the pulse voltage values due to a voltage drop across a measurement system.

In the variable resistance element showing such a result, the upper electrode 3303 and the lower electrode 3301 both comprise Pt, and the variable resistance layer 3302 which comprises the oxygen-deficient tantalum oxide and is located between the upper and lower electrodes has a top-bottom symmetrical relationship with the electrodes electrically.

Accordingly, it is not always self-evident as to which of the A mode and the B mode appears as the resistance change characteristics, and the mode is determined based on empirical rules or experimental measurement results. It is expected that these phenomena are determined by some sort of anisotropy factors unexplained in the resistance change mechanism.

In the case where the A mode and the B mode appear indeterminately, the following problems are expected in forming a 1T1R memory device.

The first problem is that the size of the transistor cannot be optimized.

If the resistance change characteristics can be determined as either the A mode or the B mode, the transistor can be formed in a minimum size that allows driving of a current necessary for the resistance change to high resistance state assuming that the transistor operates under a condition that causes a small substrate bias effect according to a conventionally-known concept.

However, if the mode is indeterminate, it is necessary to form the transistor in a size sufficient for driving the current necessary for the resistance change to high resistance state, considering also that the transistor operates under a condition that causes a large substrate bias effect. For this reason, unlike in the case where the mode is determined, it is necessary to make the gate width W of the transistor wide. This is not desirable as the wide gate width is a significant impediment to miniaturization of memory cells.

The second problem is that it is necessary to manage information identifying the mode of the resistance change characteristics.

When the mode is indeterminate, the correspondence is indeterminate between the polarity of a voltage to be applied for changing a resistance state, and a resistance state (high resistance state or low resistance state) to be read after the voltage application. This creates a need of information which identifies the mode in order to actually use the variable resistance element as a storage element.

For example, in the case where the same mode appears in a lot or a slice, a storage element dedicated for management is provided in a chip. Then, in the manufacturing stage, identification information indicating in which one of the A mode and the B mode the variable resistance element undergoes a resistance change is recorded in the storage element dedicated for management. Further, in the use stage, according to the identification information, the polarity of the applied voltage is reversed in a write operation or the polarity of output data is reversed in a read operation.

It appears that this allows the actual use of the variable resistance element as the storage element. However, it is not desirable because this complicates the circuit configuration and the control method. Further, in the case where different modes appear across smaller units in a lot or a slice, such as memory cells, it is practically impossible to provide, for each memory cell, a storage element dedicated for management and record the identification information of the mode in the storage element.

The present invention has been conceived in consideration of the above problems, and it is an object of the present invention to provide a technique that enables a 1T1R nonvolatile storage device including a variable resistance element to control the appearance of the A mode and the B mode of the resistance change characteristics of the variable resistance element and that enables designing of a memory cell with an optimum transistor size.

Solution to Problem

In order to solve the above problems, the variable resistance nonvolatile storage device according to an aspect of the present invention is a variable resistance nonvolatile storage device including (i) a semiconductor substrate, (ii) a variable resistance element having: a first electrode; a second electrode; and a variable resistance layer which is provided between the first and second electrodes and in contact with the first and second electrodes and which has a resistance value that reversibly varies based on voltage signals each of which has a different polarity and is applied between the first and second electrodes, and (iii) a MOS transistor formed on a main surface of the semiconductor substrate, wherein the variable resistance layer includes: a first region which is in contact with the first electrode and contains a first oxygen-deficient transition metal oxide having a composition $MO_x$; and a second region which is in contact with the second electrode and contains a second oxygen-deficient transition metal oxide having a composition $MO_y$ (where x<y), and a drain of the MOS transistor is connected with either the first electrode or the second electrode included in the variable resistance element to form a memory cell so that a substrate bias effect in the MOS transistor is smaller when one of the voltage signals having a polarity that causes a resistance change to high resistance state in the variable resistance layer is applied to the MOS transistor and the variable resistance element, than when another one of the voltage signals having a polarity that causes a resistance change to low resistance state in the variable resistance layer is applied to the MOS transistor and the variable resistance element.

Further, the second electrode may comprise a material having a standard electrode potential which is higher than a standard electrode potential of a transition metal of the first and second oxygen-deficient transition metal oxides, and the first electrode may comprise a material having a standard electrode potential which is lower than the standard electrode potential of the second electrode.

Furthermore, the MOS transistor may be an N-type MOS transistor including, on the main surface of the semiconductor substrate: a first N-type diffusion layer region; a gate; and a second N-type diffusion layer region formed on a side of the gate opposite the first N-type diffusion layer region, and the first electrode may be connected with the first N-type diffusion layer region of the N-type MOS transistor to form the memory cell.

Moreover, the MOS transistor may be a P-type MOS transistor including: an N well formed on the main surface of the semiconductor substrate; a first P-type diffusion layer region; a gate; a second P-type diffusion layer region formed on a side of the gate opposite the first P-type diffusion layer region, the first P-type diffusion layer region, the gate, and the second P-type diffusion layer region being formed in the N well, and the second electrode may be connected with the first P-type diffusion layer region of the P-type MOS transistor to form the memory cell.

Advantageous Effects of Invention

According to the nonvolatile storage device according to an aspect of the present invention, a variable resistance nonvolatile storage element is used in which: a first region containing an oxygen-deficient transition metal oxide which does not easily exhibit a resistance change due to a lower oxygen content percentage is provided in contact with a first electrode; and a second region containing an oxygen-deficient transition metal oxide which easily exhibits a resistance change due to a higher oxygen content percentage is provided in contact with a second electrode. Thus, the voltage application direction (driving polarity) which causes resistance changes can be uniquely determined for each of memory cells such that: the resistance change to high resistance state is performed upon application of a positive voltage to the second electrode with reference to the first electrode; and the resistance change to low resistance state is performed upon application of a positive voltage to the first electrode with reference to the second electrode.

Generally, the resistance change to high resistance state of the variable resistance element requires a larger driving current compared to the resistance change to low resistance state, because a voltage needs to be generated to cause a resistance change in the variable resistance element in a low resistance state.

Thus, in the case of forming each memory cell with the variable resistance element and an N-type MOS transistor, the first electrode of the variable resistance element is connected with a first N-type diffusion layer region of the N-type MOS transistor. With this connection, when the variable resistance element is to perform the resistance change to high resistance state, a second N-type diffusion layer region of the N-type MOS transistor is grounded and thus it is possible to supply the driving current to the variable resistance element using a ground bias which causes a smaller substrate bias effect in the N-type MOS transistor.

Moreover, when forming each memory cell with the variable resistance element and a P-type MOS transistor, the second electrode of the variable resistance element is connected with a first P-type diffusion layer region of the P-type MOS transistor. With this connection, when the variable resistance element is to perform the resistance change to high resistance state, a second N-type diffusion layer region of the P-type MOS transistor is connected to a power source and thus it is possible to supply the driving current to the variable resistance element using a power bias which causes a smaller substrate bias effect in the P-type MOS transistor.

As a result, it is no longer necessary to form the transistor in a size sufficient for driving the current necessary for the resistance change to high resistance state considering that the transistor operates under a condition that causes a large substrate bias effect. As a result, it is possible to design the memory cells with an optimum transistor size.

In other words, it is possible to provide, in a smaller layout area, a variable resistance nonvolatile storage device in which 1T1R memory cells are used, and to achieve increase in the integration degree and cost reduction.

BRIEF DESCRIPTION OF DRAWINGS

FIG. 1 is a schematic diagram showing, as basic data of the present invention, a basic structure of a nonvolatile storage element.

FIG. 2 is a graph showing, as basic data of the present invention, an example of hysteretic current-voltage characteristics observed in resistance changes of a nonvolatile storage element.

[FIG. 3] FIGS. 3(a) and (b) are graphs each showing, as basic data of the present invention, an example of a relationship between the resistance value of a nonvolatile storage element and the number of electrical pulses applied.

FIG. 4 is a cross-sectional view showing, as basic data of the present invention, a structure of a nonvolatile storage element.

FIG. 5(a) to (c) are explanatory diagrams each showing, as basic data of the present invention, a manufacturing process of a nonvolatile storage element.

FIG. 6(a) to (c) are graphs each showing, as basic data of the present invention, a relationship between the resistance value of a nonvolatile storage element and the number of electrical pulses applied.

FIG. 7 is a graph showing, as basic data of the present invention, an X-ray diffraction spectrum of a nonvolatile storage element.

FIG. 10 is a graph showing, as basic data of the present invention, an example of hysteretic current-voltage characteristics observed in resistance changes of a nonvolatile storage element.

FIG. 12 is a graph showing, as basic data of the present invention, a result of analyzing a composition of a tantalum oxide layer included in a nonvolatile storage element.

[FIG. 13] FIGS. 13(a) and (b) are graphs each showing, as basic data of the present invention, a relationship between the resistance value of a nonvolatile storage element and the number of electrical pulses applied.

FIG. 14 is a cross-sectional view showing, as basic data of the present invention, a structure of a nonvolatile storage element.

FIG. 15(a) to (c) are explanatory diagrams each showing, as basic data of the present invention, a manufacturing process of a nonvolatile storage element.

FIG. 16 is a graph showing, as basic data of the present invention, a relationship between the resistance value of a nonvolatile storage element and the number of electrical pulses applied.

FIG. 17 is a graph showing, as basic data of the present invention, an example of hysteretic current-voltage characteristics observed in resistance changes of a nonvolatile storage element.

FIG. 18 is a structural diagram of a variable resistance nonvolatile storage device according to an embodiment of the present invention.

FIG. 19 is a cross-sectional view showing a structural example of memory cells of a variable resistance nonvolatile storage device according to an embodiment of the present invention.

FIG. 20(a) to (c) are operational timing charts of a variable resistance nonvolatile storage device according to an embodiment of the present invention.

FIG. 21 is a diagram showing simulations of memory cell characteristics of a variable resistance nonvolatile storage device according to an embodiment of the present invention.

FIG. 22(a) to (f) are circuit diagrams each showing a circuit configuration of a memory cell according to an embodiment of the present invention.

FIG. 23(a) to (f) are diagrams each showing a connection between a variable resistance element and a transistor for realizing a memory cell according to an embodiment of the present invention.

FIG. 24 is a cross-sectional view showing a structural example of memory cells of a variable resistance nonvolatile storage device according to an embodiment of the present invention.

FIG. 25 is a cross-sectional view showing, as basic data of the present invention, a structure of a nonvolatile storage element.

FIG. 26 is a graph showing, as basic data of the present invention, a result of analyzing compositions of hafnium oxide layers of a nonvolatile storage element.

[FIG. 27] FIGS. 27(a) and (b) are graphs each showing, as basic data of the present invention, a relationship between the resistance value of a nonvolatile storage element and the number of electrical pulses applied.

[FIG. 28] FIGS. 28(a) and (b) are graphs each showing, as basic data of the present invention, a result of measuring the X-ray reflectivity of a nonvolatile storage element.

FIG. 30(a) to (c) are explanatory diagrams, as basic data of the present invention, of a structure and a manufacturing process of a nonvolatile storage element.

[FIG. 31] FIGS. 31(a) and (b) are graphs each showing, as basic data of the present invention, a result of measuring the X-ray reflectivity of a nonvolatile storage element.

FIG. 32 is a graph showing, as basic data of the present invention, a result of measuring the X-ray reflectivity of a nonvolatile storage element.

[FIG. 33] FIGS. 33(a) and (b) are graphs each showing, as basic data of the present invention, a relationship between the resistance value of a nonvolatile storage element and the number of electrical pulses applied.

FIG. 34 is a cross-sectional view showing, as basic data of the present invention, a structure of a nonvolatile storage element.

FIG. 35 is a cross-sectional schematic diagram showing a memory cell of a conventional variable resistance nonvolatile storage device.

FIG. 36 is a cross-sectional view of a semiconductor device in which a conventional phase-change memory is used.

DESCRIPTION OF EMBODIMENT

The following describes in detail an embodiment of the present invention with reference to the drawings.

The variable resistance nonvolatile storage device according to an embodiment of the present invention is a 1T1R nonvolatile storage device in which a variable resistance element and a MOS transistor are connected in series, and which fixes the mode of the resistance change characteristics of the variable resistance element and optimizes the structure of the MOS transistor according to the mode fixed.

(Basic Data of Present Invention)

The following describes, as preparation, basic data regarding three types of variable resistance elements used for the variable resistance nonvolatile storage device according to the present invention.

These variable resistance elements are formed by providing, between two electrodes, a variable resistance layer comprising one of the following oxides: an oxygen-deficient tantalum oxide; an oxygen-deficient hafnium oxide; and an oxygen-deficient zirconium oxide.

These variable resistance elements were invented by the inventors of the present application for the purpose of obtaining a nonvolatile storage element which has reversible and stable rewriting characteristics and which makes use of a resistance change phenomenon. Such variable resistance elements are described in detail in the following related patent applications: Japanese Patent Application No. 2007-149032 (Patent Literature); Japanese Patent Application No. 2008-180946 (Patent Literature); and Japanese Patent Application No. 2008-180944 (Patent Literature).

A feature of these variable resistance elements that the resistance change characteristics can be fixed to either the aforementioned A mode or B mode is applied to the variable resistance nonvolatile storage device according to the present invention. Hereinafter, the above-mentioned related patent applications are partially cited for purposes of illustration.

It is to be noted that the term "variable resistance element" and the term "variable resistance nonvolatile storage element" (or briefly, "nonvolatile storage element") are used synonymously in the present DESCRIPTION.

(Variable Resistance Element Using Oxygen-Deficient Tantalum Oxide as Variable Resistance Layer)

First, the following describes the first experiment regarding a variable resistance nonvolatile storage element which uses an oxygen-deficient tantalum oxide as the variable resistance layer and which performs a bipolar operation.

(Structure of Variable Resistance Element)

Figure 1:
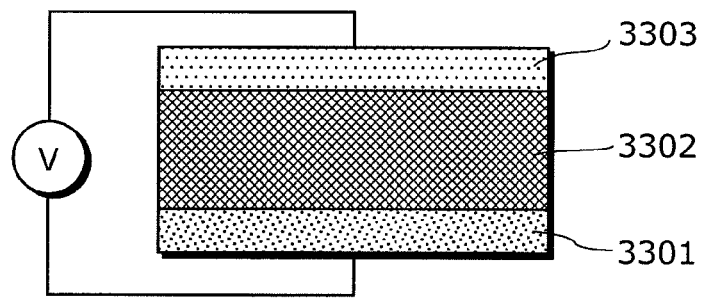
[FIG. 1]
Figure 2:
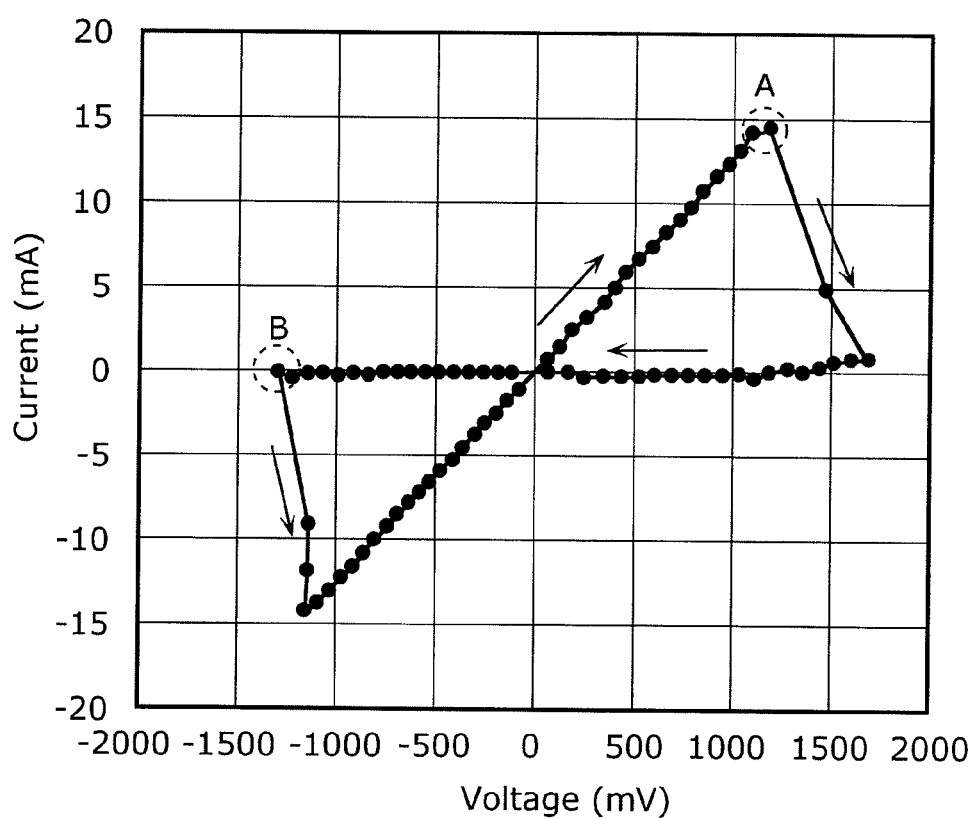
[FIG. 2]
Figure 4:
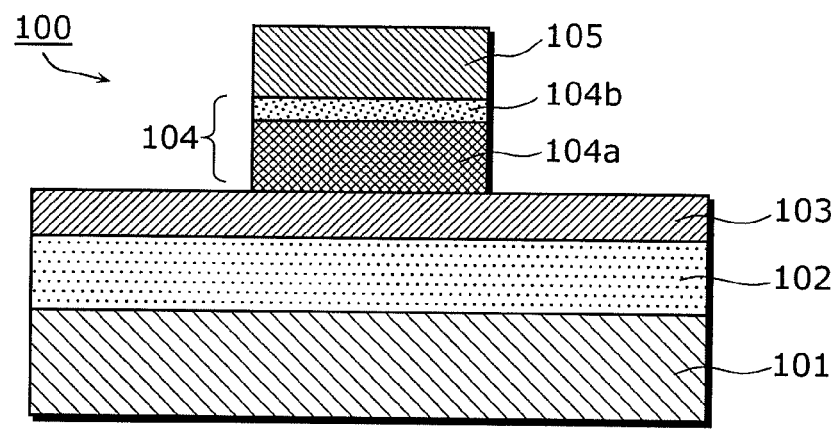
[FIG. 4]

FIG. 4 is a cross-sectional view showing a structural example of a variable resistance element according to the first experiment.

As shown in FIG. 4, a variable resistance element 100 used in the first experiment includes: a substrate 101; an oxide layer 102 formed on the substrate 101; a lower electrode 103 formed on the oxide layer 102; an upper electrode 105; and a variable resistance layer 104 located between the lower electrode 103 and the upper electrode 105.

Here, the variable resistance layer 104 includes: a first tantalum containing layer (hereinafter referred to as "first tantalum oxide layer") 104a having a lower oxygen content percentage; and a second tantalum containing layer 104b (hereinafter referred to as "second tantalum oxide layer") formed on the first tantalum oxide layer 104a and having a higher oxygen content percentage.

To drive the variable resistance element 100, a voltage satisfying a predetermined condition is applied between the lower electrode 103 and the upper electrode 105 by an external power source. According to the voltage application direction, the resistance value of the variable resistance layer 104 of the variable resistance element 100 increases or decreases reversibly. For example, when a pulse voltage larger than a predetermined threshold voltage is applied, the resistance value of the variable resistance layer 104 increases or decreases, whereas when a pulse voltage smaller than the predetermined threshold voltage is applied, there is no change in the resistance value of the variable resistance layer 104.

The materials of the lower electrode 103 and the upper electrode 105 are, for example, Pt (platinum), Ir (iridium), Pd (palladium), Ag (silver), and Cu (copper).

Although the substrate 101 may be a single-crystal silicon substrate or a semiconductor substrate, it is not limited to these substrates. The variable resistance layer 104 can be formed at a relatively low substrate temperature and thus can be formed on a resin material and the like.

(Manufacturing Method of Variable Resistance Element)

Next, a manufacturing method of the variable resistance element 100 used in the present experiment is described with reference to FIG. 5(a) to (c).

First, as shown in FIG. 5(a), thermal oxidation produces the oxide layer 102 having a thickness of 200 nm on the substrate 101 which is a single-crystal silicon. Then, by sputtering, a Pt thin film having a thickness of 100 nm is formed on the oxide layer 102 as the lower electrode 103. After that, the first tantalum oxide layer 104a is formed on the lower electrode 103 by reactive sputtering, with tantalum used as the target.

Next, as shown in FIG. 5(b), the top surface of the first tantalum oxide layer 104a is oxidized to modify the surface property. This produces, on the surface of the first tantalum oxide layer 104a, the second tantalum oxide layer 104b having an oxygen content percentage higher than that of the first tantalum oxide layer 104a. The layered structure of the first tantalum oxide layer 104a and the second tantalum oxide layer 104b is the structure of the variable resistance layer 104.

Subsequently, by sputtering, a Pt thin film having a thickness of 150 nm is formed on the second tantalum oxide layer 104b as the upper electrode 105.

Lastly, photolithography processing creates a pattern 106 using a photoresist, and dry etching produces an element region 107 as shown in FIG. 5(c).

With the above-described manufacturing method, elements A to C were manufactured. The following describes the details.

First, the layered structure of the substrate 101, the oxide layer 102, and the lower electrode 103 comprising Pt was formed in the above-described manner. After that, the first tantalum oxide layer 104a was formed on the lower electrode 103 by reactive sputtering, that is, a process of sputtering a tantalum target in an argon gas and an oxygen gas.

The film forming condition here was as follows: vacuum (back pressure) in the sputtering apparatus was approximately $7 \times 10^{-4}$ Pa before sputtering; power was 250 W when sputtering; the total gas pressure of the argon gas and the oxygen gas was 3.3 Pa; the flow ratio of the oxygen gas was 3.4%; the preset temperature of the substrate was 30° C.; and the time period for film formation was seven minutes. With this, the first tantalum oxide layer 104a having an oxygen content percentage of about 58 at %, i.e., $TaO_{1.4}$, was deposited with a thickness of 30 nm.

The manufacturing of the elements A to C involved the formation of the first tantalum oxide layer 104a and the second tantalum oxide layer 104b, followed by the formation of the upper electrode 105, both performed in the sputtering apparatus. More specifically, after depositing the first tantalum oxide layer 104a, a shutter was inserted between the tantalum target and the oppositely placed substrate 101 under the same sputtering condition, including the condition of the gas pressure and the power, for example, and it was kept in this state for a predetermined time period.

This caused oxidation of the top surface of the first tantalum oxide layer 104a due to oxygen plasma. As a result, the second tantalum oxide layer 104b having an oxygen content percentage higher than that of the first tantalum oxide layer 104a was formed on the surface of the first tantalum oxide layer 104a.

Thereafter, the upper electrode 105 comprising Pt was formed on the second tantalum oxide layer 104b in the above-described manner.

Then, the element region 107 was formed through the photolithography processing. It is to be noted that the element region 107 of the elements A to C has a circular pattern with a diameter of 3 μm.

In this experiment, the elements A to C were manufactured with different time periods for the oxidation using the oxygen plasma (oxygen plasma exposure time). Table 1 summarizes the initial resistance value of each element manufactured, and the thickness and the oxygen content percentage x of the first tantalum oxide layer ($TaO_x$ layer) as well as the thickness and the oxygen content percentage y of the second tantalum oxide layer ($TaO_y$ layer) which were measured through X-ray reflectivity measurement (described later).

It is to be noted that the oxygen plasma exposure time of the element A being zero minute means that the deposition of the first tantalum oxide layer 104a was immediately followed by the deposition of Pt as the upper electrode 105, without exposure to the oxygen plasma.

TABLE 1

| | | | Element A (Sample A) | Element B (Sample B) | Element C (Sample C) |
|---|---|---|---|---|---|
| | Oxygen Plasma Exposure Time (min.) | | 0 | 0.5 | 1 |
| | Initial Resistance Value (Ω) | | 1.7 | 650 | 1850 |
| X-ray Reflectivity Measurement Result | $TaO_x$ Layer (First Tantalum Oxide Layer) | Thickness (nm) | 29.0 | 28.6 | 28.7 |
| | | δ | $29.4 \times 10^{-6}$ | $29.3 \times 10^{-6}$ | $29.3 \times 10^{-6}$ |
| | | x | 1.41 | 1.43 | 1.43 |
| | $TaO_y$ Layer (Second Tantalum Oxide Layer) | Thickness (nm) | 1.0 | 1.1 | 1.2 |
| | | δ | $23.1 \times 10^{-6}$ | $22.3 \times 10^{-6}$ | $24.9 \times 10^{-6}$ |
| | | y | 2.34 | 2.45 | 2.07 |

The following describes the characteristics and so on of the variable resistance elements manufactured in the above manner.

(Initial Resistance of Variable Resistance Layer)

First, the initial resistance of the variable resistance layer 104 of each of the elements A to C is measured and the result is examined. Here, the initial resistivity of the variable resistance layer 104 of each element was determined by measuring a current flowing upon application of a weak voltage of 50 mV that is lower than a threshold voltage (1 V, for example) between the lower electrode 103 and the upper electrode 105 of each element.

Table 1 shows that the element A (oxygen plasma exposure time: zero minute) has resistance of 1.7Ω, the element B (oxygen plasma exposure time: 0.5 minute) has resistance of 650Ω, and the element C (oxygen plasma exposure time: 1 minute) has resistance of 1850Ω. This indicates that the resistance value of the variable resistance layer 104 rises with increase in the oxygen plasma exposure time.

Probably, the resistance of 1.7Ω seen in the element A manufactured by zero-minute oxygen plasma exposure is equivalent to contact resistance, and the large resistance values above several hundred ohms seen in the elements B and C are mostly due to the second tantalum oxide layer 104b formed by the oxygen plasma processing.

(Resistance Change Characteristics)

Next, the following describes the characteristics observed when a resistance change occurs upon application of electrical pulses to the elements A to C.

Figure 6:
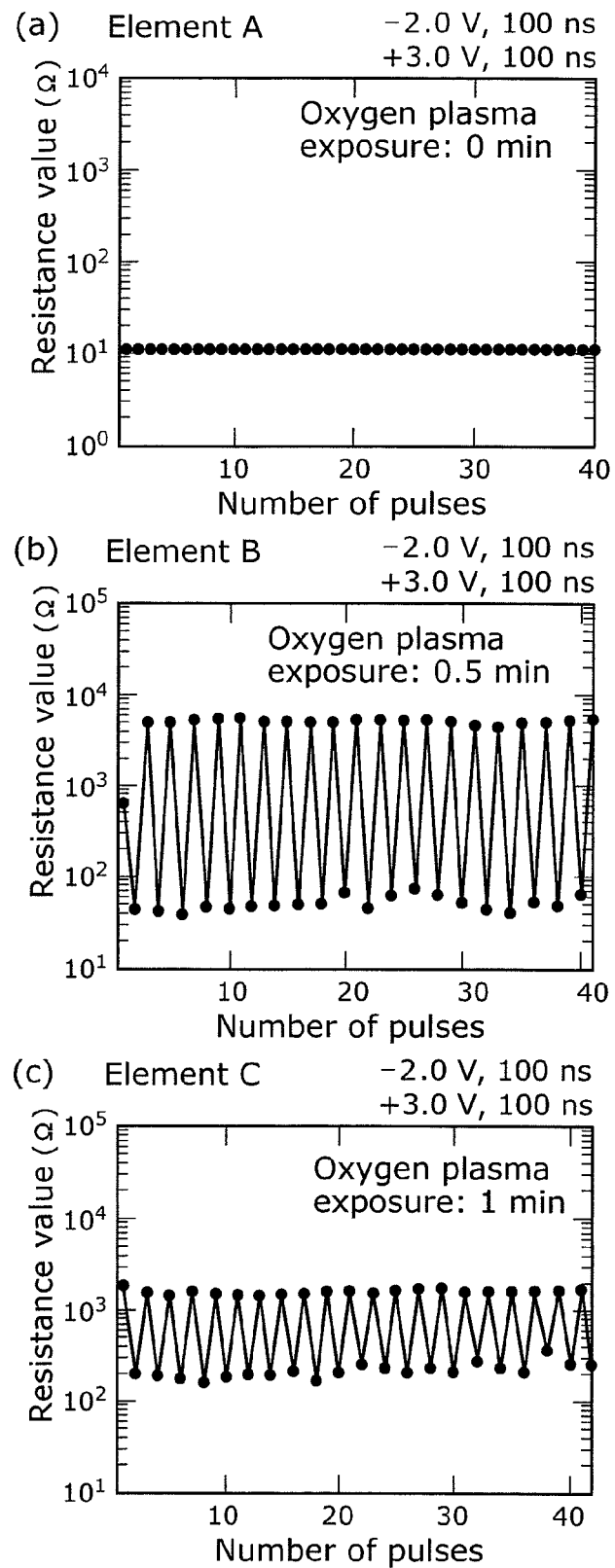
[FIG. 6]

FIG. 6(a) to (c) are graphs each showing a relationship between electrical pulses applied and the resistance value of the variable resistance layer of the nonvolatile storage element according to the first experiment. It is to be noted that FIG. 6(a) to (c) show the results of the elements A to C, respectively. Here, the resistance value of the variable resistance layer 104 was measured while repeatedly applying two types of electrical pulses alternately between the lower electrode 103 and the upper electrode 105 with a pulse width of 100 nsec. The two types of electrical pulses are a negative voltage of −2.0 V and a positive voltage of 3.0 V which are applied to the upper electrode 105 with reference to the lower electrode 103.

First, referring to FIG. 6(b) showing the resistance change characteristics of the element B manufactured by 0.5-minute oxygen plasma exposure, it is clear that application of the electrical pulses of the negative voltage −2.0 V to a sample in the initial state immediately after the measurement causes a decrease in the resistance value from 650Ω to about 50Ω. Thereafter, it is possible to see that application of the electrical pulses of the positive voltage 3.0 V causes an increase in the resistance value to 5000Ω, and after that, reversible resistance changes between 50Ω and 5000Ω occur very stably in B mode, which is similar to the characteristics shown in FIG. 3(b).

Further, as is clear from FIG. 6(c), the element C manufactured by one-minute oxygen plasma exposure also exhibits stable, reversible resistance changes within the measured range. The application of the electrical pulses of −2 V to the element whose initial resistance is 1850Ω causes a decrease in the resistance value to about 200Ω, and then the application of the electrical pulses of +3 V causes an increase in the resistance value to about 2000Ω. In this case, too, the stable resistance changes occur in B mode.

Further, it was found that the elements B and C do not exhibit reversible resistance changes in A mode which is similar to the characteristics shown in FIG. 3(a), but only exhibit the reversible resistance changes in B mode.

Referring to FIG. 6(a) showing the resistance change characteristics of the element A, however, indicates that the resistance does not change even when the two types of electrical pulses −2.0 V and 3.0 V are applied. Since the element A is manufactured by zero-minute oxygen plasma exposure, that is, the element A is manufactured through the deposition of the upper electrode 105 immediately after the deposition of the first tantalum oxide layer 104a, the second tantalum oxide layer 104b probably does not exist, or is very thin even if it does exist.

These results appear to indicate a need for the second tantalum oxide layer 104b to cause resistance changes. As indicated, with the elements B and C having the second tantalum oxide layer 104b, the reversible resistance changes in B mode can be observed.

The following describes a closer examination of the variable resistance layer 104 in these experiments.
(Analysis of Variable Resistance Layer)

To analyze the structure of the variable resistance layer 104 in this experiment, samples were prepared by, under the same conditions as that of the elements A to C, depositing a tantalum oxide on a substrate in which an oxide layer having a thickness of 200 nm is formed on a single-crystal silicon substrate, followed by oxygen plasma irradiation.

These samples are referred to as samples A, B, and C. Table 1 summarizes the oxygen plasma exposure time and a later-described analysis of each sample. It is to be noted that Pt serving as the upper electrode 105 is not deposited on the samples A to C, and thus the variable resistance layer is exposed.

Figure 7:
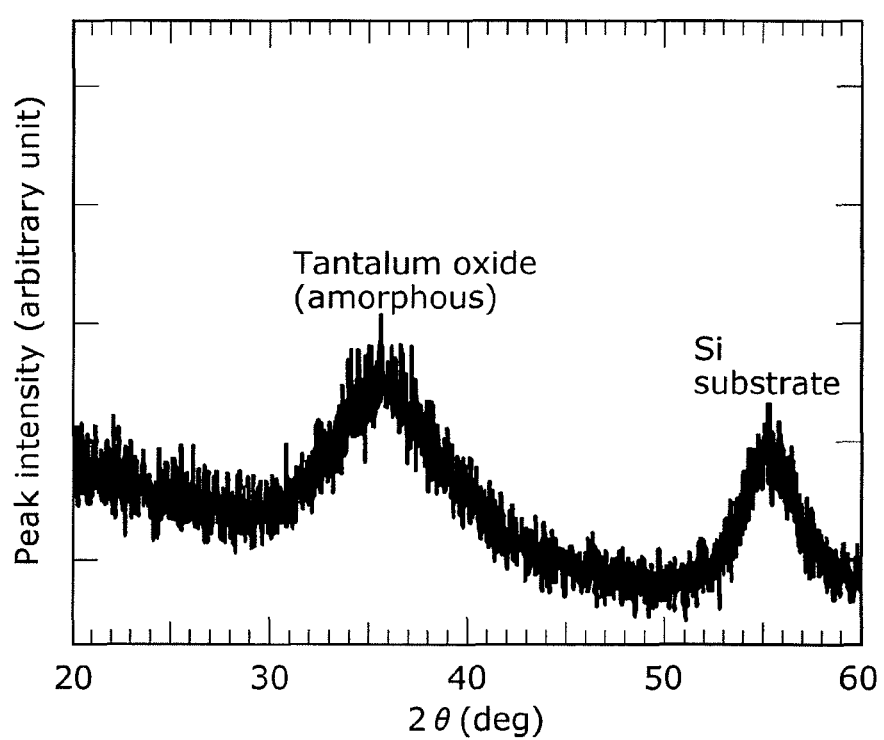
[FIG. 7]

FIG. 7 is a graph showing an X-ray diffraction spectrum of the sample B. This is a measurement of an X-ray diffraction spectrum of a thin film, and therefore, the angle between the X-ray and the sample surface was fixed to 1°, and the diffraction spectrum intensity was measured while varying the angle (2θ) between an extension of the incident X-ray and the detector. FIG. 7 shows that a peak is reached when 2θ is around 36 degrees, indicating that a tantalum oxide has been formed in the sample B. Since it is a wide peak between 30 and 40 degrees, the crystalline state seems to be amorphous. It is to be noted that another peak which is reached when 2θ is 56 degrees is attributable to the silicon substrate.

The samples A and C exhibited the same spectra as that of the sample B, revealing that all of the samples have the variable resistance layer primarily comprising an amorphous tantalum oxide. However, the X-ray diffraction measurement showed very similar spectra among the samples and did not show any dependency on the oxygen plasma exposure time.

As described above, the sensitivity of the X-ray diffraction measurement is not so high for the samples used in this experiment. That is to say, the variable resistance layer in the samples A to C is very thin (30 nm thick) and is amorphous as described above, making it difficult to conduct a detail analysis of the tantalum oxides using an ordinary X-ray diffraction spectrum.

In view of the above, a more detailed analysis was conducted using a method known as X-ray reflectometry. This is a method of emitting an X-ray entering the sample surface at a shallow angle, and measuring the intensity of the X-ray reflected.

Then, fitting is performed presuming an appropriate structural model for the spectrum, so as to evaluate the thickness and the refractive index of the variable resistance layer in the samples A to C. Here, the parameters for the fitting are the layered structure of the variable resistance layer and the thickness and δ (=1−refractive index) of each layer.

Figure 8:
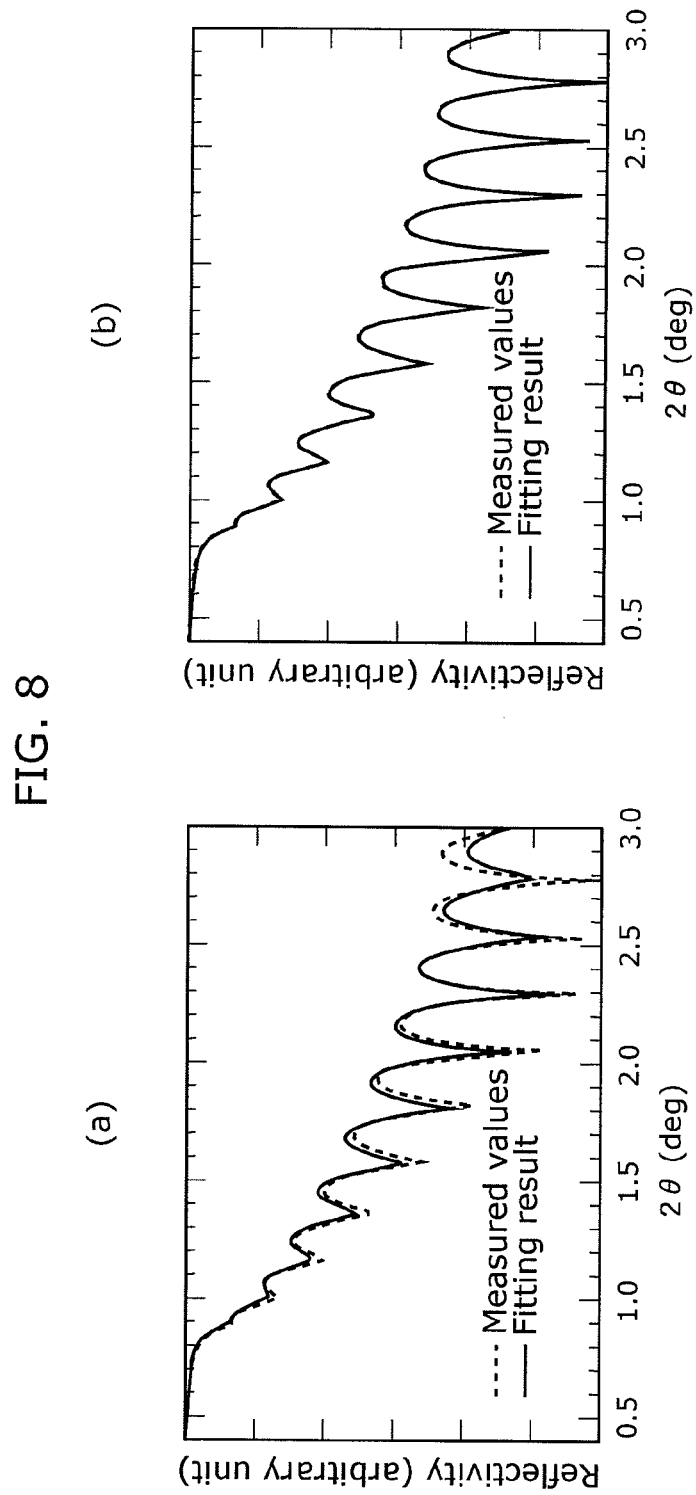
[FIG. 8] FIGS. 8(a) and (b) are graphs each showing, as basic data of the present invention, a result of measuring the X-ray reflectivity of a nonvolatile storage element.

FIGS. 8(a) and (b) each show, as an example, an X-ray reflectivity measurement pattern of the sample B. Here, an angle θ between an incident X-ray and the sample surface and a detector angle (angle θ from the sample surface) were changed in coordination with each other, so as to measure transition in the reflectivity of the X-ray on the sample surface. The angle between an extension of the incident X-ray and the detector is 2θ. In FIGS. 8(a) and (b), the horizontal axis represents the incident angle of the X-ray, and the vertical axis represents the reflectivity of the X-ray.

FIG. 8(a) shows a pattern observed at the time of actually measuring the X-ray reflectivity of the sample B (broken line) and a result of fitting which was performed presuming that a single tantalum oxide layer exists on the substrate (solid line), whereas FIG. 8(b) shows a reflectivity pattern observed at the time of actually measuring the X-ray reflectivity of the sample B (broken line) and a result of fitting which was performed presuming that two tantalum oxide layers exist on the substrate (solid line).

Referring to FIG. 8(a), while the measured values and the fitting result almost match, there are differences at fine levels. On the other hand, referring to FIG. 8(b), the actually measured reflectivity pattern matches well with the reflectivity pattern obtained from the fitting to the extent that they are hardly distinguishable. The above results appear to indicate that the sample A includes two different tantalum oxide layers, namely, the first and the second tantalum oxide layers.

The result of an analysis of the sample B when fitting was performed presuming this double-layered structure showed the following values as shown in Table 1: the thickness of the first tantalum oxide layer was 28.6 nm and δ was $29.3 \times 10^{-6}$; and the thickness of the second tantalum oxide layer was about 1.43 nm and δ was $22.3 \times 10^{-6}$. Generally, δ of metal tantalum is $39 \times 10^{-6}$, and δ of $Ta_2O_5$ is $22 \times 10^{-6}$. Comparison between these generally known values and the above obtained values appears to indicate that the first tantalum oxide layer is an oxide deficient in oxygen such as $TaO_{1.43}$, which is clearly different from the stoichiometric composition of tantalum.

Further, as for the second tantalum oxide layer, calculating its compositional ratio using the δ value gives $TaO_{2.45}$, indicating an oxide similar to $Ta_2O_5$ ($TaO_{2.5}$). However, the second tantalum oxide layer seems to be an oxygen-deficient oxide which is slightly different from the stoichiometric composition.

Referring to Table 1, the sample C showed almost the same result. More specifically, when the first tantalum oxide layer is expressed as $TaO_x$, its thickness is approximately 29 nm and x is about 1.4, and when the second tantalum oxide layer is expressed as $TaO_y$, its thickness is approximately 1.2 nm and y is about 2.3.

In addition, Table 1 shows that even the sample A manufactured by zero-minute oxygen plasma exposure has the second tantalum oxide layer of about 1 nm in thickness. The sputtering apparatus which deposited the tantalum oxide is kept at high vacuum with a back pressure of $7 \times 10^{-4}$ Pa, and thus it is unlikely that this oxide layer was formed in the sputtering apparatus.

Thus, the main part of this layer was probably formed during a time from when the sample A was taken out of the sputtering apparatus after the sputtering and until when the X-ray reflectivity was measured (In fact, the measurement was taken a few days after taking out the sample A from the sputtering apparatus). That is to say, if the second electrode is formed without taking the sample A out of the sputtering apparatus, the second tantalum oxide layer 104b probably does not exist, or is as thin as 1 nm or less even if it does exist.

The same inference indicates a possibility that even with the samples B and C, the thickness of the second tantalum oxide layer slightly increased due to exposure to the air after being taken out from the sputtering apparatus which deposited the tantalum oxide (before the X-ray reflectivity measurement). However, it is known that the oxidation generally proceeds fast at the beginning and gradually slows down.

Therefore, in the case of forming the second tantalum oxide having a higher oxygen content percentage by exposure to oxygen plasma in the sputtering apparatus, it is inferred that the proportion of the second tantalum oxide layer which increased outside the sputtering apparatus is small.

The existence of the second tantalum oxide layer is consistent with the fact described above with reference to Table 1 that the initial resistance of the variable resistance layer 104 of the elements B and C is much higher than in the case of providing a single layer of the first tantalum oxide layer.

That is to say, the resistance values of the elements B and C are higher by two to three digits than the resistance value of the element A which appears to have no second tantalum oxide layer. This is probably because the elements B and C have, between the first tantalum oxide layer 104a and the upper electrode 105, a highly resistant second tantalum oxide layer 104b having a higher oxygen content percentage.

Generally, $Ta_2O_5$ having a stoichiometric composition is considered to be an insulator. However, as described above, the second tantalum oxide layer is not an insulator because it is deficient in oxygen compared to $Ta_2O_5$. It is to be noted that the present invention follows the general definition of an insulator. To be more specific, a material whose resistivity is $10^8$ Ωcm or greater is defined as an insulator (Non Patent Literature: "*Semiconductor Engineering for Integrated Circuits*" (Kougyou Chousakai, 1992) Akira Usami, Shinji Kanefusa, Takao Maekawa, Hajime Tomokage, and Morio Inoue), and a material whose resistivity is smaller than $10^8$ Ωcm is defined as a conductor.

If the second tantalum oxide layer of the present experiment is an insulator and has a resistivity of $10^8$ Ωcm, its resistance value should be approximately $1.4 \times 10^8$ Ωcm (resistance value=resistivity×thickness/area) given that it has a circular shape with a diameter of 3 μm (diameter of the element region 107 in this experiment) and has a thickness of 1 nm (roughly estimated thickness of the second tantalum oxide layer). Even when the second tantalum oxide layer has a thickness of 0.1 nm, its resistance value is given by $1.4 \times 10^7$ Ωcm. On the other hand, in the elements B and C, the resistance value is approximately $10^3$ to $10^4$ Ω at most with reference to Table 1, which is lower than in the case of assuming an insulator, by at least three to four digits approximately.

This calculation result also indicates that the second tantalum oxide layer formed in the present experiment is not an insulator but a conductive oxide layer.

Although this experiment used the X-ray reflectivity measurement for analyzing the second tantalum oxide layer, other instrumental analysis techniques can also be used, including Auger electron spectroscopy analysis (AES), fluorescent X-ray photoelectron spectroscopy analysis (XPS), and electron probe microanalysis (EPMA: also known as WDS, EDS, or EDX depending on the detection method).

(Relationship Between Thickness of Second Tantalum Oxide Layer and Resistance Change Phenomenon)

The element B and the sample B underwent the sputtering and the oxygen plasma irradiation under the same condition. The element C and the sample C also underwent the sputtering and the oxygen plasma irradiation under the same condition. Thus, in the elements B and C as in the samples B and C, the second tantalum oxide layer 104b probably exists between the first tantalum oxide layer 104a and the upper electrode 105.

Therefore, it can be said that the second tantalum oxide layer 104b having a thickness of 1.1 nm is formed in the element B as in the sample B, and the second tantalum oxide layer 104b having a thickness of 1.2 nm is formed in the element C as in the sample C.

As previously described, the elements B and C exhibit a stable resistance change phenomenon in B mode. However, the element A which does not have the second tantalum oxide layer having a higher oxygen content percentage does not exhibit the resistance change phenomenon. This appears to indicate that the second tantalum oxide layer is essential for a resistance change. In the present experiment, the composition of this second tantalum oxide layer, when expressed as $TaO_y$, is sufficient if it has a thickness of about 1.1 nm and y of about 2.1.

(Relationship between Thickness of First Tantalum Oxide Layer and Resistance Change Phenomenon)

Next, a variable resistance element (referred to as an element B') was manufactured which includes a first tantalum oxide layer having a thickness different from that in the above element B, and the resistance change characteristics of this variable resistance element were examined.

The element B' is different from the element B only in thickness of the first tantalum oxide layer 104a. While the thickness of the first tantalum oxide layer 104a of the element B was 30 nm, the thickness of the first tantalum oxide layer 104a of the element B' was 90 nm. In manufacturing the element B', the oxygen plasma exposure time was 0.5 minutes as in the case of the element B. Therefore, with the element B' too, the thickness of the second tantalum oxide layer 104b is probably 1 to 2 nm approximately.

When electrical pulses of a negative voltage −2.0 V and a positive voltage 3.0 V with a pulse width of 100 nsec were alternately and repeatedly applied between the upper electrode 105 and the lower electrode 103 of the element B, the element B exhibited such resistance change characteristics that the resistance value changed from about 500Ω to 20Ω when −2.0 V was applied, and thereafter, reversible resistance changes stably occurred in B mode between about 20Ω and about 200Ω.

The above results show that the thickness of the first tantalum oxide layer does not have a significant impact on the resistance change phenomenon of the nonvolatile storage element according to the present experiment.

As described above, the first experiment involved deposition of the first tantalum oxide layer in the sputtering apparatus, followed by oxidation using oxygen plasma to form the second tantalum oxide layer. However, this method could not thickly form the second tantalum oxide layer due to the apparatus used. Thus, as the second experiment, the following describes the operation of the variable resistance element in the case where a second tantalum oxide layer is thickly formed.

(Manufacturing Method of Variable Resistance Element)

The structure and the manufacturing method of the variable resistance element used in the second experiment are basically the same as in the first experiment. However, for convenience of the oxidation process, the second experiment is different from the first experiment in condition under which tantalum oxide is deposited and size of the nonvolatile storage element formed. Hereinafter, a process for manufacturing a nonvolatile element is described with reference to FIG. 5(a) to (c).

First, as shown in FIG. 5(a), thermal oxidation produces the oxide layer 102 having a thickness of 200 nm on the substrate 101 which is a single-crystal silicon. Then, by sputtering, a Pt thin film having a thickness of 100 nm is deposited on the oxide layer 102 as the lower electrode 103. After that, the first tantalum oxide layer 104a is formed on the lower electrode 103 by reactive sputtering, with tantalum used as the target.

Here, the first tantalum oxide layer 104a was deposited under the condition described below. That is, the substrate was placed in the sputtering apparatus and then the sputtering apparatus was vacuumed to about $8 \times 10^{-6}$ Pa. Then, the sputtering was performed for 20 seconds with tantalum used as the target, power set to 1.6 kW, a flow of an argon gas at 34 sccm, a flow of an oxygen gas at 21 sccm, and the pressure in the sputtering apparatus kept at 0.17 Pa. With this, the first tantalum oxide layer was deposited with a thickness of 30 nm, a resistivity of 6 mΩcm, and an oxygen content percentage of about 61 at % ($TaO_{1.6}$).

Next, as shown in FIG. 5(b), the top surface of the first tantalum oxide layer 104a was oxidized to modify the surface property. Here, as shown in Table 2, elements D and E were manufactured with different oxidation methods. More specifically, with the element D, after the sputtering was performed, the substrate was taken out of the sputtering apparatus and placed in an oxygen plasma generation apparatus in which oxidation was performed by exposing the substrate to oxygen plasma while heating the substrate to keep at a temperature of 250° C. As for the element E, the substrate was placed in a lamp annealing apparatus in which the oxidation was performed using a flow of an oxygen gas while heating the substrate to keep at a temperature of 300° C. Such oxidation processes produced the second tantalum oxide layer 104b having an oxygen content percentage higher than that of the first tantalum oxide layer 104a (An analysis of film composition of the second tantalum oxide layer is described later).

Subsequently, by sputtering, a Pt thin film having a thickness of 150 nm was formed on the second tantalum oxide layer 104b as the upper electrode 105. To prevent oxidization of the second tantalum oxide layer 104b in the air, the upper electrode 105 was formed immediately after the deposition of the second tantalum oxide layer 104b. Lastly, photolithography processing created the pattern 106 using a photoresist, and dry etching produced the element region 107. The element region 107 here is assumed to be a rectangle with each side being 0.5 μm in length.

TABLE 2

| | | | Element D (Sample D) | Element E (Sample E) |
|---|---|---|---|---|
| | Oxidation Method | | Oxygen Plasma Oxidation (250° C.) | Lamp Annealing Oxidation (300° C.) |
| | Initial Resistance Value (Ω) | | 426 | 610 |
| X-ray Reflectivity Measurement Result | $TaO_x$ Layer (First Tantalum Oxide Layer) | Thickness (nm) δ x | 26.6 $28.5 \times 10^{-6}$ 1.54 | 27.9 $28.2 \times 10^{-6}$ 1.59 |
| | $TaO_y$ Layer (Second Tantalum Oxide Layer) | Thickness (nm) δ y | 8.1 $22.2 \times 10^{-6}$ 2.47 | 7.3 $22.8 \times 10^{-6}$ 2.38 |

(Resistance Change Characteristics of Elements D and E)

Next, the following describes the characteristics observed when a resistance change occurs upon application of electrical pulses to the elements D and E which were actually manufactured in the second experiment.

Figure 9:
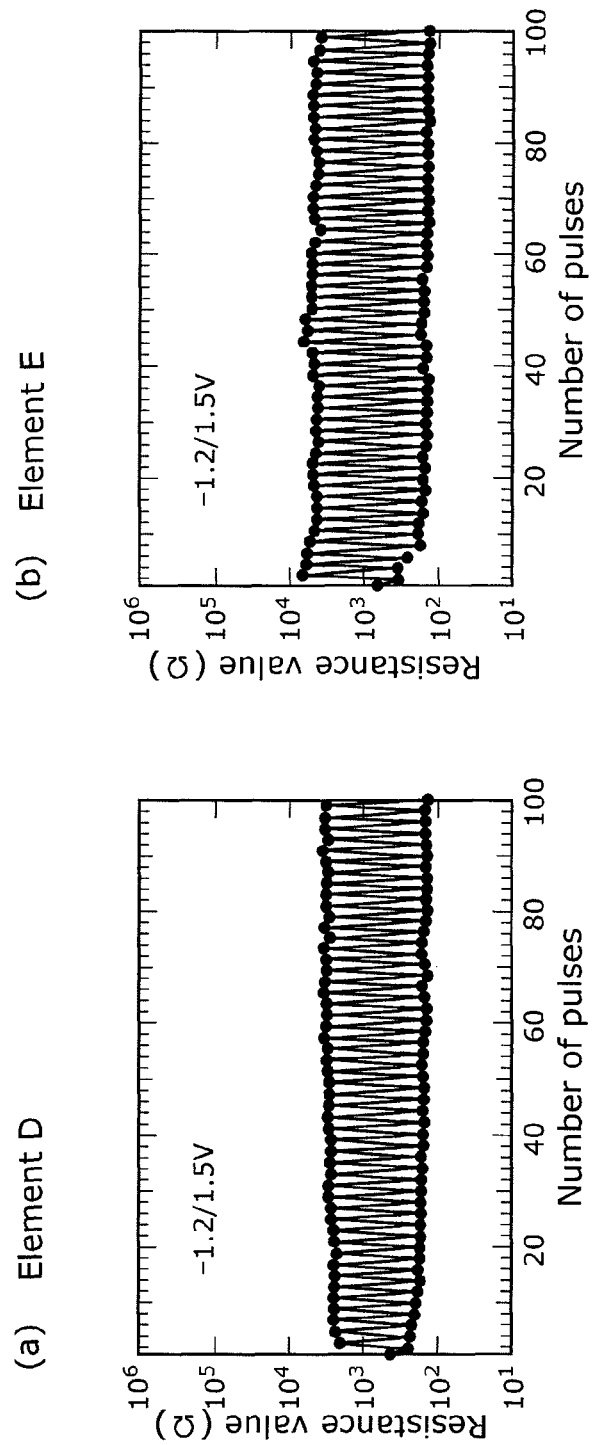
[FIG. 9] FIGS. 9(a) and (b) are graphs each showing, as basic data of the present invention, a relationship between the resistance value of a nonvolatile storage element and the number of electrical pulses applied.

FIG. 9(a) and (b) are graphs each showing a relationship between electrical pulses applied and the resistance value of the variable resistance layer included in the variable resistance element of the second experiment. Here, FIG. 9(a) and (b) show the results of the elements D and E, respectively.

First, the following describes the result of the element D in which the second tantalum oxide layer was formed through the oxidation using oxygen plasma. As is clear from the result shown in FIG. 9(a), application of a negative voltage of −1.3 V to the upper electrode of the variable resistance element immediately after being manufactured causes a decrease in the resistance value, which was initially about 400Ω, to about 200Ω, and application of a positive voltage of 1.5 V increases the resistance value to about 2000Ω. After that, upon applying the electrical pulses of the positive voltage 1.5 V and the negative voltage −1.3 V alternately, stable resistance changes occur in B mode, with the resistance value varying between 200Ω to 3000Ω approximately.

Next, referring to FIG. 9(b) showing the result of the element E which underwent the oxidation through lamp annealing, it is clear that stable resistance changes in B mode occur also in the element E. More specifically, the resistance, which was initially about 600Ω, decreases to about 300Ω upon application of the negative voltage of −1.3 V and increases to about 5000Ω upon application of the positive voltage of 1.5 V. After that, upon applying the electrical pulses of the positive voltage 1.5 V and the negative voltage −1.3 V alternately, stable resistance changes occur in B mode with the resistance value varying between 200Ω to 5000Ω approximately.

Figure 10:
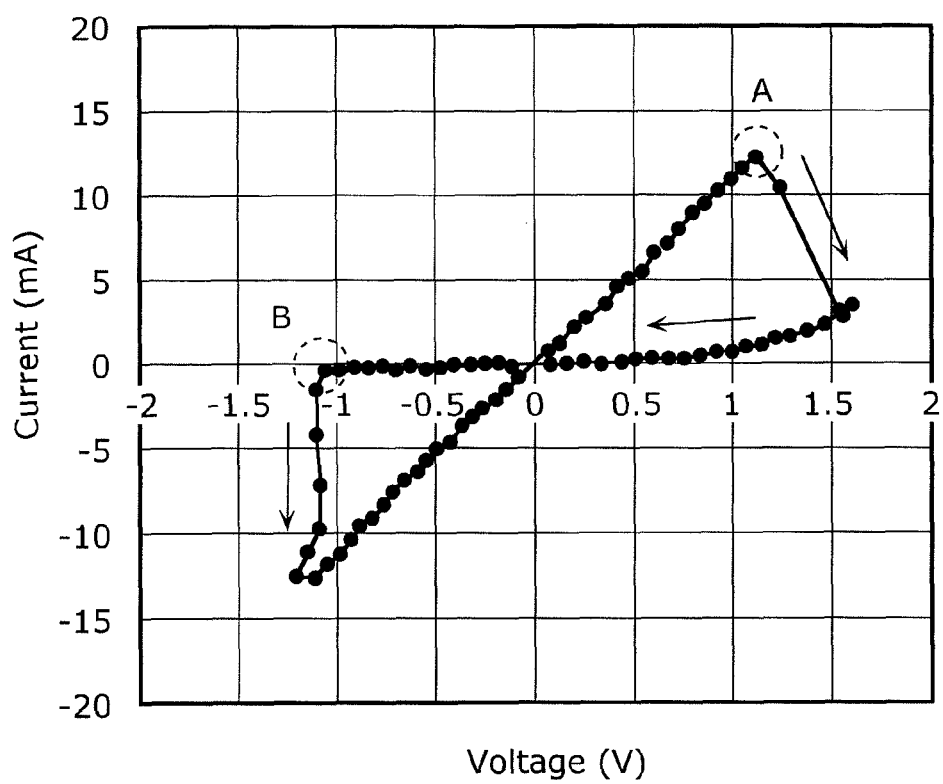
[FIG. 10]

FIG. 10 illustrates hysteretic current-voltage characteristics showing how the resistance of the element D changes. The horizontal axis represents the voltage applied to the upper electrode 105 with reference to the lower electrode 103, and the vertical axis represents the value of a current flowing in the element D.

As FIG. 10 shows, application of a positive voltage to the upper electrode 105 side with reference to the lower electrode 103 increases the current almost in proportion to the voltage, and the current rapidly decreases when the positive voltage exceeds the voltage at the point A. This shows a change in the resistance from a low resistance state to a high resistance state.

On the other hand, in gradual application of a negative voltage to the upper electrode 105 side with reference to the lower electrode 103 (equivalent to application of a positive voltage to the lower electrode 103 side with reference to the upper electrode 105) in the high resistance state, the current rapidly increases when the negative voltage exceeds the voltage at the point B. This shows a change in the resistance from the high resistance state to the low resistance state.

FIG. 10 further shows that the change from the low resistance state to the high resistance state does not occur before the point A and the change from the high resistance state to the low resistance state does not occur before the point B.

Thus, it is clear that the element D exhibits the resistance changes in B mode and requires a larger driving current for the resistance change from the low resistance state to the high resistance state than for the resistance change from the high resistance state to the low resistance state.

(Analysis of Variable Resistance Layer)

To analyze the structure of the variable resistance layer 104 used in this experiment, samples were prepared by, under the same conditions as that of the elements D and E, depositing a tantalum oxide on a substrate in which an oxide layer having a thickness of 200 nm is formed on a single-crystal silicon substrate, followed by oxidation. These samples are referred to as samples D and E. The results of the X-ray reflectivity measurement on these samples are shown in Table 2. It is to be noted that in the samples D and E, the second tantalum oxide layer is exposed as in the case of the samples A to C.

Referring to Table 2, the sample D which was oxidized using oxygen plasma has the second tantalum oxide layer $TaO_y$ whose thickness is 8.1 nm, which is, as originally intended, thicker than that of the samples A to C. Further, y is 2.47, indicating that oxygen is more deficient in $TaO_y$ than in $Ta_2O_5$ having a stoichiometric composition. As for the sample E which was oxidized using the lamp annealing apparatus, the thickness of the second tantalum oxide layer $TaO_y$ was 7.3 nm and y was 2.38.

(Cross-Section Observation of Nonvolatile Storage Element)

As described above, the second tantalum oxide layer formed in the variable resistance element in this experiment has a thickness of 7 to 8 nm approximately. Such a thickness is sufficient for observing the existence of the second tantalum oxide layer through cross-section observation of the nonvolatile element using a transmission electron microscope. Thus, cross-section observation was actually performed on the variable resistance element in which the second tantalum oxide layer was formed through the oxidation using oxygen plasma.

Figure 11:
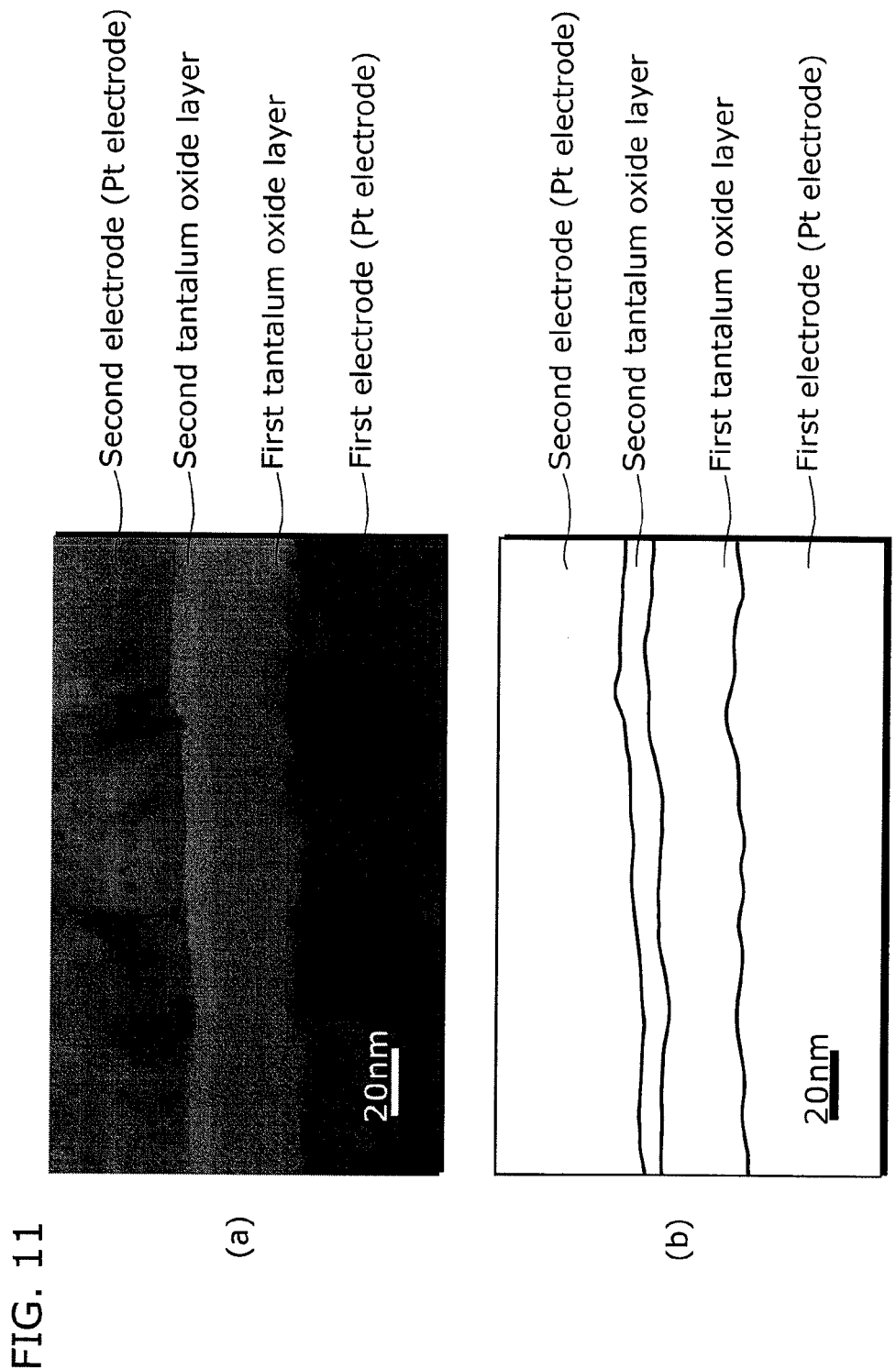
[FIG. 11] FIGS. 11(a) and (b) are diagrams showing, as basic data of the present invention, a result of cross-section observation of a nonvolatile storage element.

FIGS. 11(a) and (b) show the observation result. These diagrams clearly show the first electrode comprising Pt, the first tantalum oxide layer, the second tantalum oxide layer, and the second electrode comprising Pt. In addition, the diagrams show that, though there is some unevenness, the thickness of the first tantalum oxide layer is about 28 nm, and the thickness of the second tantalum oxide layer is about 8 nm.

These values almost match the result of the X-ray reflectivity measurement on the sample D which was manufactured under the same oxidation condition (as Table 2 shows, the thickness of the first tantalum oxide layer is 26.6 nm and the thickness of the second tantalum oxide layer is 8.1 nm).

The above result made it clear that the second tantalum oxide layer does actually exist in the nonvolatile storage element used in the second experiment. In addition, it proves the validity of the analysis using the X-ray reflectivity measurement.

The third experiment is now described.

In the case of the elements A to C used in the above-described first experiment, the oxygen content percentage of the first tantalum oxide layer 104a was 58 at % ($TaO_{1.4}$). The first tantalum oxide layer 104a of the elements D and E used in the second experiment had a similar oxygen content percentage of 61 at % ($TaO_{1.6}$).

In contrast, the variable resistance element used in the third experiment includes the first tantalum oxide layer whose oxygen content percentage is changed to be a little greater. The structure of the variable resistance element used in the third experiment is the same as in the first and the second experiments, and is thus not shown.

Figure 5:
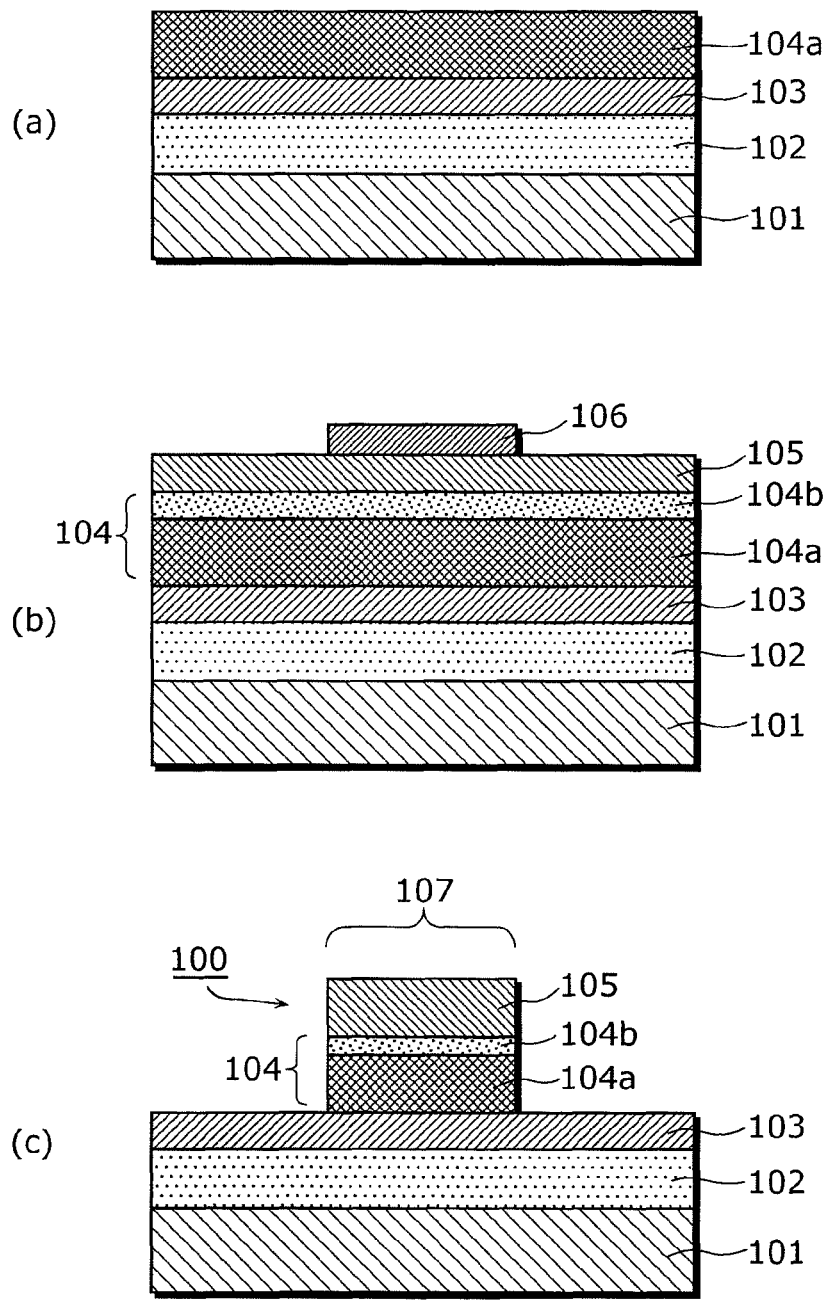
[FIG. 5]

With reference to FIG. 5, the following describes a method of manufacturing the variable resistance element used in the third experiment, which was manufactured using the first tantalum oxide layer having a different oxygen content percentage, and also describes the resistance change characteristics and so on of that variable resistance element.

(Relationship Between Oxygen Flow Ratio in Sputtering and Composition)

First, the following describes the condition under which the tantalum oxide layer of the third experiment was manufactured and an analysis result of the oxygen content percentage in the third experiment. The tantalum oxide was manufactured using the same method as in the first experiment. However, the oxygen content percentage of the tantalum oxide is controlled by adjusting the oxygen flow ratio employed in sputtering.

Describing in accordance with the specific processes of sputtering, first, a substrate is placed in a sputtering apparatus, and the sputtering apparatus is vacuumed to about $7 \times 10^{-4}$ Pa. Then, the sputtering is performed with tantalum used as the target, power set to 250 W, the total gas pressure of the argon gas and the oxygen gas set to 3.3 Pa, and the preset temperature of the substrate set to 30° C. Here, the flow ratio of the oxygen gas is varied from 0.8% to 6.7%.

Since the object of the third experiment is to examine the composition, $SiO_2$ deposited 200 nm in thickness on Si (Silicon) was used as the substrate, and the sputtering time was adjusted to make the thickness of the tantalum oxide layer about 100 nm. Unlike in the first experiment, the oxygen plasma exposure was not performed in the third experiment.

Figure 12:
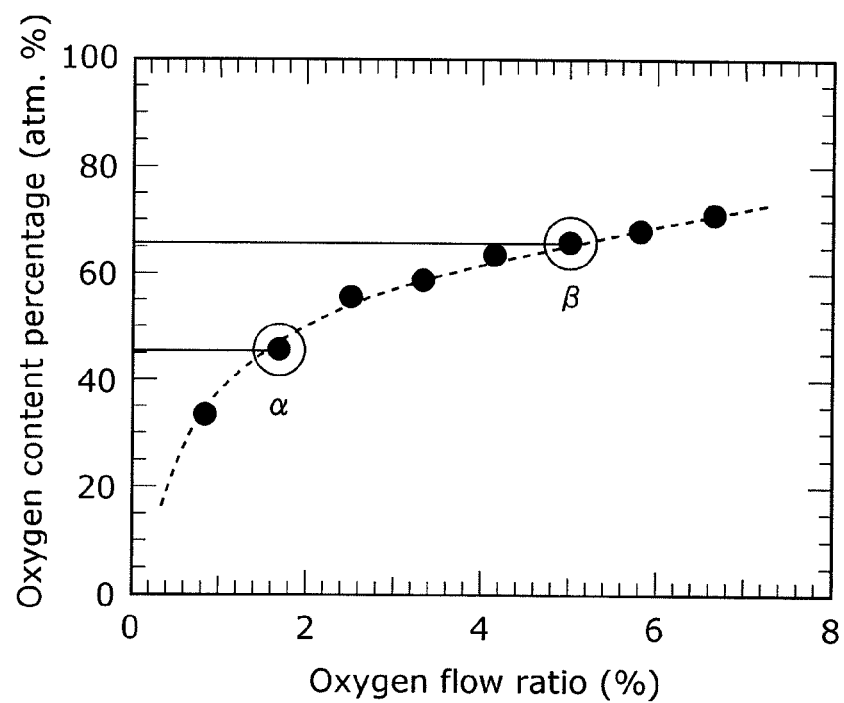
[FIG. 12]

FIG. 12 shows a result of analyzing, using the Rutherford backscattering spectrometry (RBS) and the Auger electron spectroscopy (AES), the composition of the tantalum oxide layer manufactured in the above manner. FIG. 12 shows that the oxygen content percentage of the tantalum oxide layer changes from approximately 40 at % ($TaO_{0.66}$) to approximately 70 at % ($TaO_{2.3}$) when an oxygen partial pressure ratio is changed from 0.8% to 6.7%. More specifically, it is clear that the oxygen content percentage of the tantalum oxide layer can be controlled by varying the oxygen flow ratio.

It appears that the sample prepared for the composition measurement was oxidized with oxygen in the air during a time between the deposition on the substrate and the measurement, thereby forming a high oxygen content percentage layer on the sample surface. However, because the surface was etched before the measurement using the RBS and the AES, it is possible to ignore the impact that the high oxygen content percentage layer formed on the surface has on the measurement of the oxygen content percentage.

Although the present experiment used the Rutherford backscattering spectrometry (RBS) and the Auger electron spectroscopy (AES) for analyzing the tantalum oxide layer, other instrumental analysis techniques can also be used, including fluorescent X-ray photoelectron spectroscopy analysis (XPS) and electron probe microanalysis (EPMA).

(Composition of First Tantalum Oxide Layer and Resistance Change Characteristics)

Next, the following describes the resistance change characteristics observed when the variable resistance element 100 is manufactured by forming the variable resistance layer 104 using, as the first tantalum oxide layer 104a and the second tantalum oxide layer 104b, each of tantalum oxide layers having different oxygen content percentages.

The variable resistance element 100 was manufactured using the same method as in the first experiment. To be more specific, thermal oxidation produced the oxide layer 102 having a thickness of 200 nm on the substrate 101 which is a single-crystal silicon, and then, by sputtering, a Pt thin film having a thickness of 100 nm was deposited on the oxide layer 102 as the lower electrode 103. Then, the sputtering was performed to form the first tantalum oxide layer 104a, with tantalum used as the target, power set to 250 W, the total gas pressure of the argon gas and the oxygen gas set to 3.3 Pa, and the preset temperature of the substrate set to 30° C.

In this experiment, each example element was manufactured with the flow ratio of the oxygen gas varied from 0.8% to 6.7%.

The sputtering time was adjusted such that the thickness of the first tantalum oxide layer 104a becomes 30 nm. Thereafter, the top surface of the first tantalum oxide layer 104a was exposed to oxygen plasma for 30 seconds, so as to form the second tantalum oxide layer 104b. Lastly, by sputtering, a Pt thin film having a thickness of 150 nm was formed on the second tantalum oxide layer 104b as the upper electrode 105, so as to form the variable resistance element 100.

The resistance change phenomenon of the variable resistance element formed in the above manner was measured. The result of the measurement showed a satisfactory resistance change phenomenon. More specifically, with the non-volatile storage element using a tantalum oxide film represented by a range in FIG. 12 from point α (an oxygen flow ratio of approximately 1.7% and an oxygen content percentage of approximately 45 at %) to point β (an oxygen flow ratio of approximately 5% and an oxygen content percentage of approximately 65 at %), the high resistance value was equal to or more than five times larger than the low resistance value.

FIGS. 13(a) and (b) each show a result of measuring the resistance change characteristics, which vary according to the number of pulses applied, of a sample having the oxygen content percentage at the point α or the point β. FIGS. 13(a) and (b) show that with both the oxygen content percentages at the points α and β, each high resistance value is equal to or more than five times larger than the low resistance value. Thus, a compositional range in which the oxygen content percentage is 45 to 65 at %, that is, a range of $0.8 \leq x \leq 1.9$ when the variable resistance layer is expressed as $TaO_x$ is a more appropriate range of the variable resistance layer (the oxygen content percentage of 45 at % and the oxygen content percentage of 65 at % correspond to x=0.8 and x=1.9, respectively).

As described so far in the first to third experiments, it was found that with the variable resistance element shown in FIG. 4, the variable resistance layer 104 having a layered structure including (i) the first oxygen-deficient tantalum oxide layer having a composition $TaO_x$ ($0.8 \leq x \leq 1.9$) and provided in contact with the lower electrode and (ii) the second oxygen-deficient tantalum oxide layer having a composition $TaO_y$ ($2.1 \leq y < 2.5$) and provided in contact with the upper electrode exhibits stable resistance changes in B mode in which the following resistance changes repeatedly take place: the resistance state changes into the low resistance state when negative voltage pulses are applied to the upper electrode side with reference to the lower electrode; and the resistance state changes into the high resistance state when positive voltage pulses are applied to the upper electrode side with reference to the lower electrode.

The variable resistance element having such a structure did not exhibit the resistance changes in A mode which are resistance changes of the reversed polarity. Further, with this structure, the thickness of the second oxygen-deficient tantalum oxide layer between 1 nm and 8 nm inclusive was favorable in exhibiting the stable resistance changes in B mode.

Next, the following describes the fourth experiment related to a variable resistance element which exhibits stable resistance changes in A mode, which are opposite to the resistance changes described so far.

(Structure of Variable Resistance Element)

Figure 14:
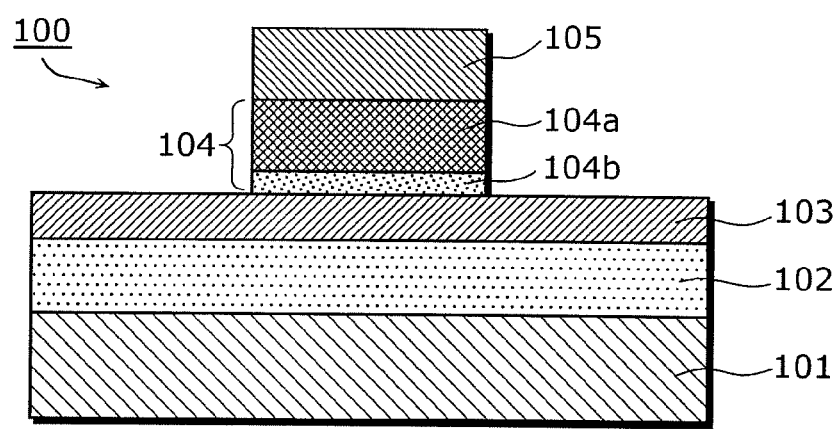
[FIG. 14]

FIG. 14 is a cross-sectional view showing a structural example of a variable resistance element according to the fourth experiment. As shown in FIG. 14, the variable resistance element 100 used in the fourth experiment includes: a substrate 101; an oxide layer 102 formed on the substrate 101; a lower electrode 103 formed on the oxide layer 102; an upper electrode 105; and a variable resistance layer 104 located between the lower electrode 103 and the upper electrode 105.

Here, the variable resistance layer 104 includes: a first tantalum containing layer (hereinafter referred to as "first tantalum oxide layer") 104a having a lower oxygen content percentage; and a second tantalum containing layer (hereinafter referred to as "second tantalum oxide layer") 104b formed on the first tantalum oxide layer 104a and having a higher oxygen content percentage.

The variable resistance element used in the fourth experiment is different from that used in the first to third experiments in that the second tantalum oxide layer 104b is provided in contact with the lower electrode 103, and the first tantalum oxide layer 104a is provided in contact with the upper electrode 105.

(Manufacturing Method of Variable Resistance Element)

Next, a manufacturing method of the variable resistance element 100 used in the present experiment is described with reference to FIG. 15(a) to (c).

Figure 15:
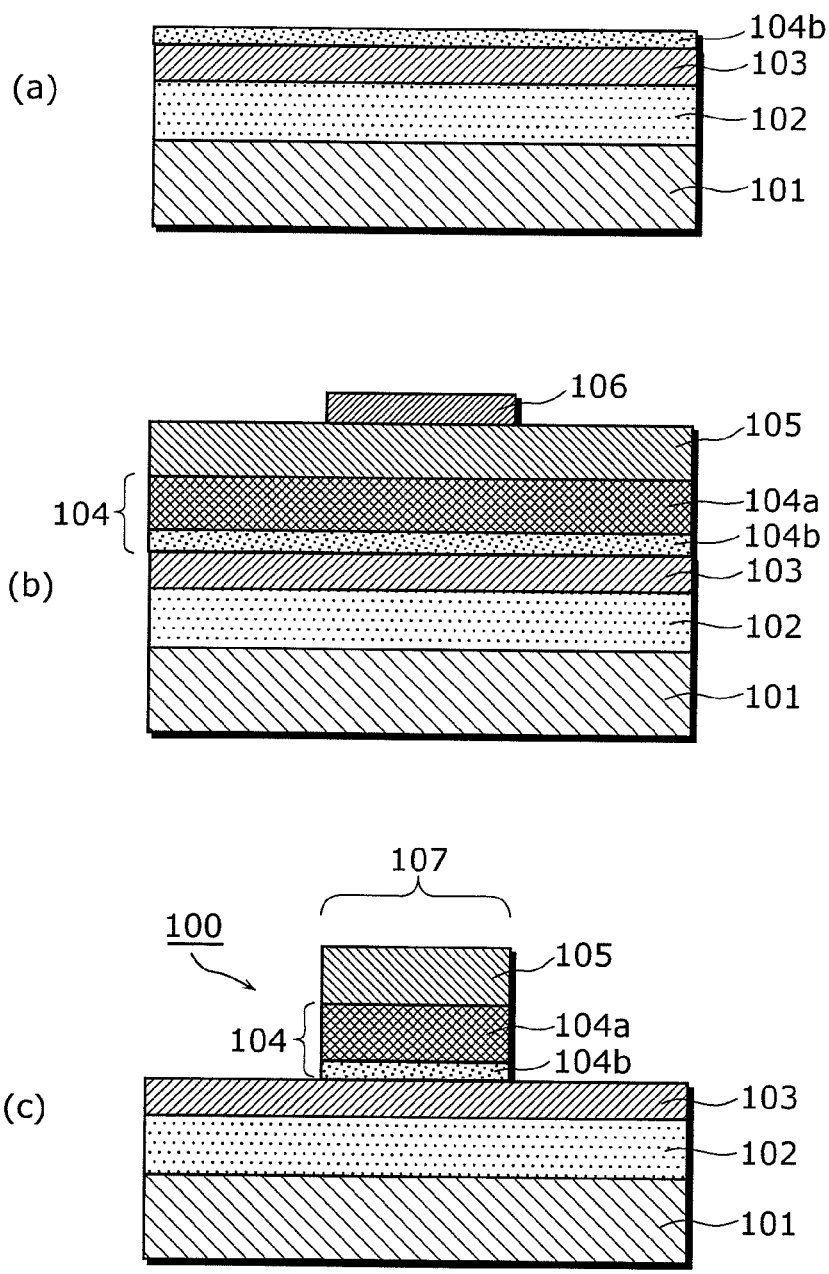
[FIG. 15]

First, as shown in FIG. 15(a), thermal oxidation produces the oxide layer 102 having a thickness of 200 nm on the substrate 101 which is a single-crystal silicon. Then, by sputtering, a Pt thin film having a thickness of 100 nm is deposited on the oxide layer 102 as the lower electrode 103. After that, by sputtering, the second tantalum oxide layer 104b is formed about 3 nm in thickness on the lower electrode 103, with $Ta_2O_5$ used as the target.

Next, as shown in FIG. 15(b), the first tantalum oxide layer 104a is formed on the second tantalum oxide layer 104b by reactive sputtering, with tantalum used as the target. For forming the first tantalum oxide layer 104a, the sputtering is performed for 18 seconds with tantalum used as the target, power set to 1.6 kW, a flow of an argon gas at 34 sccm, a flow of an oxygen gas at 21 sccm, and the pressure in the sputtering apparatus kept at 0.17 Pa. With this, the first tantalum oxide layer was deposited 27 nm in thickness, with the resistivity of 6 mΩcm and the oxygen content percentage of about 61 at % (TaO$_{1.6}$).

This produces, on the surface of the second tantalum oxide layer 104b, the first tantalum oxide layer 104a having an oxygen content percentage lower than that of the second tantalum oxide layer 104b. Such a layered structure of the second tantalum oxide layer 104b and the first tantalum oxide layer 104a is the structure of the variable resistance layer 104.

Subsequently, by sputtering, a Pt thin film having a thickness of 150 nm is formed on the first tantalum oxide layer 104a as the upper electrode 105. Lastly, photolithography processing creates a pattern 106 using a photoresist, and dry etching produces an element region 107 as shown in FIG. 15(c).

With the above-described manufacturing method, an element F was manufactured. The element region 107 here is assumed to be a rectangle with each side being 0.5 µm in length.

(Resistance Change Characteristics of Element F)

Next, the following describes the resistance change characteristics observed when a resistance change occurs upon application of electrical pulses to the element F which was actually manufactured in the fourth experiment.

Figure 16:
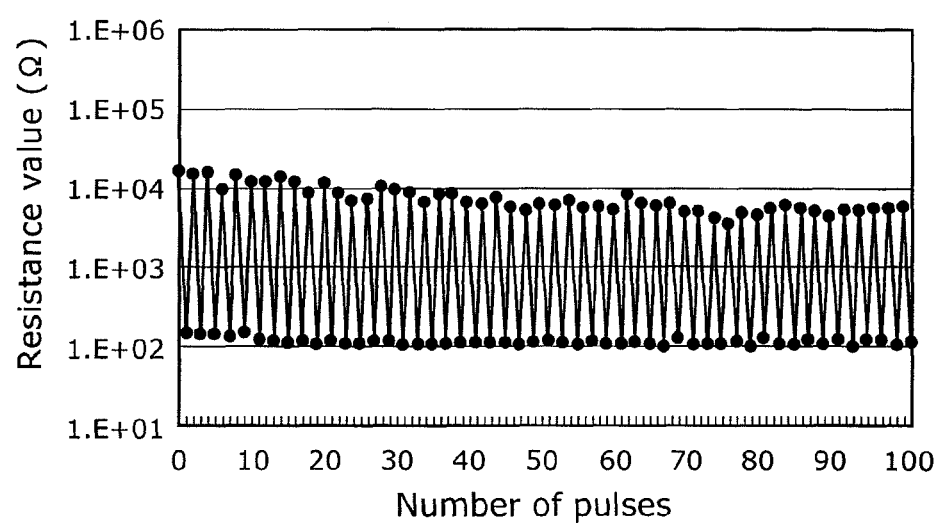
[FIG. 16]

FIG. 16 is a graph showing the resistance value of the variable resistance layer of the element F, in the case of continuously applying pulses of a positive voltage 1.5 V and a negative voltage −1.8 V alternately on the upper electrode with reference to the lower electrode. The pulse width was set to 100 nsec.

First, upon application of a positive voltage of 1.5 V to the upper electrode, the resistance value decreases to about 200Ω, and upon application of a negative voltage of −1.8 V, the resistance value increases to about 20000Ω. After that, upon applying the electrical pulses of the positive voltage 1.5 V and the negative voltage −1.8 V alternately, stable resistance changes occur in A mode, with the resistance value varying between 100Ω to 8000Ω approximately.

Figure 17:
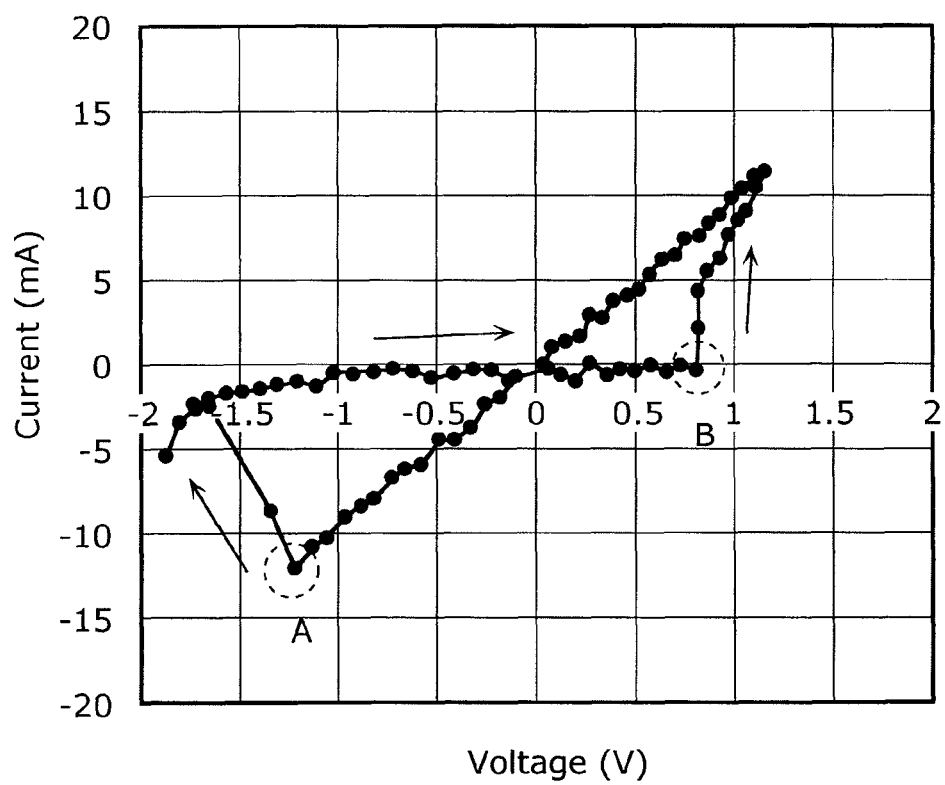
[FIG. 17]

FIG. 17 shows hysteretic current-voltage characteristics indicating how the resistance of the element F changes. The horizontal axis represents the voltage applied to the upper electrode 105 with reference to the lower electrode 103, and the vertical axis represents the value of a current flowing in the element F.

As FIG. 17 shows, application of a negative voltage to the upper electrode 105 side with reference to the lower electrode 103 increases the current almost in proportion to the voltage, and the current rapidly decreases when the negative voltage exceeds the voltage at the point A. In other words, it shows a change in the resistance from a low resistance state to a high resistance state.

On the other hand, in gradual application of a positive voltage to the upper electrode 105 side with reference to the lower electrode 103 (equivalent to application of a negative voltage to the lower electrode 103 side with reference to the upper electrode 105) in the high resistance state, the current rapidly increases when the negative voltage exceeds the voltage at the point B. In other words, it shows a change in the resistance from the high resistance state to the low resistance state.

FIG. 17 further shows that the change from the low resistance state to the high resistance state does not occur before the point A and the change from the high resistance state to the low resistance state does not occur before the point B.

Thus, it indicates that the element F exhibits the resistance changes in A mode and requires a larger driving current for the resistance change from the low resistance state to the high resistance state than for the resistance change from the high resistance state to the low resistance state.

(Inference of Variable Resistance Layer)

The following examines the structure of the variable resistance layer 104 included in the variable resistance element used in the fourth experiment, and especially examines the composition of the second tantalum oxide layer formed in the present experiment by sputtering, with Ta$_2$O$_5$ used as the target.

Due to the plasma in the sputtering process, the composition of the second tantalum oxide layer is not exactly Ta$_2$O$_5$ but is a composition which slightly lacks oxygen. Thus, it is inferred that a tantalum oxide TaO$_y$ (y=2.3 to 2.4) was formed which contains less oxygen than in the composition of the target.

Thus, with the variable resistance element shown in FIG. 17, the structure of the variable resistance layer 104 in this experiment can be identified as follows: the second tantalum oxide layer 104b has a composition TaO$_y$ (y=2.3 to 2.4) with a thickness of 3 nm; and the first tantalum oxide layer 104a has a composition TaO$_x$ (x=1.6) with a thickness of 27 nm.

As described so far regarding the fourth experiment, it was found that with the variable resistance element shown in FIG. 14, the variable resistance layer 104 having a layered structure including (i) the second oxygen-deficient tantalum oxide layer having the composition TaO$_y$ (y=2.3 to 2.4) and provided in contact with the lower electrode and (ii) the first oxygen-deficient tantalum oxide layer having the composition TaO$_x$ (x=1.6) and provided in contact with the upper electrode exhibits the stable resistance changes in A mode in which the following resistance changes repeatedly take place: the resistance state changes into the low resistance state when positive voltage pulses are applied to the upper electrode with reference to the lower electrode; and the resistance state changes into the high resistance state when negative voltage pulses are applied to the upper electrode with reference to the lower electrode.

The variable resistance element having such a structure did not exhibit the resistance changes in B mode which are resistance changes of the reversed polarity. Further, with this structure, the thickness of the second oxygen-deficient tantalum oxide layer was 3 nm.

By combining the structure of the variable resistance element in the fourth experiment and the compositions of the variable resistance layers in the first to third experiments, it is possible to adequately infer that with the structure of the variable resistance element shown in FIG. 14, the variable resistance element using the variable resistance layer 104 having a layered structure including (i) the first oxygen-deficient tantalum oxide layer 104a having a composition TaO$_x$ (0.8≤y≤1.9) and (ii) the second oxygen-deficient tantalum oxide layer 104b having a composition TaO$_y$ (2.1≤y<2.5) exhibits the stable resistance changes in A mode in which the following resistance changes repeatedly take place: the resistance state changes into the low resistance state when positive voltage pulses are applied to the upper electrode side with reference to the lower electrode; and the resistance state changes into the high resistance state when negative voltage pulses are applied to the upper electrode side with reference to the lower electrode.

In addition, it can be inferred that the variable resistance element having such a structure does not exhibit the resistance changes in B mode which are the resistance changes of the reversed polarity. Furthermore, it is possible to infer that, with this structure too, the thickness of the second oxygen-deficient tantalum oxide layer between 1 nm and 8 nm inclusive is favorable in exhibiting the stable resistance changes in A mode.

(Variable Resistance Nonvolatile Storage Device According to Embodiment of Present Invention)

Next, the following describes, as an embodiment of the present invention, a 1T1R nonvolatile storage device for which the above-mentioned variable resistance element is used.

(1T1R Nonvolatile Storage Device Having NMOS Structure)

Figure 18:
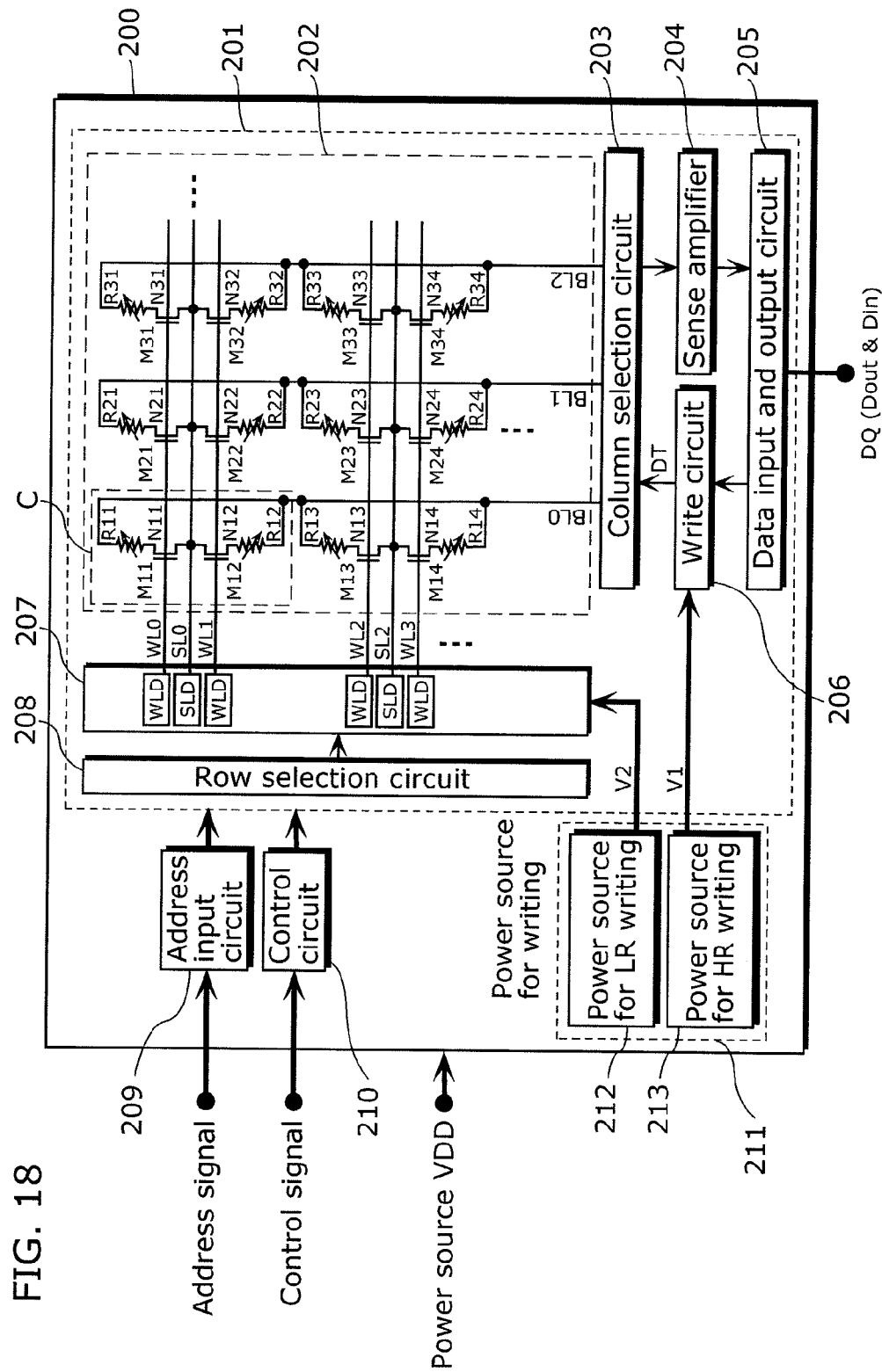
[FIG. 18]

FIG. 18 is a block diagram showing a structure of a nonvolatile storage device according to an embodiment of the present invention.

As shown in FIG. 18, a nonvolatile storage device 200 according to this embodiment includes a memory main portion 201 on a semiconductor substrate, and the memory main portion 201 includes: a memory array 202; a row selection circuit 208; a row driver 207 including word line drivers WLD and source line drivers SLD; a column selection circuit 203; a write circuit 206 for writing data; a sense amplifier 204 which detects an amount of a current flowing in a selected bit line and determines whether stored data indicates "1" or "0"; and a data input and output circuit 205 which performs an input and output process of input and output data via a terminal DQ.

The nonvolatile storage device 200 further includes, as a power source for writing 211, a power source for low resistance (LR) writing 212 and a power source for high resistance (HR) writing 213. An output V2 of the power source for low resistance (LR) writing 212 is supplied to the row driver 207, whereas an output V1 of the power source for high resistance (HR) writing 213 is supplied to the write circuit 206.

Moreover, the nonvolatile storage device 200 includes: an address input circuit 209 which receives address signals inputted from the outside; and a control circuit 210 which controls operations of the memory main portion 201 based on a control signal inputted from the outside.

The memory array 202 includes: word lines WL0, WL1, WL2 . . . ; bit lines BL0, BL1, BL2 . . . ; NMOS transistors N11, N12, N13, N21, N22, N23, N31, N32, N33 . . . (hereinafter, referred to as "transistors N11, N12 . . . "); and variable resistance elements R11, R12, R13, R21, R22, R23, R31, R32, R33 . . . (hereinafter, referred to as "variable resistance elements R11, R12 . . . "). These NMOS transistors, and variable resistance elements form memory cells M11, M12, M13, M21, M22, M23, M31, M32, M33 . . . (hereinafter, referred to as "memory cells M11, M12 . . . "). Here, the word lines and the bit lines are formed above the semiconductor substrate and arranged to intersect with each other. The NMOS transistors are provided at corresponding points where the word lines WL0, WL1, WL2 . . . and the bit lines BL0, BL1, BL2 . . . intersect with each other. The variable resistance elements are connected in series with the transistors N11, N12 . . . on a one-on-one basis. It is to be noted that each of the variable resistance elements R11, R12 . . . is the variable resistance element described above as the basic data of the present invention.

As shown in FIG. 18, the gates of the transistors N11, N21, N31 . . . are connected to the word line WL0, the gates of the transistors N12, N22, N32 . . . are connected to the word line WL1, the gates of the transistors N13, N23, N33 . . . are connected to the word line WL2, and the gates of the transistors N14, N24, N34 . . . are connected to the word line WL3.

Furthermore, the transistors N11, N21, N31 . . . and the transistors N12, N22, N32 . . . are commonly connected to the source line SL0, and the transistors N13, N23, N33 . . . and the transistors N14, N24, N34 . . . are commonly connected to the source line SL2.

Moreover, the variable resistance elements R11, R12, R13, R14 . . . are connected to the bit line BL0, the variable resistance elements R21, R22, R23, R24 . . . are connected to the bit line BL1, and the variable resistance elements R31, R32, R33, R34 . . . are connected to the bit line BL2.

The address input circuit 209 receives address signals from an external circuit (not shown), and outputs row address signals to the row selection circuit 208 and column address signals to the column selection circuit 203 based on the address signals. Here, the address signals are signals indicating an address of a specific memory cell selected from among the memory cells M11, M12 . . . .

In a data write cycle, the control circuit 210 outputs to the write circuit 206 a write command signal instructing application of a voltage for writing, according to input data Din inputted into the data input and output circuit 205. On the other hand, in a data read cycle, the control circuit 210 outputs to the sense amplifier 204 a read command signal instructing a read operation.

The row selection circuit 208 receives the row address signals outputted from the address input circuit 209, and according to the row address signals, the row driver 207 causes a word line driver WLD corresponding to one of the word lines WL0, WL1, WL2 . . . to apply a predetermined voltage to the selected word line.

Similarly, the row selection circuit 208 receives the row address signals outputted from the address input circuit 209, and according to the row address signals, the row driver 207 causes a source line driver SLD corresponding to one of the source lines SL0, SL2 . . . to apply a predetermined voltage to the selected source line.

In addition, the column selection circuit 203 receives the column address signals outputted from the address input circuit 209, selects one of the bit lines BL0, BL1, BL2 . . . according to the column address signals, and applies the voltage for writing or the voltage for reading to the selected bit line.

In the case of receiving the write command signal from the control circuit 210, the write circuit 206 outputs to the column selection circuit 203 a signal instructing an application of the voltage for writing to the selected bit line.

Moreover, in the data read cycle, the sense amplifier 204 detects an amount of a current flowing in the selected bit line to be read, and determines whether stored data indicates "1" or "0". The resulting output data DO is outputted to an external circuit via the data input and output circuit 205.

The power source for writing 211 includes the power source for low resistance (LR) writing 212 and the power source for high resistance (HR) writing 213, and the output of the power source for low resistance (LR) writing 212 and the output of the power source for high resistance (HR) writing 213 are inputted to the row driver 207 and the write circuit 206, respectively.

In the case of using the element D, which has been described as the basic data of the present invention, as the variable resistance elements R11, R12 . . . , for example, and given that a voltage at the point A of FIG. 10 is referred to as a threshold voltage for high resistance writing $V_{HR}$ and a voltage at the point B of FIG. 10 is referred to as a threshold voltage for low resistance writing $V_{LR}$, the power source for HR writing 213 serves as a power circuit capable of applying, to the variable resistance elements R11, R12 . . . , a positive voltage higher than the threshold voltage for high resistance writing $V_{HR}$, whereas the power source for LR writing 212 serves as a power circuit capable of applying, to the variable resistance elements R11, R12 . . . , a negative voltage higher than an absolute value of the threshold voltage for low resistance writing $V_{LR}$.

Figure 19:
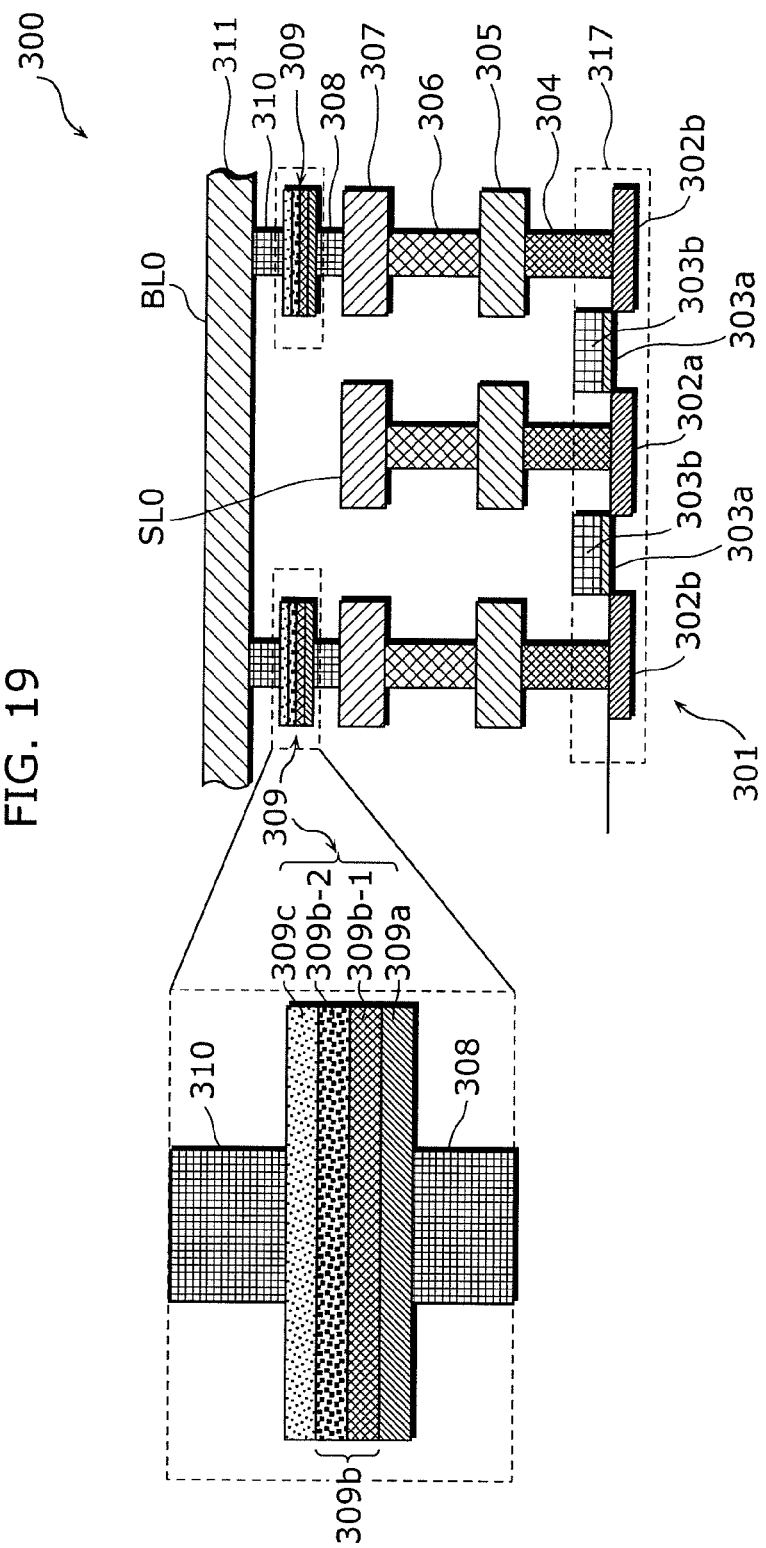
[FIG. 19]

FIG. 19 is a cross-sectional view showing a structure (two-bit structure) of memory cells 300 corresponding to the part C in FIG. 18 and an enlarged view of one of variable resistance elements 309.

Transistors 317 and the variable resistance elements 309 correspond to the transistors N11 and N12 and the variable resistance elements R11 and R12 shown in FIG. 18, respectively.

The memory cells 300 are formed by sequentially forming, above a semiconductor substrate 301, a second N-type diffusion layer region 302a, first N-type diffusion layer regions 302b, gate insulator films 303a, gate electrodes 303b, first vias 304, first wiring layers 305, second vias 306, second wiring layers 307, third vias 308, the variable resistance elements 309, fourth vias 310, and a third wiring layer 311.

The third wiring layer 311 connected to the fourth vias 310 corresponds to the bit line BL0, and the first wiring layers 305 and the second wiring layers 307 which are connected to the second N-type diffusion layer region 302a of the transistors 317 correspond to the source line SL0 extending perpendicularly to the diagram.

The voltage at the semiconductor substrate 301 is 0 V, and is supplied by a commonly-known structure via a 0-V power source line (not shown).

As shown in the enlarged view in FIG. 19, each of the variable resistance elements 309 is formed by providing, on one of the third vias 308, the variable resistance layer 309b between the lower electrode 309a and the upper electrode 309c, and the variable resistance element 309 is connected to one of the fourth vias 310 connected to the third wiring layer 311.

Here, the variable resistance layer 309b comprises an oxygen-deficient transition metal oxide and, in the present example, has a layered structure in which the following layers are stacked: a conductive, first oxygen-deficient tantalum oxide layer 309b-1 having a composition $TaO_x$ (where x=1.54); and a conductive, second oxygen-deficient tantalum oxide layer 309b-2 having a composition $TaO_y$ (where y=2.47). Here, the thickness of $TaO_x$ (where x=1.54) is 26.6 nm, and the thickness of $TaO_y$ (where y=2.47) is 2.47 nm. Further, the lower electrode 309a and the upper electrode 309c comprise the same material, which is Pt (platinum) in this example. The lower electrode 309a is connected to the second N-type diffusion layer region 302b of the transistor through the vias, whereas the upper electrode 309c is connected, through the via, to the bit line BL0 formed by the third wiring layer 311.

(Operations of Variable Resistance Nonvolatile Storage Device)

Figure 20:
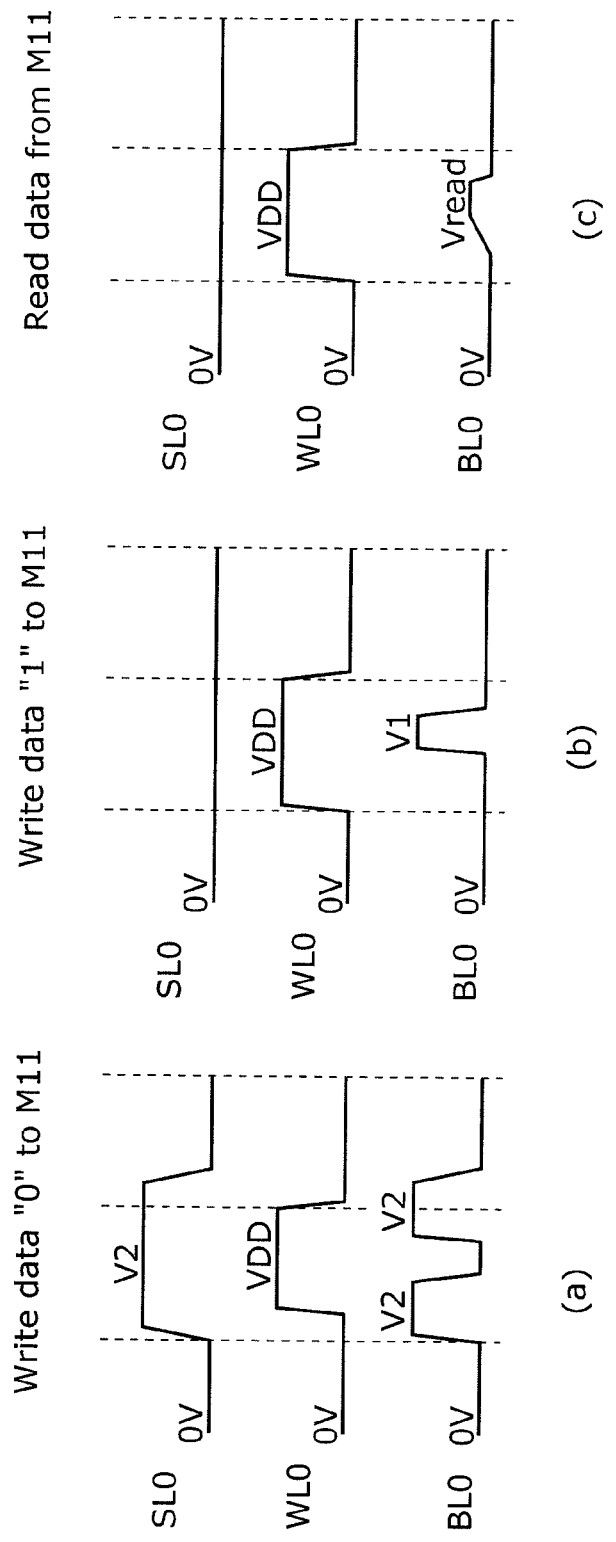
[FIG. 20]

With reference to timing charts shown in FIG. 20(a) to (c), the following describes example operations of the variable resistance nonvolatile storage device formed in the above manner, performed in a write cycle to write data and in a read cycle to read data.

FIG. 20(a) to (c) are timing charts each showing example operations of the nonvolatile storage device according to an embodiment of the present invention. It is to be noted that the example operations are shown with an assumption that data "1" corresponds to the case where the variable resistance layer is in the high resistance state and data "0" corresponds to the case where the variable resistance layer is in the low resistance state. Further, described here is only the case where data is written and read to and from the memory cell M11.

In FIG. 20(a), the voltage V2 generated by the power source for LR writing 212 is determined to have a value of a voltage which causes a voltage larger than the threshold voltage for low resistance writing $V_{LR}$ to be applied to the variable resistance elements R11, R12 . . . .

In FIG. 20(b), the voltage V1 generated by the power source for HR writing 213 is determined to have a value of a voltage which causes a voltage larger than the threshold voltage for high resistance writing $V_{HR}$ to be applied to the variable resistance elements R11, R12 . . . .

The method for determining V1 and V2 is described later.

In FIG. 20(c), Vread refers to a voltage for reading, which is generated by the sense amplifier 204 and has a value of a voltage which causes a voltage equal to or less than the threshold voltage for high resistance writing $V_{HR}$ to be applied to the variable resistance elements R11, R12 . . . .

Furthermore, in FIG. 20(a) to (c), VDD corresponds to a power voltage supplied to the nonvolatile storage device 200.

In the write cycle in which the data "0" is written into the memory cell M11 as shown in FIG. 20(a), firstly, the selected bit line BL0 and the selected source line SL0 are set to the voltage V2. Next, the selected word line WL0 is set to the voltage VDD to turn on the NMOS transistor N11 of the selected memory cell M11. Current does not flow at this stage because the voltage V2 is applied to both the second N-type diffusion layer region 302a and the first N-type diffusion layer region 302b of the transistor 317.

Then, the selected bit line BL0 is set to the voltage 0 V for a predetermined period, and after the predetermined period, a pulse waveform corresponding to the voltage V2 is applied again to the bit line BL0. At this stage, in the variable resistance element 309, a negative voltage having an absolute value larger than the threshold voltage for low resistance writing $V_{LR}$ is applied to the upper electrode 309c with reference to the lower electrode 309a, so that a writing is performed to change from a high resistance value to a low resistance value. Then, the word line WL0 is set to the voltage 0 V to turn off the transistor 317, thereby completing the writing of the data "0".

In the write cycle in which the data "1" is written into the memory cell M11 as shown in FIG. 20(b), firstly, the selected bit line BL0 and the selected source line SL0 are set to the voltage 0 V. Next, the selected word line WL0 is set to the voltage VDD to turn on the NMOS transistor N11 of the selected memory cell M11.

Then, the selected bit line BL0 is set to the voltage V1 for a predetermined period, and after the predetermined period, a pulse waveform corresponding to the voltage 0 V is applied again to the bit line BL0. At this stage, in the variable resistance element 309, a positive voltage higher than the threshold voltage for high resistance writing $V_{HR}$ is applied to the upper electrode 309c with reference to the lower electrode 309a, so that a writing is performed to change from a low resistance value to a high resistance value. Then, the word line WL0 is set to the voltage 0 V, thereby completing the writing of the data "1".

In the read cycle in which data is read from the memory cell M11 as shown in FIG. 20(c), firstly, the selected bit line BL0 and the selected source line SL0 are first set to the voltage 0 V. Next, the selected word line WL0 is set to the voltage VDD to turn on the NMOS transistor N11 of the selected memory cell M11.

Then, the selected bit line BL0 is set to the read voltage Vread for a predetermined period, and the sense amplifier 204 detects the value of the current flowing in the selected memory cell M11 to determine whether the stored data is the data "0" or the data "1". Then, the word line WL0 is set to the voltage 0 V, thereby completing the data reading operation.
(Characteristics of 1T1R Memory Cells)

The following describes the 1T1R memory cells M11, M12 . . . according to an embodiment, and especially describes the structures of the NMOS transistors N11, N12 . . . .

According to the present embodiment, as shown in the enlarged view in FIG. 19, the variable resistance layer 309 has a structure which includes, on the upper electrode 309c side, the conductive, second oxygen-deficient tantalum oxide layer 309b-2 having a composition $TaO_y$ (where y=2.47) and a higher oxygen content percentage. Application of a positive voltage to the upper electrode 309c with reference to the lower electrode 309a appears to cause a progress in the oxidation phenomenon near the interface between the upper electrode 309c and the second oxygen-deficient tantalum oxide layer 309b-2 and thus the resistance state changes into the high resistance state, whereas application of a voltage in the opposite direction appears to cause a progress in a redox phenomenon and thus the resistance state changes into the low resistance state. This means that it is possible to fix, to one pattern, the resistance change state with respect to the voltage application direction.

Figure 21:
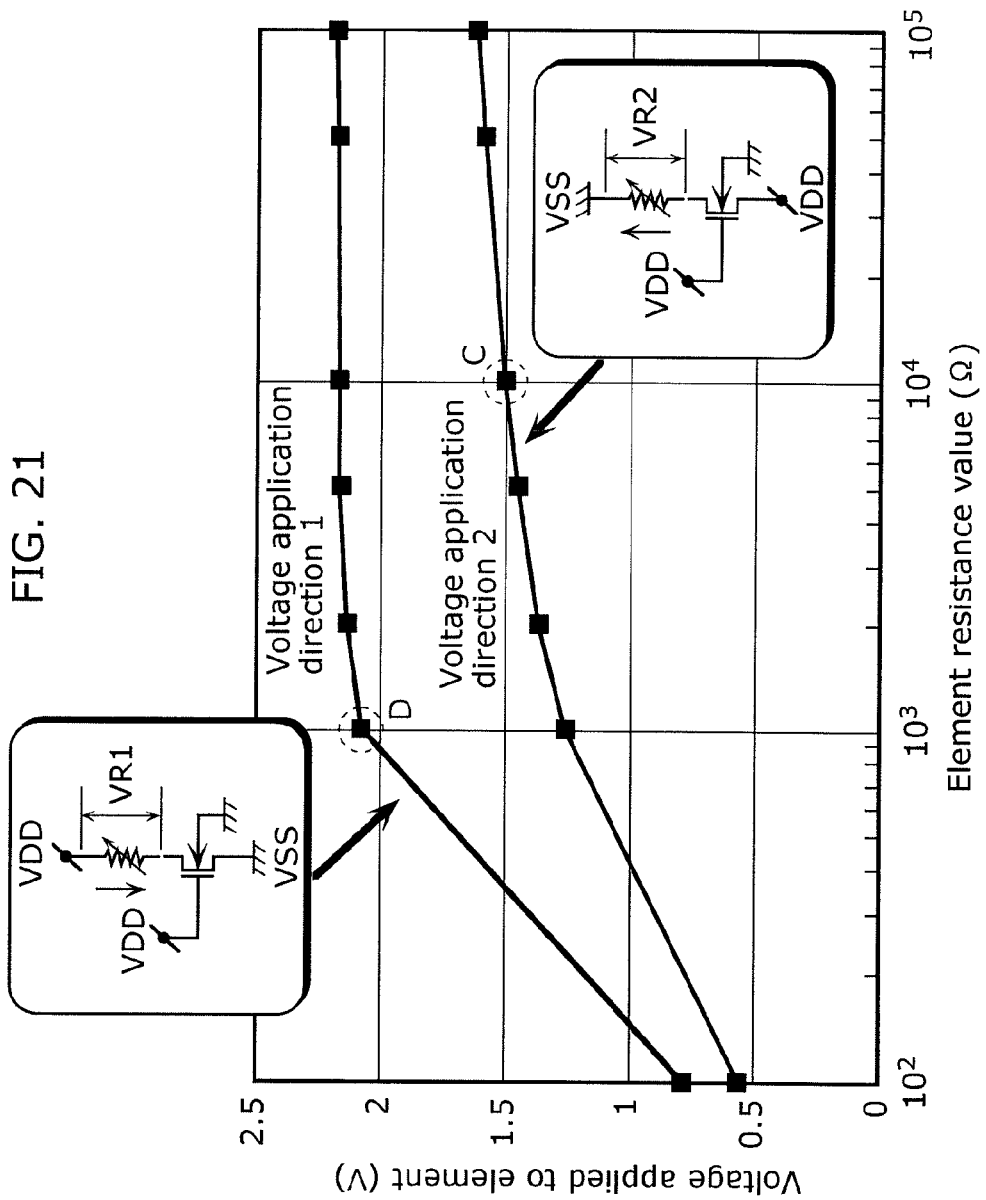
[FIG. 21]

FIG. 21 shows a relationship between a voltage applied to a variable resistance element and the resistance value of the variable resistance element when 2.2 V is applied to both ends of a memory cell.

A voltage application direction 1 shows the characteristics observed when a predetermined positive voltage is applied to the bit lines BL0, BL1 . . . and 0 V is applied to the source lines SL0, SL1 . . . in FIG. 18; that is, the characteristics observed when a positive voltage is applied to the upper electrode 309c with reference to the lower electrode 309a.

In addition, a voltage application direction 2 shows the characteristics observed when 0 V is applied to the bit lines BL0, BL1 . . . and a predetermined positive voltage is applied to the source lines SL0, SL1 . . . in FIG. 18; that is, the characteristics observed when a negative voltage is applied to the upper electrode 309c with reference to the lower electrode 309a.

For example, when the element resistance value is 1000Ω, the voltage application direction 1 indicates that approximately 2.1 V can be applied to the variable resistance element and that a current of 2.1 mA can be driven (2.1 V/1000Ω). In the case of the voltage application direction 2, it indicates that approximately 1.25 V can be applied to the variable resistance element and that a current of 1.25 mA can be driven (1.25 V/1000Ω).

This shows that in the voltage application direction 1 in which the influence of the substrate bias effect in the NMOS transistor is small, a current 1.7 times larger than in the case of the voltage application direction 2 can be driven.

Further, the value of the voltage V2 generated by the power source for LR writing 212 shown in FIG. 20(a) can be determined using the characteristics of the voltage application direction 2.

For instance, when the resistance value of the variable resistance element 309 is 10 kΩ in the high resistance state, it is clear that with application of 2.2 V to the both ends of the memory cell, a voltage up to approximately 1.5 V can be applied to the variable resistance element 309 (point C in FIG. 21). The current value at this time is 0.15 mA (1.5 V/10 kΩ).

When the threshold voltage for low resistance writing $V_{LR}$, which is applied for the resistance change to low resistance state of the variable resistance element 309, is −1.1 V (point B in FIG. 10), for example, a voltage larger than the threshold voltage for low resistance writing $V_{LR}$ can be applied to the variable resistance element 309 given that the voltage V2 is set to 2.2 V and there is a current drive capability of 0.15 mA or greater in the power source for LR writing 212.

Likewise, the value of the voltage V1 generated by the power source for HR writing 213 shown in FIG. 20(b) can be determined using the characteristics of the voltage application direction 1.

For instance, when the resistance value of the variable resistance element 309 is 1000Ω in the low resistance state, it is clear that with application of 2.2 V to the both ends of the memory cell, a voltage up to approximately 2.1 V can be applied to the variable resistance element 309 (point D in FIG. 21). The current value at this time is 2.1 mA (2.1 V/1000Ω).

When the threshold voltage for high resistance writing $V_{HR}$, which is applied for the resistance change to high resistance state of the variable resistance element 309, is 1.2 V (point A in FIG. 10), for example, the voltage V1 is set to 2.2 V by the power source for HR writing 213, and when there is a current drive capability of 2.1 mA or greater, a voltage larger than the threshold voltage for high resistance writing $V_{HR}$ can be applied to the variable resistance element 309. More preferably, the voltage V1 may be determined to be a lower voltage (for instance, 1.8 V) with a voltage value having a margin above a certain level.

It is also possible, at the designing stage, to determine an approximate voltage using the above-mentioned method, and at the product inspection stage, to also use a commonly-known conventional method of making, while checking the operation, fine adjustments so as to determine optimum voltages of the voltages V1 and V2 at which changes in the resistance occur stably.

As described above, the variable resistance nonvolatile storage device of the present embodiment includes the variable resistance element in which: the second oxygen-deficient tantalum oxide layer having a higher oxygen content percentage is provided on the upper electrode side; and the first oxygen-deficient tantalum oxide layer having a lower oxygen content percentage is provided on the lower electrode side. Thus, the voltage application direction (driving polarity) which stably causes a resistance change in one direction (resistance change to low resistance state or resistance change to high resistance state) is uniquely determined for each of the memory cells.

Further, the memory cell is formed by connecting the lower electrode and one of the N-type diffusion layer regions of the NMOS transistor. Therefore, voltage application for the resistance change from the low resistance to the high resistance, which requires a larger current, can be reliably performed in the voltage application direction 1, thereby eliminating the need of taking into account the case of the voltage application direction 2. As a result, the memory cell can be designed with an optimum transistor size.

This means that especially the voltage V1 of the power source for HR writing can be further reduced when there is a margin in the current drive capability, thereby leading to reduction in voltage and reduction in power consumption.

In addition, because the driving polarity is uniquely determined, there is no need to manage information identifying the modes of the resistance change characteristics, thereby allowing for a simple and inexpensive circuit configuration.
(Other Structural Examples of 1T1R Memory Cell)

FIG. 22(a) to (f) are circuit diagrams each showing a circuit configuration of a 1T1R memory cell used for a commonly-known variable resistance element, including the 1T1R memory cell described in the embodiment.

Figure 22:
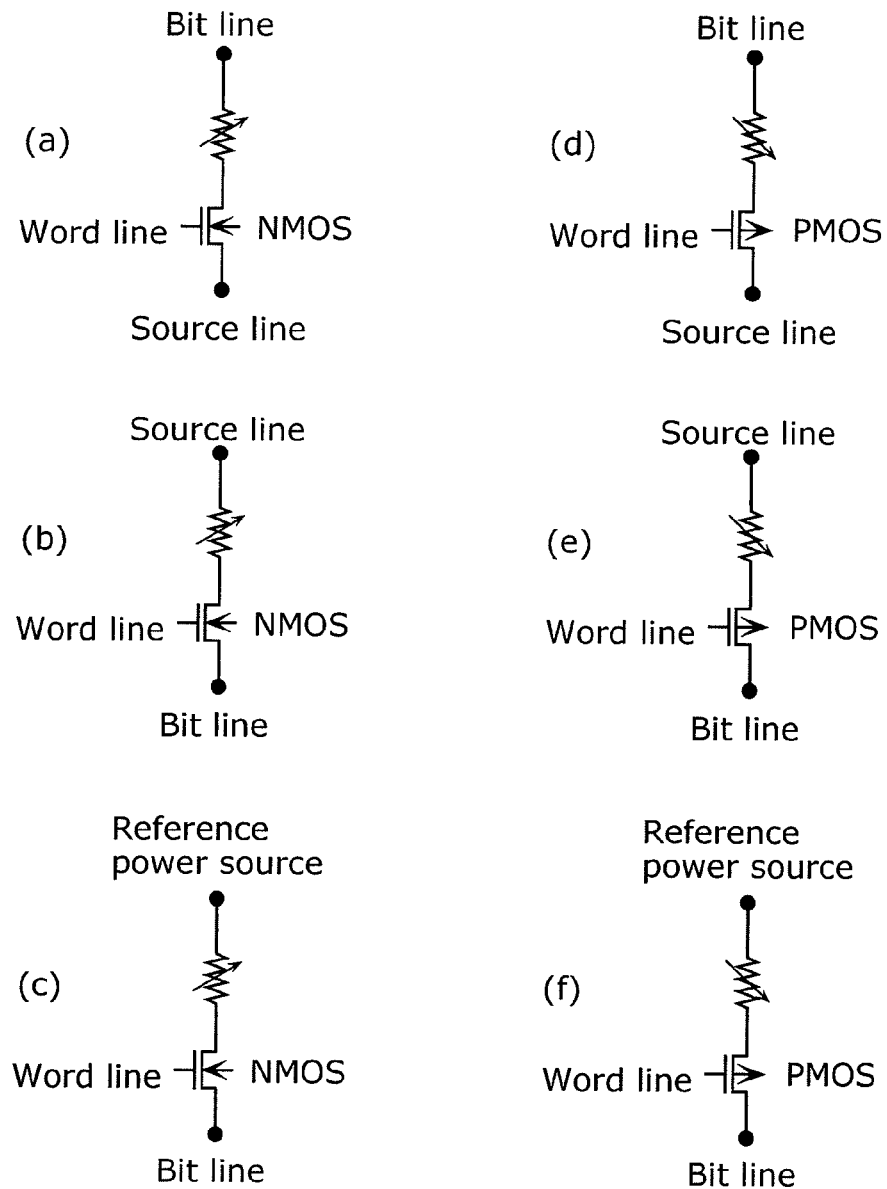
[FIG. 22]

FIG. 22(a) shows a configuration in which the NMOS transistor described in the embodiment is used.

FIG. 22(b) shows a configuration which differs from the configuration shown in FIG. 22(a) in that the bit line and the source line are interchanged.

FIG. 22(c) shows a configuration which differs from the configuration shown in FIG. 22(b) in that the source line is connected to a reference power source which supplies a fixed reference voltage. In this case, the writing state is controlled by raising or lowering the bit line voltage with reference to the reference voltage.

FIG. 22(d) shows a configuration which differs from the configuration shown in FIG. 22(a) in that a PMOS transistor is used instead of an NMOS transistor. In this case, a high electrical potential such as the power supply voltage VDD is supplied as the substrate voltage for the PMOS transistor. In addition, although FIG. 22(d) differs from FIG. 22(a) in that the memory cell is selected by setting the word line to a low level, other control methods are the same as in the configuration shown in FIG. 22(a) in which the NMOS transistor is used.

FIG. 22(e) shows a configuration which differs from the configuration shown in FIG. 22(d) in that the bit line and the source line are interchanged.

FIG. 22(f) shows a configuration which differs from the configuration shown in FIG. 22(e) in that the source line is connected to a reference power source which supplies a fixed reference voltage. In this case, the writing state is controlled by raising or lowering the bit line voltage with reference to the reference voltage.

FIG. 23(a) to (f) are diagrams each showing how a variable resistance element and a transistor according to the present invention are connected for realizing the circuits shown in FIG. 22(a) to (f).

Here, a variable resistance layer 309e comprises an oxygen-deficient tantalum oxide as is the variable resistance layer 309b, and has a structure in which: a second oxygen-deficient tantalum oxide layer 309e-2 having a higher oxygen content percentage is provided in contact with the lower electrode; and a first oxygen-deficient tantalum oxide layer 309e-1 having a lower oxygen content percentage is provided in contact with the upper electrode.

The description of FIG. 23(a) is omitted since the configuration shown therein is identical to the configuration shown in FIG. 19.

FIG. 23(b) shows a configuration which differs from the configuration shown in FIG. 23(a) in that the bit line and the source line are interchanged. In the configuration of FIG. 23(b), the second oxygen-deficient tantalum oxide layer 309b-2 having a higher oxygen content percentage is provided in contact with the upper electrode, and the first oxygen-deficient tantalum oxide layer 309b-1 having a lower oxygen content percentage is provided in contact with the lower electrode. The upper electrode 309c that is in contact with the interface which easily causes a resistance change (that is, the second oxygen-deficient tantalum oxide layer 309b-2) is connected to the source line, whereas the lower electrode 309a that is in contact with the interface which does not easily cause a resistance change (that is, the first oxygen-deficient tantalum oxide layer 309b-1) is connected to the bit line via an NMOS transistor.

In this case, as in the case of FIG. 23(a), the source line and the word line are wired in the same direction, and the bit line is wired vertically to the source line and the word line.

In the configuration shown in FIG. 23(c), the upper electrode 309c that is in contact with the interface which easily causes a resistance change is connected to a reference power source, whereas the lower electrode 309a that is in contact with the interface which does not easily cause a resistance change is connected to the bit line via an NMOS transistor.

Unlike FIG. 23(a), FIG. 23(d) shows a configuration in which: the second oxygen-deficient tantalum oxide layer 309e-2 having a higher oxygen content percentage is provided on the lower electrode side; and the first oxygen-deficient tantalum oxide layer 309e-1 having a lower oxygen content percentage is provided on the upper electrode side. An upper electrode 309f that is in contact with the interface which does not easily cause a resistance change (that is, the first oxygen-deficient tantalum oxide layer 309e-1) is connected to the bit line, whereas a lower electrode 309d that is in contact with the interface which easily causes a resistance change (that is, the second oxygen-deficient tantalum oxide layer 309e-2) is connected the source line via a PMOS transistor. In this case, as in FIG. 23(a), the source line and the word line are wired in the same direction, and the bit line is wired vertically to the source line and the word line.

FIG. 23(e) shows a configuration which differs from the configuration shown in FIG. 23(d) in that the bit line and the source line are interchanged, and that the upper electrode 309f that is in contact with the interface which does not easily cause a resistance change is connected to the source line, whereas the lower electrode 309d that is in contact with the interface which easily causes a resistance change is connected to the bit line via a PMOS transistor.

In this case, as in FIG. 23(d), the source line and the word line are wired in the same direction, and the bit line is wired vertically to the source line and the word line.

FIG. 23(f) shows a configuration in which the upper electrode 309f that is in contact with the interface which does not easily cause a resistance change is connected to a reference power source, whereas the lower electrode 309d that is in contact with the interface which easily causes a resistance change is connected to the bit line via a PMOS transistor.

Figure 23:
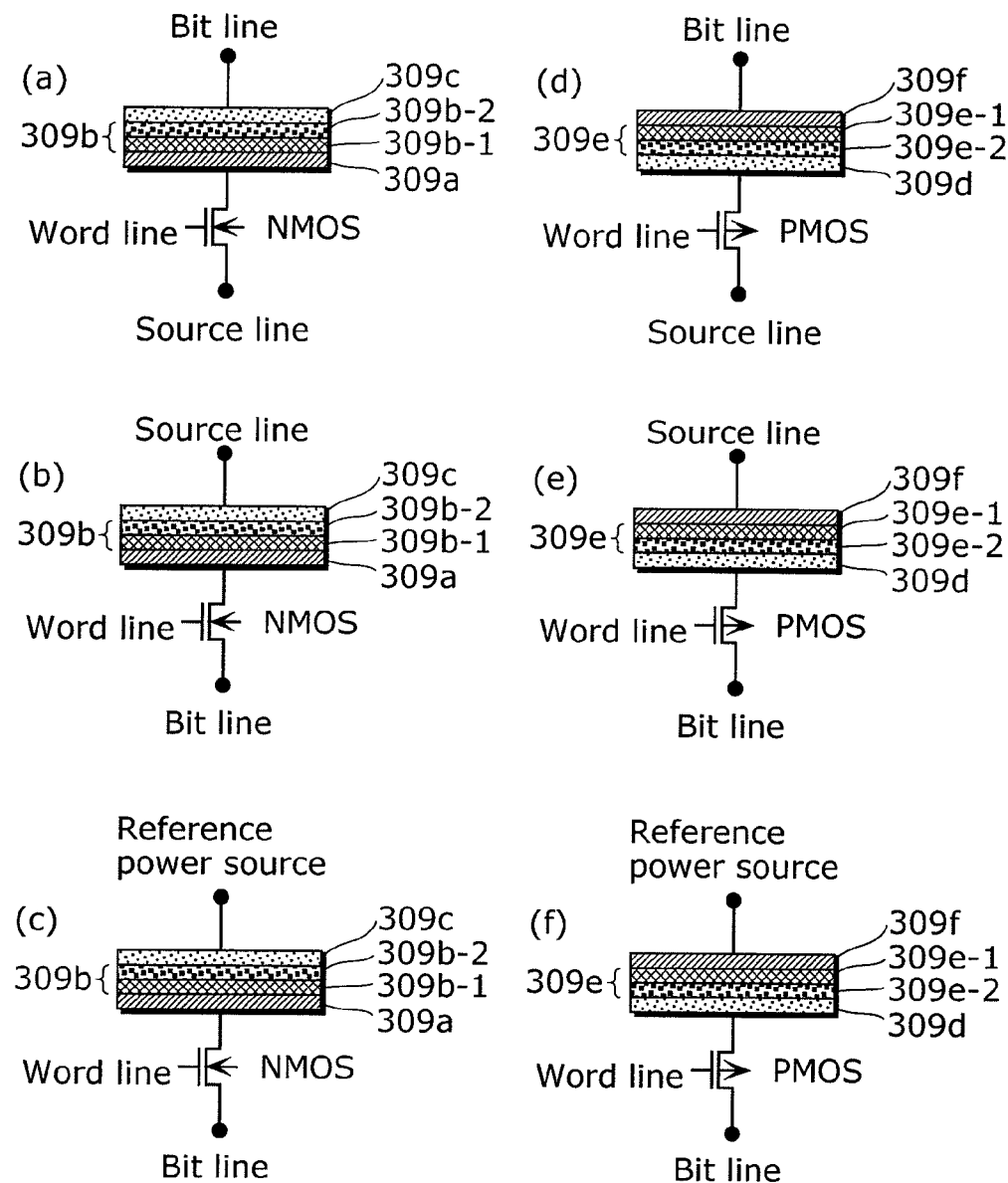
[FIG. 23]
Figure 24:
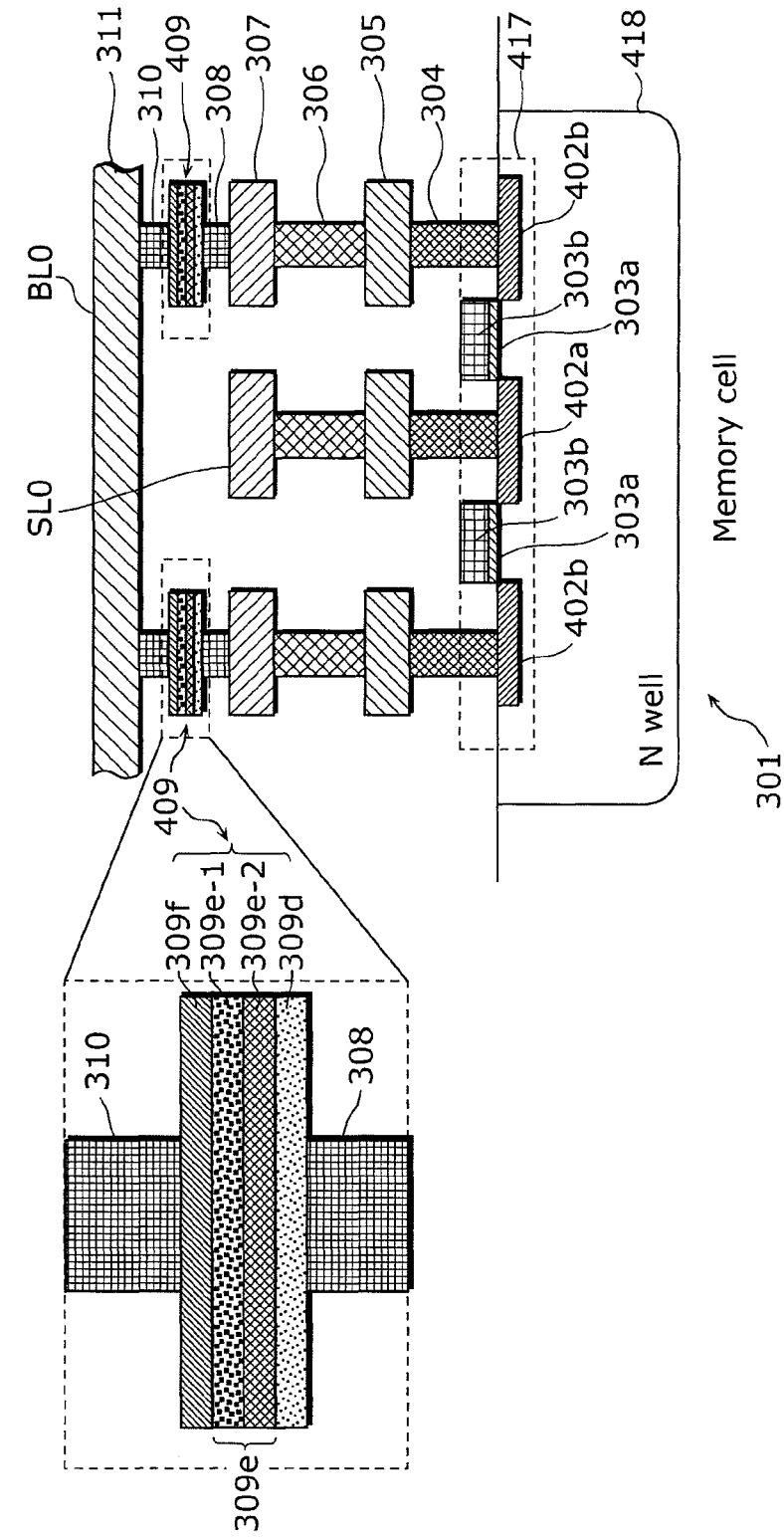
[FIG. 24]

FIG. 24 is a cross-sectional view corresponding to the part C (two bits) shown in FIG. 18 and an enlarged view of one of variable resistance elements 409 in the case where 1T1R memory cells 400 according to the configuration shown in FIG. 23(d) which include PMOS transistors are used in a nonvolatile storage device. It is to be noted that the same numeral references are given to the structural elements common to the memory cells 300 shown in FIG. 19 and descriptions thereof will not be repeated.

The memory cells 400 are formed by sequentially forming, above a semiconductor substrate 301, an N well 418, a second P-type diffusion layer region 402a, first P-type diffusion layer regions 402b, gate insulator films 303a, gate electrodes 303b, first vias 304, first wiring layers 305, second vias 306, second wiring layers 307, third vias 308, the variable resistance elements 409, fourth vias 310, and a third wiring layer 311.

The third wiring layer 311 connected to the fourth vias 310 corresponds to the bit line BL0, and the first wiring layers 305 and the second wiring layers 307 which are connected to the second P-type diffusion layer region 402a of transistors 417 correspond to the source line SL0 extending perpendicularly to the diagram. The N well is supplied with a power supply voltage VDD of a nonvolatile storage device 200 through a commonly-known structure via a VDD power source line (not shown).

As shown in the enlarged view in FIG. 24, each of the variable resistance elements 409 is formed by providing, on the third via 308, the variable resistance layer 309e between the lower electrode 309d and the upper electrode 309f, and each variable resistance element 409 is connected to one of the fourth vias 310 connected to the third wiring layer 311.

Here, unlike in the case of the 1T1R memory cell (FIG. 23(a) to (c)) including the NMOS transistor, the 1T1R memory cell (FIG. 23(d) to (f)) including the PMOS transistor has a structure in which: the second oxygen-deficient tantalum oxide layer 309e-2 which easily causes a resistance change and has a higher oxygen content percentage is provided on the side of the lower electrode 309d which is connected to one of the first P-type diffusion layer regions 402b of the transistors 417; and the first oxygen-deficient tantalum oxide layer 309e-1 which does not easily cause a resistance change and has a lower oxygen content percentage is provided on the upper electrode 309f side.

The driving direction of the transistors 417 in which the influence of the substrate bias effect is small and the current drive capability is large is the direction in which the second P-type diffusion layer region 402a serves as a source and a voltage at the second P-type diffusion layer region 402a approaches the voltage (VDD) at the N well 418 serving as the substrate voltage for the PMOS transistor; that is, it is the direction in which the lower electrode 309d is set to a high level and the upper electrode 309f is set to a low level.

In order to match the resistance change direction from the low resistance state to the high resistance state, which requires a larger current, with the above-mentioned voltage application direction, the second oxygen-deficient tantalum oxide layer 309e-2 having a higher oxygen content percentage is provided on the lower electrode 309d side, and the first oxygen-deficient tantalum oxide layer 309e-1 having a lower oxygen content percentage is provided on the upper electrode 309f side. When a positive voltage is applied to the lower electrode 309d with reference to the upper electrode 309f, the oxidation phenomenon progresses near the interface of the lower electrode 309d, thereby causing a change into the high resistance state.

Although the NMOS transistor is often used in the 1T1R memory cell in general, there could be cases where the PMOS transistor is used in the memory cell, including the following cases:

For instance, there is a case where in a selected memory cell, only a threshold voltage of a transistor of the memory cell is set low in order to obtain a larger current for driving the transistor. In this case, there is an increase in leak current to non-selected memory cells connected to a bit line to which the selected memory cell belongs. This will probably result in deterioration in the read characteristics.

As a method for avoiding the increase in the leak current while maintaining the driving current of the selected memory cell, there is a method of electrically dividing a region of the semiconductor substrate 301 into some blocks and adjusting substrate voltage of the blocks so as to increase the threshold voltage of transistors in blocks other than a block to which the selected memory cell belongs, thereby reducing the leak current.

Generally, many CMOS semiconductor devices use a P-type silicon semiconductor for the semiconductor substrate 301. Thus, to implement such a structure, in the case of forming the transistor of the memory cell with an NMOS transistor, it is necessary to adopt a well structure known as a triple-well structure, for instance, and to electrically divide the substrate region into some blocks. In such a case, a new manufacturing step needs to be added, which leads to an increase in cost.

On the other hand, in the case of forming the transistor of the memory cell with a PMOS transistor, it is only necessary to design the layout of the N well 418 in a desired unit and electrically divide the N well 418 into some blocks. Thus, there seems to be an advantage that the N well 418 can be divided into the blocks without an additional manufacturing step.

The cross-sectional views shown in FIGS. 19 and 24 correspond to FIGS. 23(a) and 23(d), respectively.

The cross-sectional views corresponding to FIGS. 23(b) and 23(c) showing the configurations using the NMOS transistor are the same as the cross-sectional view in FIG. 19 except for the wiring layer to which the source line, the bit line, and the reference power source are connected. Thus, the descriptions of the cross-sectional views corresponding to FIGS. 23(b) and 23(c) are omitted.

Further, the cross-sectional views corresponding to FIGS. 23(e) and 23(f) showing the configurations using the PMOS transistor are the same as the cross-sectional view in FIG. 24 except for the wiring layer to which the source line, the bit line, and the reference power source are connected. Thus, the descriptions of the cross-sectional views corresponding to FIGS. 23(e) and 23(f) are omitted.

Table 3 shows, for each of the memory cell structures corresponding to FIG. 23(a) to (f), a method for controlling the bit line and the source line in the case where low resistance writing is performed on the resistance element and in the case where high resistance writing is performed on the resistance element.

TABLE 3

| Memory Cell Type | Corresponding Diagram | High Resistance Writing | | Low Resistance Writing | |
| --- | --- | --- | --- | --- | --- |
| | | Bit Line | Source Line | Bit Line | Source Line |
| a | FIG. 23 (a) | H | L | L | H |
| b | FIG. 23 (b) | L | H | H | L |
| c | FIG. 23 (c) | L | | H | |
| d | FIG. 23 (d) | L | H | H | L |
| e | FIG. 23 (e) | H | L | L | H |
| f | FIG. 23 (f) | H | | L | |

For each memory cell, the voltage application direction (driving polarity) which stably causes a resistance change in one direction (resistance change to low resistance state or resistance change to high resistance state) is uniquely determined based on Table 3. Thus, there is no need to manage the information identifying the modes of the resistance change characteristics, thereby allowing for a simple circuit configuration.

It is to be noted that although Pt is used as the electrode material in the present embodiment, Ir, Pd, Ag or Cu may be used instead.

Although the present embodiment has shown the example of the variable resistance element in which the tantalum oxide is used as the variable resistance layer, the material of the variable resistance layer is not limited to the tantalum oxide. To manufacture an element having the same structure as in the present embodiment, it is possible to use any material as long as it stably shows the resistance change characteristics in A mode or B mode.

The inventors of the present application have acquired from an experiment basic data which allows inference that the resistance change characteristics in A mode or B mode stably occur in, for example, a variable resistance element in which a hafnium oxide is used as the variable resistance layer and in a variable resistance element in which a zirconium oxide is used as the variable resistance layer.

The following describes that experiment.

(Variable Resistance Element Using Oxygen-Deficient Hafnium Oxide as Variable Resistance Layer)

The following describes the fifth experiment regarding a variable resistance nonvolatile storage element which uses an oxygen-deficient hafnium oxide as the variable resistance layer.

(Structure of Variable Resistance Element)

Figure 25:
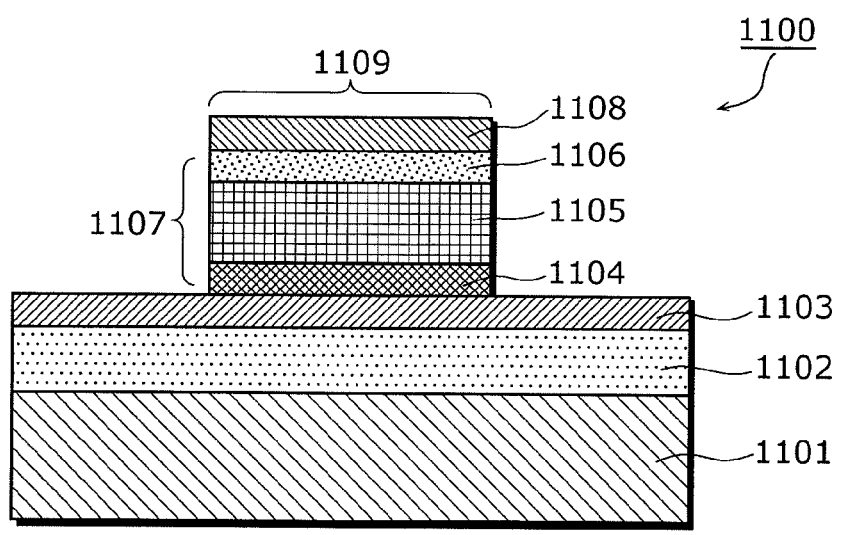
[FIG. 25]

FIG. 25 is a cross-sectional view showing a structural example of the variable resistance element used in the fifth experiment.

As shown in FIG. 25, a variable resistance element 1100 used in the fifth experiment includes: a substrate 1101; an oxide layer 1102 formed on the substrate 1101; a lower electrode 1103 formed on the oxide layer 1102; an upper electrode 1108; and a variable resistance layer 1107 located between the lower electrode 1103 and the upper electrode 1108.

Here, the variable resistance layer 1107 includes: a second hafnium containing layer (hereinafter referred to as "second hafnium oxide layer") 1105 having a low oxygen content percentage; a first hafnium containing layer (hereinafter referred to as "first hafnium oxide layer") 1104 formed under the second hafnium oxide layer 1105 and having an oxygen content percentage higher that that of the second hafnium oxide layer 1105; and a third hafnium containing layer (hereinafter referred to as "third hafnium oxide layer") 1106 formed on the second hafnium oxide layer 1105 and having an oxygen content percentage higher that that of the second hafnium oxide layer 1105.

The materials of the lower electrode 1103 and the upper electrode 1108 are, for example, Pt (platinum), Ir (iridium), Pd is (palladium), Ag (silver), Ni (nickel), W (tungsten), Cu (copper), Al (aluminum), Ta (tantalum), Ti (titanium), TiN (titanium nitride), TaN (tantalum nitride), and TiAlN (titanium aluminum nitride).

Although the substrate 1101 may be a single-crystal silicon substrate or a semiconductor substrate, it is not limited to these substrates. The variable resistance layer 1107 can be formed at a relatively low substrate temperature and thus can be formed on a resin material and the like.

(Manufacturing Method of Variable Resistance Element)

Next, a manufacturing method of the variable resistance element 1100 used in the fifth experiment is described with reference to FIG. 25.

First, as shown in FIG. 25, thermal oxidation produces the oxide layer 1102 having a thickness of 200 nm on the substrate 1101 which is a single-crystal silicon. Then, by sputtering, a Pt thin film having a thickness of 100 nm is deposited on the oxide layer 1102 as the lower electrode 1103. After that, the second hafnium oxide layer 1105 is formed on the lower electrode 1103 by reactive-sputtering a hafnium target in an atmosphere of an Ar gas and an $O_2$ gas.

The first hafnium oxide layer 1104 whose oxygen content percentage is higher than that of the second hafnium oxide layer 1105 is formed by exposure of the surface of the lower electrode 1103 to the air at the time of forming the second hafnium oxide layer 1105. Further, after forming the second hafnium oxide layer 1105, the third hafnium oxide layer 1106 whose oxygen content percentage is higher than that of the second hafnium oxide layer 1105 is formed by exposure to plasma of the Ar gas and the $O_2$ gas used in the sputtering.

This layered structure in which the first hafnium oxide layer 1104, the second hafnium oxide layer 1105, and the third hafnium oxide layer 1106 are stacked is the structure of the variable resistance layer 1107.

Subsequently, by sputtering, a Pt thin film having a thickness of 150 nm is deposited on the third hafnium oxide layer 1106 as the upper electrode 1108.

Lastly, photolithography processing and dry etching create an element region 1109. The element region 1109 has a circular shape with a diameter of 3 μm.

With the above-described manufacturing method, plural variable resistance elements were manufactured under different manufacturing conditions. The following describes the details.

(Composition of Hafnium Oxide Layer)

First, the following describes the conditions under which the oxygen-deficient hafnium oxide layer of the fifth experiment was manufactured and an analysis of the oxygen content percentage in the fifth experiment. The oxygen-deficient hafnium oxide layer was manufactured by reactive sputtering, that is, a process of sputtering the hafnium target in an atmosphere of an Ar (argon) gas and an $O_2$ gas.

First, a substrate was placed in a sputtering apparatus and then the sputtering apparatus was vacuumed to about $3 \times 10^{-5}$ Pa. Then, sputtering was performed with hafnium used as the target, power set to 300 W, the total gas pressure of the argon gas and the oxygen gas set to 0.9 Pa, and the preset temperature of the substrate set to 30° C. In this experiment, five types of hafnium oxide layers were formed with the flow ratio of the $O_2$ gas to the Ar gas varied from 2% to 4%.

First, with an object of this experiment being an examination of the composition, $SiO_2$ deposited 200 nm in thickness on Si was used as the substrate, and the sputtering time was adjusted to make the thickness of the five types of the hafnium oxide layers about 50 nm.

Figure 26:
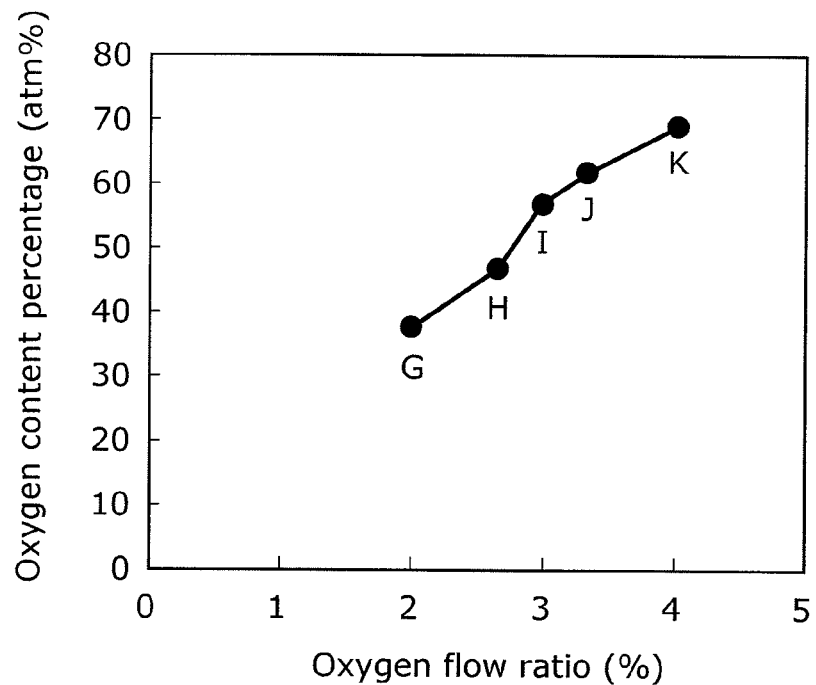
[FIG. 26]

FIG. 26 shows a result of analyzing, using the Rutherford backscattering spectrometry (RBS), the compositions of the hafnium oxide layers manufactured in the above manner. In FIG. 26, the points G, H, I, J, and K respectively show the compositions of the hafnium oxide layers of samples G, H, I, J, and K manufactured at five different $O_2$ gas flow ratios. FIG. 26 shows that the oxygen content percentage of the hafnium oxide layer changes from approximately 37.7 at % ($HfO_{0.6}$) to approximately 69.4 at % ($HfO_{2.3}$) when the oxygen flow ratio is changed from 2% to 4%.

Although this experiment used the Rutherford backscattering spectrometry (RBS) for analyzing the hafnium oxide layers, other instrumental analysis techniques can also be used, including Auger electron spectroscopy (AES), fluorescent X-ray photoelectron spectroscopy analysis (XPS), and electron probe microanalysis (EPMA).

The above result made it clear that: the oxygen content percentage of the hafnium oxide layer can be controlled using the oxygen flow ratio; and a hafnium oxide layer (sample K) which seems to excessively contain oxygen was formed as well as oxygen-deficient hafnium oxide layers (samples G to J) which have an oxygen content percentage lower than 66.7 at %, which is the oxygen content percentage of $HfO_2$ that is a stoichiometric oxide of hafnium.

(Oxygen Content Percentage and Resistance Change Characteristics of Hafnium Oxide Layer)

Fives types of variable resistance elements were manufactured by depositing a hafnium oxide as the variable resistance layer 1107 under the same conditions as for the samples G to K, and then forming the upper electrode 1108 on the variable resistance layer 1107. The thickness of all the variable resistance layers 1107 was set to 30 nm. These elements are referred to as elements G, H, I, J, and K.

The resistance change characteristics of the nonvolatile storage elements manufactured in the above manner were measured.

First, the resistance change characteristics observed upon application of electrical pulses to the element I (the oxygen flow ratio of about 3.0% and the oxygen content percentage of the hafnium oxide layer of about 56.8 at %) were closely examined.

FIGS. 27(a) and (b) each show how the resistance of the element I changes upon repeated application of electrical pulses. In FIGS. 27(a) and (b), the horizontal axis represents the number of electrical pulses applied between the lower electrode 1103 and the upper electrode 1108, and the vertical axis represents the resistance value.

First, FIG. 27(a) shows a result of measuring the resistance value upon applying, between the upper electrode 1108 and the lower electrode 1103, such electrical pulses that voltages at the upper electrode 1108 are +1.5 V and −1.2 V alternately with reference to the lower electrode 1103, with the pulse width of 100 nsec. In this case, the application of the electrical pulses of the voltage +1.5 V changed the resistance value to be between 500 and 700Ω, whereas the application of the electrical pulses of the voltage −1.2 V changed the resistance value to be about 140Ω. In other words, the element I exhibited the resistance changes in B mode in which the resistance change to high resistance state is performed upon application of electrical pulses of a higher voltage to the upper electrode 1108 than to the lower electrode 1103.

Although the details are omitted, an additional experiment showed a result indicating that the resistance changes in B mode occur near the upper electrode 1108.

Next, FIG. 27(b) shows a result of measuring the resistance value when the applied voltages are changed such that a larger negative voltage is applied. In this case, electrical pulses having voltages of −1.5 V and +1.2 V were applied alternately to the upper electrode 1108 with reference to the lower electrode 1103. The application of the electrical pulses of the voltage −1.5 V caused the resistance change to high resistance state with the resistance value between 900 and 1200Ω, whereas the application of the electrical pulses of the voltage +1.2 V caused the resistance change to low resistance state with the resistance value of about 150Ω. In other words, the element I exhibited the resistance changes in A mode in which the resistance change to low resistance state is performed upon application of electrical pulses of a higher voltage to the upper electrode 1108 than to the lower electrode 1103.

Although the details are omitted, an additional experiment showed a result indicating that the resistance changes in A mode occur near the lower electrode 1103.

Further, an experiment was conducted with the other elements in the same manner as the element I, so as to find out with what percentage of oxygen content in an oxygen-deficient hafnium oxide used for the variable resistance layer, the elements exhibit resistance changes.

The result of the experiment showed that aside from the element I, the element H (the oxygen flow ratio of about 2.7% and the oxygen content percentage of the hafnium oxide layer of about 46.6 at %) and the element J (the oxygen flow ratio of about 3.3% and the oxygen content percentage of the hafnium oxide layer of about 62 at %) exhibit favorable resistance changes in which the high resistance value is equal to or greater than four times the low resistance value.

From the above findings, it can be said that the bipolar variable resistance element exhibits high-speed resistance changes when its variable resistance layer is manufactured at an oxygen flow ratio of 2.6% to 3.3% and has an oxygen content percentage of 46.6 to 62 at %. In other words, when the variable resistance layer is expressed as $HfO_x$, a more appropriate compositional range of the variable resistance layer is $0.9 \leq x \leq 1.6$ (the oxygen content percentage of 46.6 at % and the oxygen content percentage of 62 at % correspond to x=0.9 and x=1.6, respectively).

The element G, that is, the variable resistance element which was manufactured at the oxygen flow ratio of 2.0% and includes the hafnium oxide layer having an oxygen content percentage of about 37.7 at % ($HfO_{0.6}$), has a small initial resistance. Thus, the forming was not possible, and the resistance did not change. Also, the element K, that is, the non-volatile element which was manufactured at the oxygen flow ratio of 4.2% and includes the hafnium oxide layer having an oxygen content percentage of about 69.4 at % ($HfO_{2.3}$), has a great initial resistance. Thus, soft breakdown was not possible even upon application of a direct current voltage of 5 V, and the resistance did not change.

(Analysis of Variable Resistance Layer)

Since the resistance changes in A mode and B mode appear to occur near the upper electrode or near the lower electrode, a closer analysis of the structure of the oxygen-deficient hafnium oxide layer near the upper electrode and the lower electrode was further conducted.

To analyze the structure of the variable resistance layer 1107 included in the variable resistance element 1100, a hafnium oxide layer of the sample I was formed to have an oxygen content percentage of 56.8% and a thickness of 50 nm. Since the analysis requires a relatively large region in which an oxygen-deficient hafnium oxide is deposited, a sample specifically for the analysis was separately prepared by depositing an oxygen-deficient hafnium oxide on a substrate with no element pattern, in which an oxide layer having a thickness of 200 nm is formed on a single-crystal silicon substrate.

In this experiment, too, using the above-described X-ray reflectometry, an X-ray was emitted to enter the sample surface at a shallow angle, and the intensity of the X-ray reflected was measured. Then, fitting was performed presuming an appropriate structural model for an obtained spectrum, so as to evaluate the thickness and the refractive index of the variable resistance layer in the analysis sample which was specifically prepared for the analysis. Here, the parameters for the fitting are the layered structure of the oxygen-deficient hafnium oxide and the thickness and $\delta$ (=1−refractive index) of each layer.

FIGS. 28(a) and (b) show the measurement results. In these graphs, the horizontal axis represents the incident angle of the X-ray, and the vertical axis represents the reflectivity of the X-ray. Here, an angle $\theta$ between the X-ray and the sample surface and a detector angle (angle $\theta$ from the sample surface) were changed in coordination with each other, so as to measure transition in the reflectivity of the X-ray on the sample surface. The angle between an extension of the incident X-ray and the detector is $2\theta$.

FIG. 28(a) shows a pattern observed at the time of actually measuring the X-ray reflectivity of the analysis sample (broken line) and a result of fitting which was performed presuming that a single oxygen-deficient hafnium oxide layer exists on the substrate (solid line), whereas FIG. 28(b) shows a reflectivity pattern observed at the time of actually measuring the X-ray reflectivity of the analysis sample (broken line) and a result of fitting which was performed presuming that three oxygen-deficient hafnium oxide layers exist on the substrate (solid line).

Referring to FIG. 28(a), while the measured values and the fitting result almost match, there are differences at fine levels. On the other hand, referring to FIG. 28(b), the actually measured reflectivity pattern matches well with the reflectivity pattern obtained from the fitting to the extent that they are hardly distinguishable.

The above results appear to indicate that the oxygen-deficient hafnium oxide layer includes: the first oxygen-deficient hafnium oxide layer 1104 on the lower electrode side; the second oxygen-deficient hafnium oxide layer 1105 in the middle; and the third oxygen-deficient hafnium oxide layer 1106 on the upper electrode side.

The analysis result obtained when fitting was performed presuming this triple-layered structure showed the following values: the thickness of the first oxygen-deficient hafnium oxide layer was 3.9 nm and $\delta$ was $24.2 \times 10^{-6}$; the thickness of the second oxygen-deficient hafnium oxide layer was 45.5 nm and $\delta$ was $26.0 \times 10^{-6}$; and the thickness of the third oxygen-deficient hafnium oxide layer was 3.3 nm and $\delta$ was $24.2 \times 10^{-6}$.

film (calculation 2). With this calculation, $\delta$ and the thicknesses of the first, second, and third variable resistance films were determined through the fitting.

Generally, in the case of using the X-ray reflectometry, the layer farthest from the surface in the triple-layered structure cannot be easily measured. The reason why this calculation of the layered structure of the variable resistance films was performed using highly precise data on the third variable resistance layer as the data on the first layer is because the element I exhibited a resistance change phenomenon both in B mode and A mode, which led to an inference that a high oxygen containing layer similar to the third layer was formed also near the lower electrode.

Table 4 shows the result of measuring the samples G to K using the X-ray reflectometry in the same manner as above.

TABLE 4

|  |  |  | Element G (Sample G) | Element H (Sample H) | Element I (Sample I) | Element J (Sample J) | Element K (Sample K) |
|---|---|---|---|---|---|---|---|
|  | Oxygen Flow Ratio (%) |  | 2.0 | 2.7 | 3.0 | 3.3 | 4.0 |
| X-ray Reflectivity Measurement Result | Third Layer | Thickness (nm) | 3.6 | 3.4 | 3.3 | 3.6 | — |
|  |  | $\delta$ | $24.5 \times 10^{-6}$ | $24.4 \times 10^{-6}$ | $24.2 \times 10^{-6}$ | $24.1 \times 10^{-6}$ | — |
|  |  | y | 1.86 | 1.89 | 1.94 | 1.97 | — |
|  | Second Layer | Thickness (nm) | 38.1 | 42.7 | 45.5 | 47.7 | 60.3 |
|  |  | $\delta$ | $28.9 \times 10^{-6}$ | $27.2 \times 10^{-6}$ | $26.0 \times 10^{-6}$ | $25.3 \times 10^{-6}$ | $22.7 \times 10^{-6}$ |
|  |  | x | 0.65 | 1.12 | 1.43 | 1.65 | 2.35 |
|  | First Layer | Thickness (nm) | 2.7 | 3.5 | 3.9 | 3.9 | — |
|  |  | $\delta$ | $24.5 \times 10^{-6}$ | $24.4 \times 10^{-6}$ | $24.2 \times 10^{-6}$ | $24.1 \times 10^{-6}$ | — |
|  |  | y | 1.86 | 1.89 | 1.94 | 1.97 | — |

Although it is difficult to derive a correct composition from these $\delta$ values, a rough estimation can be made from the facts that $\delta$ of hafnium metals is $31.2 \times 10^{-6}$ and $\delta$ of $HfO_2$ having a stoichiometric composition is $24.2 \times 10^{-6}$, and so on. That is to say, since $\delta$ of the second oxygen-deficient hafnium oxide layer is intermediate between $\delta$ of hafnium metals and $\delta$ of $HfO_2$, it appears to be a hafnium oxide having a non-stoichiometric composition as originally intended.

In addition, based on the $\delta$ values, the first and the third oxygen-deficient hafnium oxide layers are predicted to be $HfO_{1.94}$ approximately, and are thus estimated to be hafnium oxides very close to $HfO_2$ (oxygen content percentage of 66.7%) having a stoichiometric composition.

The following describes the analysis using the X-ray reflectometry.

First, for the purposes of simplifying later calculations, fitting is performed presuming that the variable resistance layer has a double-layered structure. More specifically, the fitting is performed to calculate $\delta$ and the thickness of a high oxygen containing layer and a low oxygen containing layer, assuming that the high oxygen containing layer exists near the upper electrode and that the layer other than the high oxygen containing layer is the low oxygen containing layer (calculation 1). It is to be noted that the fitting is performed using a least squares method.

The calculation 1 roughly determines the values of the thickness and $\delta$ of the high oxygen containing layer which exists near the upper electrode.

The following calculation is performed assuming that the variable resistance layer has a triple-layered structure.

Fitting is performed to calculate anew $\delta$ and thicknesses of the first, second, and third variable resistance films under such conditions that $\delta$ and the thickness of the high oxygen containing layer are the initial values of $\delta$ and the thickness of the first variable resistance film and that $\delta$ of the first variable resistance film is the same as $\delta$ of the third variable resistance From the result of measuring the samples H, I and J which were made under the same conditions as the well-operated elements H, I and J, respectively, it can be said that a preferable thickness of the first or third layer is between 3 nm and 4 nm inclusive. It can also be said that a preferable y value of the first or third layer is $1.8 < y < 2$.

It is to be noted that the first and third hafnium oxide layers can also be formed through deposition using sputtering or chemical vapor deposition. In the case of sputtering, for example, first, sputtering is performed under a condition of a high oxygen gas flow ratio at the time of deposition, so that a hafnium oxide having a high oxygen content percentage and high resistance can be formed. For example, in the case of the sputtering condition described above in relation to the manufacturing method of the variable resistance element 1100, the hafnium oxide layers can be formed by setting the oxygen gas flow ratio to 4% approximately.

(Mechanism of Resistance Change Phenomenon)

The following considers the mechanism of the resistance change phenomenon observed in the fifth experiment, and examines based on the mechanism, the structure of the variable resistance element which can uniquely exhibit the resistance change phenomenon either in A mode or B mode.

First, it is to be noted that the roles of the first hafnium oxide layer 1104 and the third hafnium oxide layer 1106 are not clearly known because the mechanism of the resistance change phenomenon is not understood well at present.

In this experiment, however, considering that the resistance changes of the variable resistance nonvolatile element occur due to movements of oxygen ions in the interface between an electrode and a hafnium oxide layer, the first hafnium oxide layer 1104 and the third hafnium oxide layer 1106 may have a role of effectively applying a voltage to a region near the interface. That is, the resistance change phenomenon seems to occur as oxygen ions gather and diffuse near the interface between the lower electrode 1103 and the first hafnium oxide layer 1104 and near the interface between the upper electrode 1108 and the third hafnium oxide layer 1106 due to an electric field.

To be more specific, applying a positive voltage to the upper electrode 1108 causes negatively-charged oxygen ions to gather on the upper electrode 1108 side, forming a high resistance layer, which means that the element performs the resistance change to high resistance state. On the other hand, applying a negative voltage causes diffusion of the oxygen ions in the hafnium oxide layer, resulting in the resistance change to low resistance state of the element.

Here, since the third hafnium oxide layer 1106, which is a high resistance layer, exists in contact with the upper electrode 1108, a large voltage is applied to the third hafnium oxide layer 1106, causing injection of oxygen into the hafnium oxide layer 1106. As a result, the oxygen content percentage increases and the third hafnium oxide layer 1106 approaches $HfO_2$ having a stoichiometric composition known as an insulator. That is to say, the third hafnium oxide layer 1106 plays a part in the resistance changes.

The gathering and diffusion of oxygen ions can also take place on the lower electrode 1103 side. In that case, the first hafnium oxide layer 1104, which is a high resistance layer provided in contact with the lower electrode 1103, plays a part in the resistance changes.

With such a mechanism as described above, in the case where the third hafnium oxide layer 1106 plays a larger part in the resistance changes, it appears that the resistance changes in B mode occur; that is, the resistance change to high resistance state is performed upon application, to the upper electrode 1108 provided in contact with the third hafnium oxide layer 1106, of electrical pulses having a voltage higher than a voltage applied to the lower electrode 1103, whereas the resistance change to low resistance state is performed upon application of a negative voltage.

On the other hand, in the case where the first hafnium oxide layer 1104 plays a larger part in the resistance changes, it appears that the resistance changes in A mode occur; that is, the resistance change to high resistance state is performed upon application, to the lower electrode 1103 provided in contact with the first hafnium oxide layer 1104, of electrical pulses having a voltage higher than a voltage applied to the upper electrode 1108, whereas the resistance change to low resistance state is performed upon application of a negative voltage.

The experimental result that the element G, in which the first hafnium oxide layer 1104 and the third hafnium oxide layer 1106 have a low oxygen content percentage, did not exhibit the resistance changes indicates that the voltage is evenly applied to the hafnium oxide layer 1105 if the first hafnium oxide layer 1104 and the third hafnium oxide layer 1106, which are high resistance layers, do not exist, and thus high resistance layers which are almost insulators are not easily formed near the electrodes. As a result, it appears that the resistance change phenomenon does not occur easily.

Further, taking into account that the hafnium oxide layers near the electrodes have a role of locally applying a large voltage to a region near the electrodes in the variable resistance layer, it seems that the resistance of the hafnium oxide layers near the electrodes need to be larger than the resistance of the second hafnium oxide layer, which is an oxygen supplying layer. For this reason, it is sufficient if the first or third hafnium oxide layer expressed as $HfO_y$ satisfies $x<y<2$. As also for the thickness of the first or third hafnium oxide layer, it is sufficient as along as the thickness falls within a range which allows the first or third hafnium oxide layer to locally apply a large voltage.

From the viewpoint of simple manufacturing, the first and third hafnium oxide layers having a thickness of 1 nm or greater are suitable for implementation. Moreover, from the viewpoint of increase in the element resistance which is to be brought about by future miniaturization, a thickness of 5 nm or smaller is probably suitable for implementation.

(Preferable Structure of Variable Resistance Element Using Hafnium Oxide as Variable Resistance Layer)

Such a mechanism as described above seems to indicate that the variable resistance element which can uniquely exhibit the resistance changes either in A mode or B mode can be obtained by providing only one of the first hafnium oxide layer 1104 and the third hafnium oxide layer 1106 of the variable resistance layer.

This idea is also supported by the results of the first to fourth experiments related to the variable resistance element in which a variable resistance layer containing a tantalum oxide is used; that is, the results that the variable resistance element in which a tantalum oxide layer having a higher oxygen content percentage is provided in contact with only one of the upper electrode and the lower electrode uniquely exhibited the resistance changes in A mode or B mode.

Figure 29:
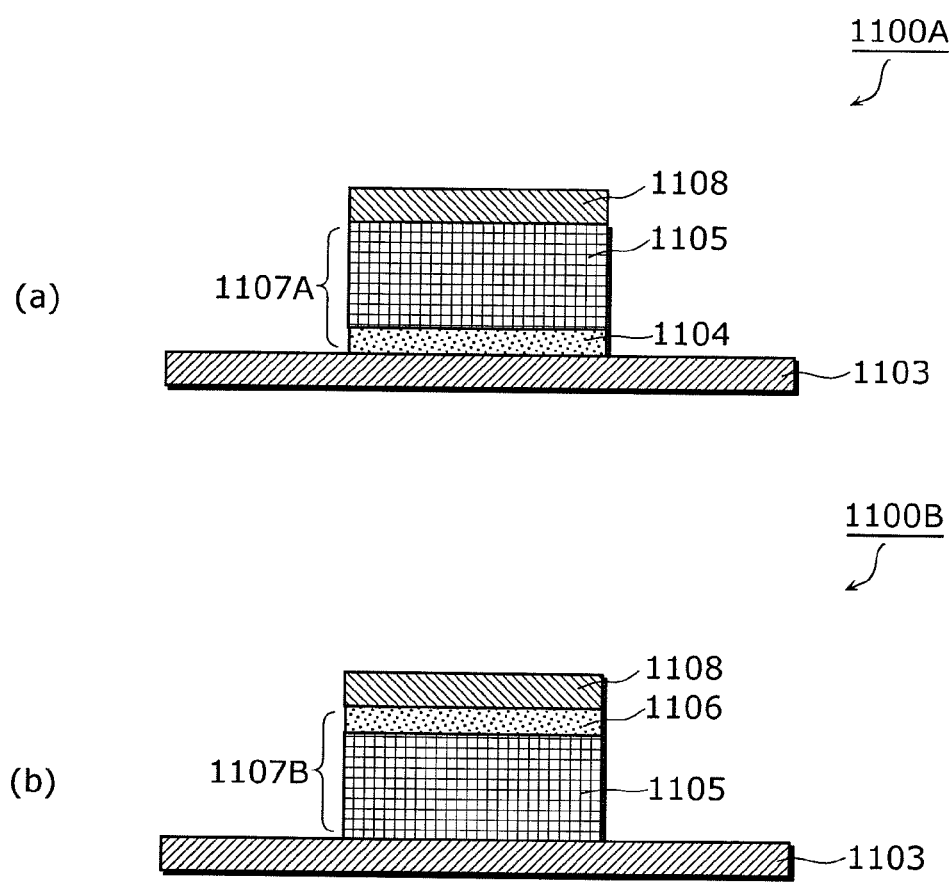
[FIG. 29] FIGS. 29(a) and (b) are cross-sectional views each showing, as basic data of the present invention, a structure of a nonvolatile storage element.

FIGS. 29(*a*) and (*b*) are cross-sectional views each showing a structure of such a variable resistance element. FIGS. 29(*a*) and (*b*) omit the substrate and the oxide layer for convenience.

With a variable resistance element 1100A shown in FIG. 29(*a*), the hafnium oxide layer 1104 having a higher oxygen content percentage is deposited only on the lower electrode 1103. Sequentially depositing the hafnium oxide layer 1104 and the hafnium oxide layer 1105 makes the structure of a variable resistance layer 1107A.

With the variable resistance element 1100A having such a structure, the hafnium oxide layer 1104 provided in contact with the lower electrode 1103 appears to play a part in the resistance changes and to cause the resistance changes in A mode.

As for a variable resistance element 1100B shown in FIG. 29(*b*), the hafnium oxide layer 1105, the hafnium oxide layer 1106 having a higher oxygen content percentage, and the upper electrode 1108 are sequentially provided. Sequentially depositing the hafnium oxide layer 1105 and the hafnium oxide layer 1106 makes the structure of a variable resistance layer 1107B.

With the variable resistance element 1100B having such a structure, the hafnium oxide layer 1106 provided in contact with the upper electrode 1108 appears to play a part in the resistance changes and to cause the resistance changes in B mode.

The present invention also includes a variable resistance nonvolatile storage device having the variable resistance element 1100A and a variable resistance nonvolatile storage device having the variable resistance element 1100B. Such variable resistance nonvolatile storage devices also achieve the same advantageous effect as that of the variable resistance nonvolatile storage device described in the embodiment.

(Variable Resistance Element Using Oxygen-Deficient Zirconium Oxide as Variable Resistance Layer)

Next, the following describes the sixth experiment regarding a variable resistance nonvolatile storage element which uses an oxygen-deficient zirconium oxide as the variable resistance layer.

(Structure of Variable Resistance Element)

Figure 30:
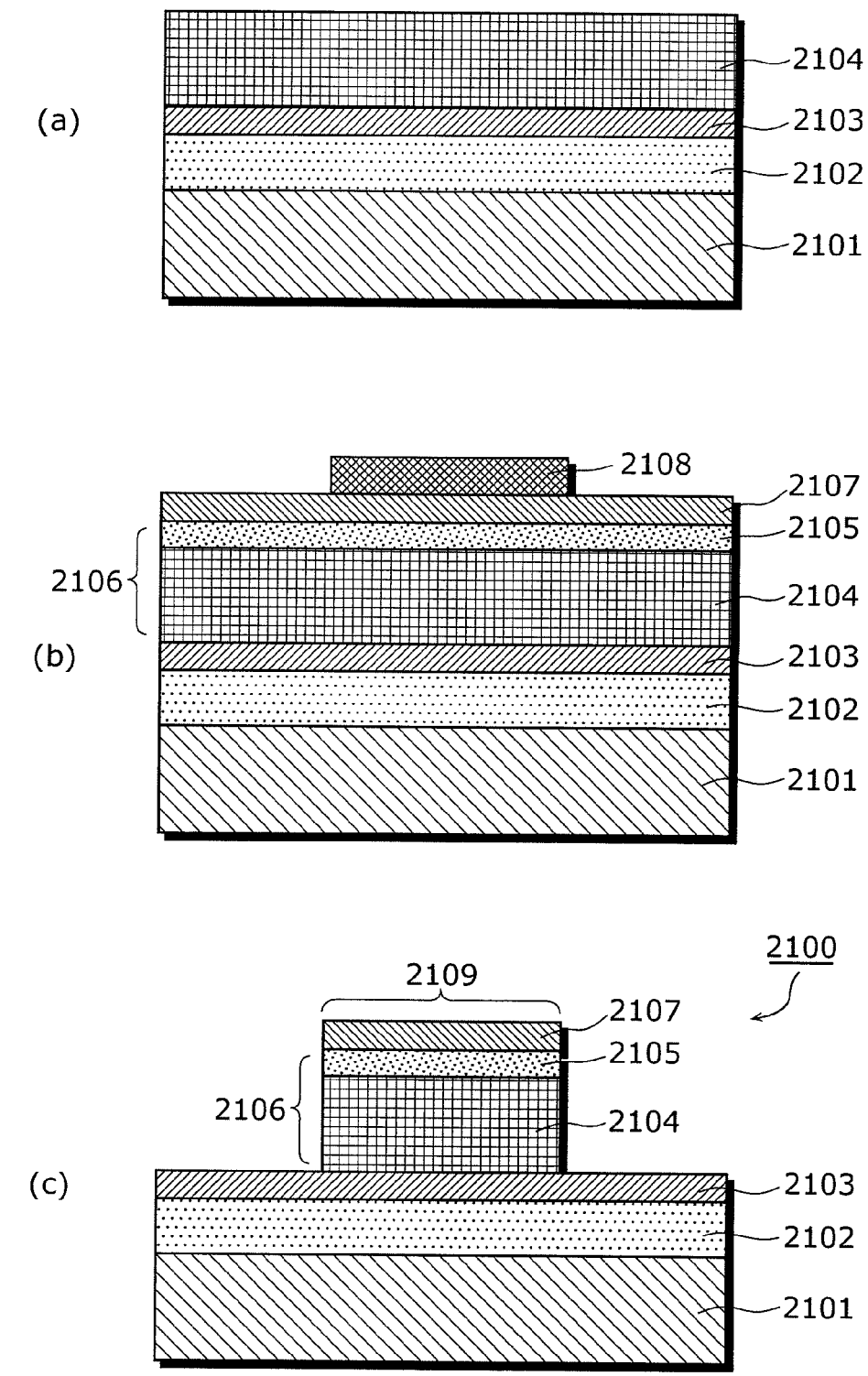
[FIG. 30]

FIG. 30(*c*) is a cross-sectional view showing a structural example of the variable resistance element used in the sixth experiment.

As shown in FIG. 30(c), a variable resistance element 2100 used in the sixth experiment includes: a substrate 2101; an oxide layer 2102 formed on the substrate 2101; a lower electrode 2103 formed on the oxide layer 2102; an upper electrode 2107; and a variable resistance layer 2106 located between the lower electrode 2103 and the upper electrode 2107. Here, the variable resistance layer 2106 includes: a first zirconium oxide layer 2104 having a lower oxygen content percentage (hereinafter referred to as "first zirconium oxide layer"); and a second zirconium oxide layer 2105 formed on the first zirconium oxide layer 2104 and having a higher oxygen content percentage (hereinafter referred to as "second zirconium oxide layer").

The materials of the lower electrode 2103 and the upper electrode 2107 are, for example, Pt (platinum), Ir (iridium), Pd (palladium), Ag (silver), Ni (nickel), W (tungsten), Cu (copper), Al (aluminum), Ta (tantalum), Ti (titanium), TiN (titanium nitride), TaN (tantalum nitride), and TiAlN (titanium aluminum nitride).

Although the substrate 2101 may be a single-crystal silicon substrate or a semiconductor substrate, it is not limited to these substrates. The variable resistance layer 2106 can be formed at a relatively low substrate temperature and thus can be formed on a resin material and the like.

(Manufacturing Method of Variable Resistance Element)

Next, a manufacturing method of the variable resistance element 2100 used in the sixth experiment is described with reference to FIG. 30(a) to (c).

First, as shown in FIG. 30(a), thermal oxidation produces the oxide layer 2102 having a thickness of 200 nm on the substrate 2101 which is a single-crystal silicon. Then, by sputtering, a Pt thin film having a thickness of 100 nm is deposited on the oxide layer 2102 as the lower electrode 2103. After that, the first zirconium oxide layer 2104 is formed on the lower electrode 2103 by reactive sputtering, with zirconium used as the target.

Next, as shown in FIG. 30(b), the top surface of the first zirconium oxide layer 2104 is oxidized to modify the surface property. This forms, on the surface of the first zirconium oxide layer 2104, the second zirconium oxide layer 2105 whose oxygen content percentage is higher than that of the first zirconium oxide layer 2104. This layered structure in which the first zirconium oxide layer 2104 and the second zirconium oxide layer 2105 are stacked is the structure of the variable resistance layer 2106.

Subsequently, by sputtering, a Pt thin film having a thickness of 150 nm is formed on the second zirconium oxide layer 2105 as the upper electrode 2107. Lastly, photolithography processing creates a pattern 2108 using a photoresist, and dry etching produces an element region 2109.

With the above-described manufacturing method, three types of variable resistance elements were manufactured under different manufacturing conditions. The following describes the details.

First, the layered structure of the substrate 2101, the oxide layer 2102, and the lower electrode 2103 comprising Pt was formed in the above-described manner. After that, the first zirconium oxide layer 2104 was formed on the lower electrode 2103 by reactive sputtering, that is, a process of sputtering a zirconium target in an argon gas and an oxygen gas (FIG. 30(a)).

The film forming condition here was as follows: vacuum (back pressure) in the sputtering apparatus was approximately $2 \times 10^{-5}$ Pa before sputtering; power was 300 W when sputtering; the total gas pressure of the argon gas and the oxygen gas was 0.93 Pa; the flow ratios of the oxygen gas were 2.0%, 2.7% and 3.3%; the preset temperature of the substrate was 25° C.; and the time period for film formation was approximately four minutes.

With this, the first zirconium oxide layer 2104 was deposited with a thickness of about 30 nm to 40 nm and an oxygen content percentage of about 48%, about 59%, or about 67% corresponding to one of the above mentioned oxygen gas flow ratios; in other words, the first zirconium oxide layer 2104 was deposited which can be expressed as $ZrO_x$, where x is 0.9, 1.4 or 2.0.

In manufacturing the variable resistance elements, the formation of the first zirconium oxide layer 2104 and the second zirconium oxide layer 2105 was followed by the formation of the upper electrode 2107, both performed in the sputtering apparatus. More specifically, after depositing the first zirconium oxide layer 2104, a shutter was inserted between the zirconium target and the oppositely placed substrate 2101 with no change to the sputtering condition, including the condition of the gas pressure and the power, and it was kept in this state for about 10 to 30 seconds.

This caused oxidation of the top surface of the first zirconium oxide layer 2104 due to oxygen plasma. As a result, the second zirconium oxide layer 2105 whose oxygen content percentage is higher than that of the first zirconium oxide layer 2104 was formed on the surface of the first zirconium oxide layer 2104.

Thereafter, the upper electrode 2107 comprising Pt was formed on the second zirconium oxide layer 2105 in the above-described manner (FIG. 30(b)).

Then, the element region 2109 was formed through the photolithography processing (FIG. 30(c)).

With the above processes, three types of variable resistance elements were manufactured under different manufacturing conditions. These variable resistance elements are referred to as elements L, M, and N. It is to be noted that the element region 2109 of the elements L, M, and N has a circular pattern with a diameter of 3 μm.

(Analysis of Variable Resistance Layer)

To analyze the structure of the variable resistance layer 2106 in the sixth experiment, samples were prepared by, under the same conditions as that of the elements L, M, and N, depositing a zirconium oxide on a substrate in which an oxide layer having a thickness of 200 nm is formed on a single-crystal silicon substrate, followed by oxygen plasma irradiation. These samples are referred to as samples L, M, and N.

Table 5 summarizes the oxygen gas flow ratio and a later-described analysis of each sample. It is to be noted that Pt equivalent to the upper electrode 2107 is not deposited on the samples L to N, and thus the variable resistance layer 2106 is exposed.

TABLE 5

| | | | Element L (Sample L) | Element N (Sample N) | Element M (Sample M) |
|---|---|---|---|---|---|
| | Oxygen Flow Ratio (%) | | 2.0 | 2.7 | 3.3 |
| X-ray Reflectivity Measurement Result | $ZrO_x$ Layer (First Zirconium Oxide Layer) | Thickness (nm) | 33.5 | 38.5 | 41.9 |
| | | δ | $17.8 \times 10^{-6}$ | $17.2 \times 10^{-6}$ | $16.4 \times 10^{-6}$ |
| | | x | 0.93 | 1.42 | 2.03 |
| | $ZrO_y$ Layer (Second Zirconium Oxide Layer) | Thickness (nm) | 5.0 | 3.9 | — |
| | | δ | $16.7 \times 10^{-6}$ | $16.5 \times 10^{-6}$ | — |
| | | y | 1.79 | 1.97 | — |

In the sixth experiment, too, using the above-described X-ray reflectometry, an X-ray was emitted to enter the surface of each sample at a shallow angle, and the intensity of the X-ray reflected was measured. Then, fitting was performed presuming an appropriate structural model for an obtained spectrum, so as to evaluate the thickness and the refractive index of the variable resistance layer in the samples L to N. Here, the parameters for the fitting are the layered structure of the variable resistance layer and the thickness and δ (=1−refractive index) of each layer.

Figure 32:
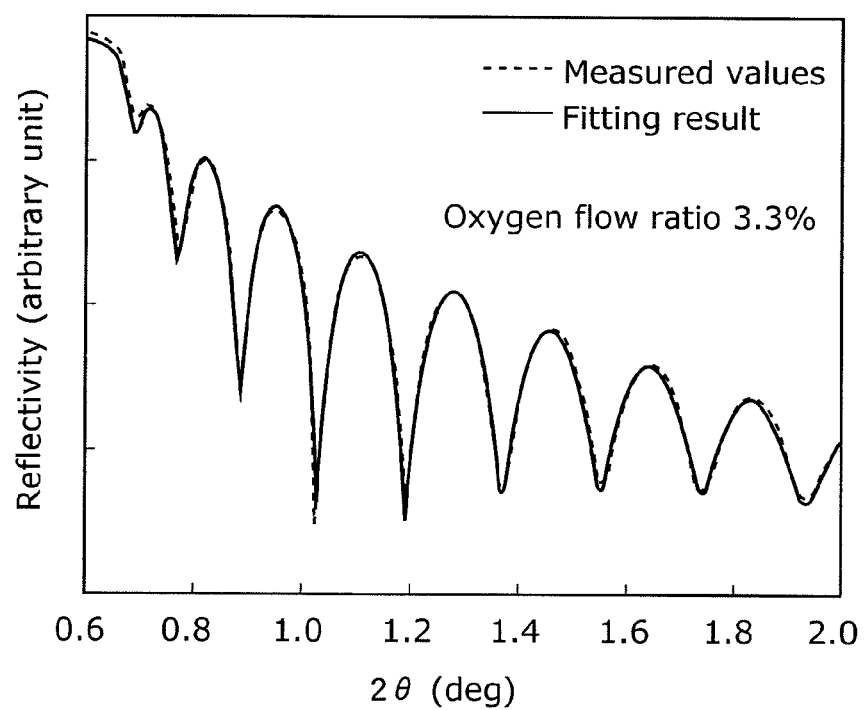
[FIG. 32]

FIGS. 31(a) and (b) and FIG. 32 each show an example of the X-ray reflectivity measurement pattern of the samples M and N. Here, an angle θ between the X-ray and the sample surface and a detector angle (angle θ from the sample surface) were changed in coordination with each other, so as to measure transition in the reflectivity of the X-ray on the sample surface. The angle between an extension of the incident X-ray and the detector is 2θ. In FIGS. 31(a) and (b) and FIG. 32, the horizontal axis represents the incident angle θ of the X-ray, and the vertical axis represents the reflectivity of the X-ray.

FIG. 31(a) shows a pattern observed at the time of actually measuring the X-ray reflectivity of the sample M (broken line) and a result of fitting which was performed presuming that a single zirconium oxide layer exists on the substrate (solid line). FIG. 31(b) shows a reflectivity pattern observed at the time of actually measuring the X-ray reflectivity of the sample M (broken line) and a result of fitting which was performed presuming that two zirconium oxide layers exist on the substrate (solid line). FIG. 32 shows a pattern observed at the time of actually measuring the X-ray reflectivity of the sample N (broken line) and a result of fitting which was performed presuming that a single zirconium oxide layer exists on the substrate (solid line).

Referring to FIG. 31(a), while the measured values and the fitting result almost match, there are differences at fine levels. On the other hand, referring to FIG. 31(b), the actually measured reflectivity pattern matches well with the reflectivity pattern obtained from the fitting to the extent that they are hardly distinguishable. The above results appear to indicate that the sample M includes two different zirconium oxide layers, namely, the first and the second zirconium oxide layers.

The result of an analysis of the sample M when fitting was performed presuming this double-layered structure showed the following values as shown in Table 5: the thickness of the first zirconium oxide layer was 38.5 nm and δ was $17.2 \times 10^{-6}$; and the thickness of the second zirconium oxide layer was about 3.9 nm and δ was $16.5 \times 10^{-6}$.

Generally, δ can be theoretically calculated based on the density of the film; δ of metal zirconium having a density of 6.798 g/cm³ is $19.0 \times 10^{-6}$, and δ of $ZrO_2$ having a density of 5.817 g/cm³ is $16.9 \times 10^{-6}$. Comparison between these values and the above obtained values appears to indicate that the first zirconium oxide layer is a zirconium oxide such as $ZrO_{1.42}$ which is an oxide deficient in oxygen and is clearly different from the stoichiometric composition of zirconium oxide. Further, as for the second zirconium oxide layer, calculating its compositional ratio using the δ value gives $ZrO_{1.97}$. This indicates that the second zirconium oxide layer is an oxide similar to $ZrO_2$ yet seems to be an oxygen-deficient oxide which is different from the stoichiometric composition.

As shown in Table 5, the sample L exhibited almost the same results. More specifically, when the first zirconium oxide layer is expressed as $ZrO_x$, its thickness is approximately 33.5 nm and x is about 0.93, and when the second zirconium oxide layer is expressed as $ZrO_y$, its thickness is approximately 5.0 nm and y is about 1.79.

In comparison, referring to the analysis result of the sample N shown in FIG. 32, the result of fitting which was performed presuming that a single zirconium oxide layer exists on the substrate matches well with the actually measured reflectivity pattern. That means, in the sample N, it appears that the structure is not a double-layered structure and the second zirconium oxide layer does not exist.

Here, as shown in Table 5, when the single zirconium oxide layer is expressed as $ZrO_x$, its thickness is approximately 41.9 nm and the x is about 2.0 which indicates a stoichiometric compositional ratio.

The element L and the sample L underwent the sputtering and the oxygen plasma irradiation under the same condition. The element M and the sample M also underwent the sputtering and the oxygen plasma irradiation under the same condition. Thus, in the elements L and M as in the samples L and M, the second zirconium oxide layer 2105 probably exists between the first zirconium oxide layer 2104 and the upper electrode 2107.

Thus, it can be said that the second zirconium oxide layer 2105 having a thickness of 3.9 nm and a compositional ratio in which y is 1.97 is formed in the element M as in the sample M.

Although the sixth experiment used the X-ray reflectivity measurement for analyzing the second zirconium oxide layer, other instrumental analysis techniques can also be used, including Auger electron spectroscopy analysis (AES), fluorescent X-ray photoelectron spectroscopy analysis (XPS), and electron probe microanalysis (EPMA: also known as WDS, EDS, or EDX depending on the detection method).

(Variable Resistance Characteristics)

Next, the following describes: the characteristics observed when electrical pulses are applied to the element M to cause the resistance change in the element M, which is a representative example of the double-layered structure including the first zirconium oxide layer 2104 and the second zirconium oxide layer 2105 which were actually manufactured in the sixth experiment; and the characteristics observed when electrical pulses are applied to the element N in which the second zirconium oxide layer 2105 does not seem to exist.

FIGS. 33(a) and (b) are graphs each showing a relationship between electrical pulses applied and the resistance value of the variable resistance layer included in the variable resistance element of the sixth experiment. It is to be noted that FIGS. 33(a) and (b) show the results of the elements M and N, respectively. Here, the resistance value of the variable resistance layer 2106 was measured while repeatedly applying two types of electrical pulses (positive voltage and negative voltage) alternately with a pulse width of 100 nsec between the lower electrode 2103 and the upper electrode 2107.

First, referring to FIG. 33(a) showing the resistance change characteristics of the element M which was manufactured at the oxygen gas flow ratio of 2.7%, it is clear that application of electrical pulses having a positive voltage of +2.3 V to the sample immediately after measuring its initial resistance causes a decrease in the resistance value from about 500 kΩ to about 3 kΩ. This is known as a forming process, and since the initial resistance of about 500 kΩ is very high, the resistance value needs adjustment to be close to a resistance change range of 110Ω to 3 kΩ. Further, the forming process only involves a single application of pluses having a positive voltage of +2.3 V, and thus as compared to the conventional technique, it is simpler and requires a lower voltage.

After that, the element M exhibited the above-described resistance changes in B mode in which application of electrical pulses having a negative voltage of −1.0 V causes a decrease in the resistance value to about 110Ω and application of electrical pulses having a positive voltage of +1.7 V causes an increase in the resistance value to about 3 kΩ. Then, reversible resistance changes occurred stably between 110Ω and 3 kΩ.

Referring to FIG. 33(b) showing the resistance change characteristics of the element N which was manufactured at the oxygen gas flow ratio of 3.3%, the initial resistance was very high at 6.8 MΩ, and the element N exhibited no resistance change even when electrical pulses were applied while gradually changing the positive voltage from +0.1 V to +10.0 V or the negative voltage from −0.1 V to −10.0 V, with a pulse width of 100 nsec. The resistance value decreased to about 30Ω when a positive voltage of +10.0 V and a negative voltage of −10.0 V were alternately and repeatedly applied several times. However, no resistance change was exhibited thereafter.

These results clarified that reversible resistance changes can be observed only when the second zirconium oxide layer 2105 exists. However, when the second zirconium oxide layer 2105 having a high oxygen content percentage does not exist, a pulse having a width of 100 ns, for example, cannot bring about the resistance change phenomenon. This indicates that the second zirconium oxide layer is essential to bring about high-speed resistance changes. The composition of this second zirconium oxide layer, when expressed as $ZrO_y$, is sufficient as long as it satisfies x<y<2. A further preferable value of y is 1.9<y<2.

From the viewpoint of simple manufacturing, the second zirconium oxide layer having a thickness of 1 nm or greater is suitable for implementation. Moreover, from the viewpoint of increase in the element resistance which is to be brought about by future miniaturization, a thickness of 5 nm or smaller is probably suitable for implementation.

(Preferable Structure of Variable Resistance Element Using Hafnium Oxide as Variable Resistance Layer)

The above results show a tendency identical to that shown in the result of the fifth experiment in relation to the variable resistance element in which the variable resistance layer comprising the hafnium oxide is used. The variable resistance element in which the variable resistance layer comprising the zirconium oxide is used also appears to exhibit resistance changes with the same mechanism as that examined in the fifth experiment.

This idea is supported also by the fact that the element M exhibited the stable resistance changes in B mode after a few and low voltage forming process. That means, the element M exhibited the resistance changes in B mode probably because the zirconium oxide layer 2105 provided in contact with the upper electrode 2107 and having a high oxygen content percentage played a part in the resistance changes.

This suggests that by providing the zirconium oxide layer 2105, which has a high oxygen content percentage, in contact with the lower electrode 2103, a variable resistance element can be obtained which exhibits the resistance changes in A mode.

Figure 34:
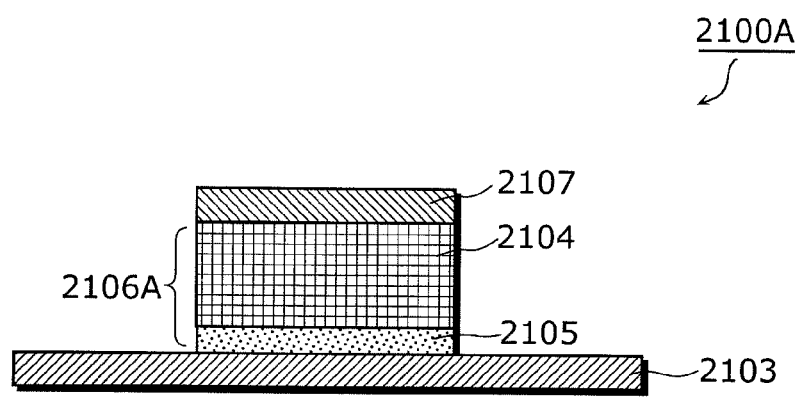
[FIG. 34]
Figure 35:
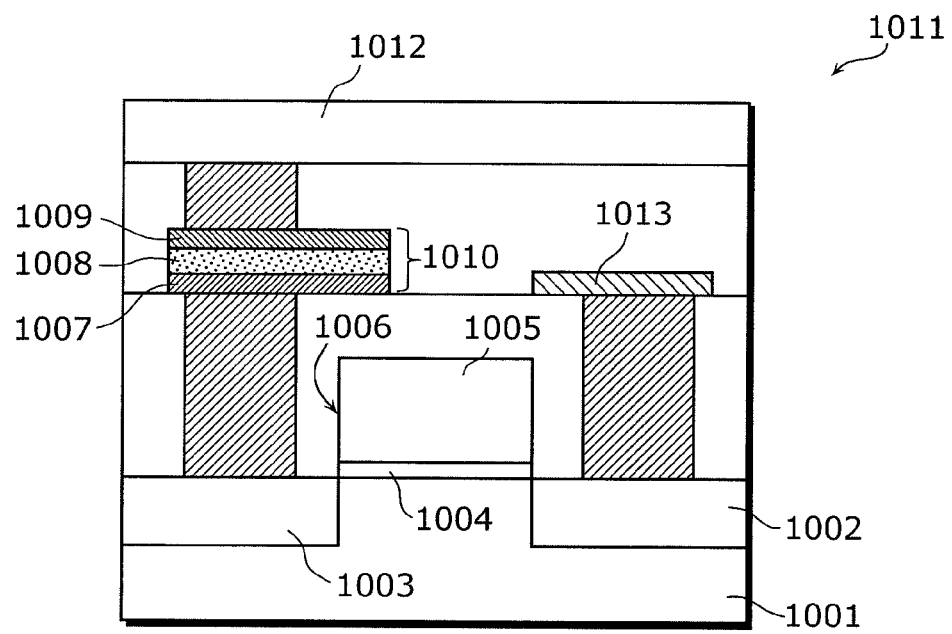
[FIG. 35]
Figure 36:
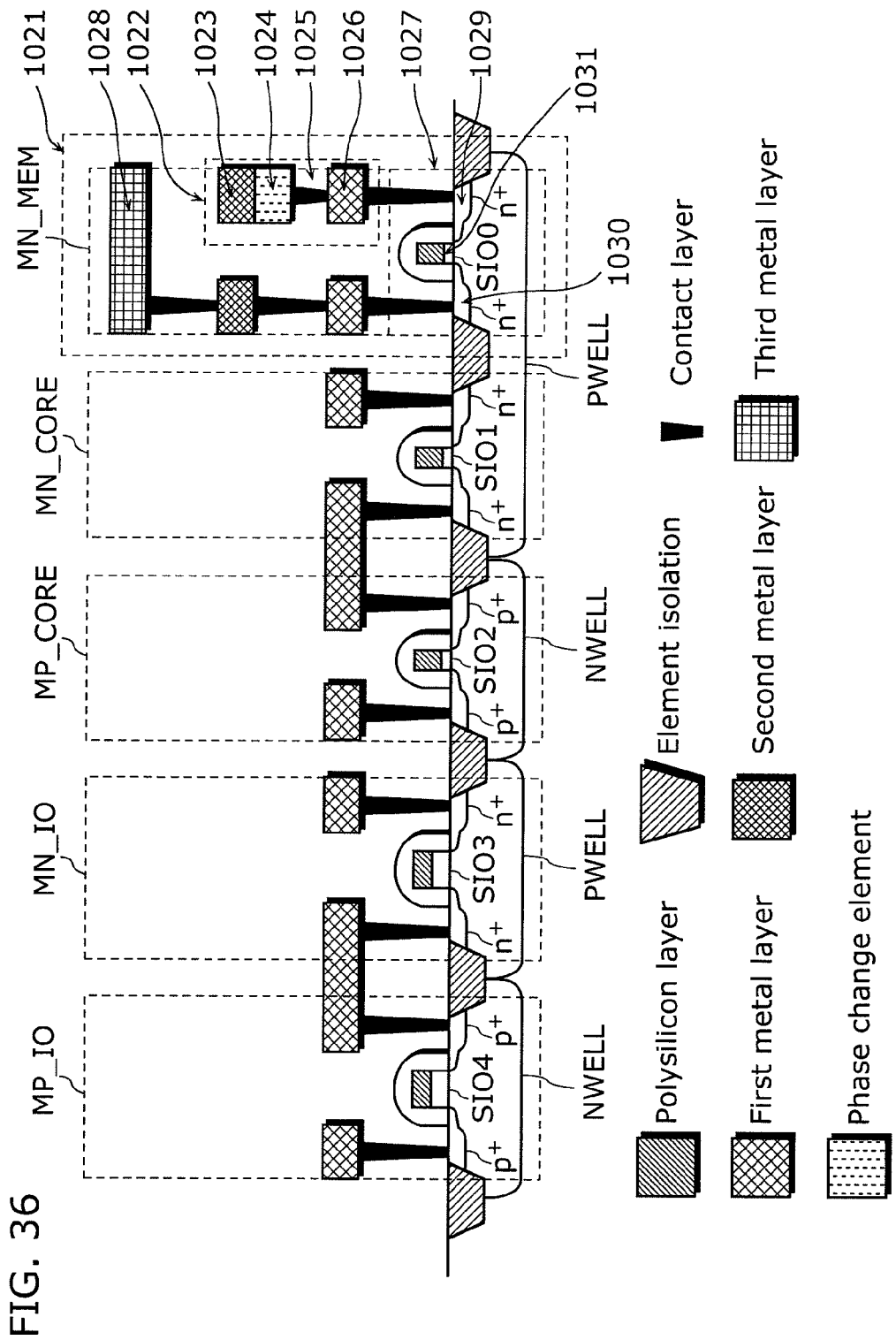
[FIG. 36]

FIG. 34 is a cross-sectional view showing a structure of such a variable resistance element as a variation. FIG. 34 omits the substrate and the oxide layer for convenience.

With a variable resistance element 2100A shown in FIG. 34, the zirconium oxide layer 2105 having a high oxygen content percentage, the zirconium oxide layer 2104, and the upper electrode 2107 are sequentially provided on the lower electrode 2103. A variable resistance layer 2106A is formed by sequentially depositing the zirconium oxide layer 2105 and the zirconium oxide layer 2104.

With the variable resistance element 2100A having such a structure, the zirconium oxide layer 2104 provided in contact with the lower electrode 2103 appears to play a part in the resistance changes and to cause the resistance changes in A mode.

The present invention also includes a variable resistance nonvolatile storage device having the above-described variable resistance element 2100 and a variable resistance nonvolatile storage device having the above-described variable resistance element 2100A. Such variable resistance nonvolatile storage devices also achieve the same advantageous effect as that of the variable resistance nonvolatile storage device described in the embodiment.

Although only an exemplary embodiment of the variable resistance nonvolatile storage device according to the present invention has been described above, the present invention is not limited to this embodiment. Various modifications which can be conceived by those skilled in the art without materially departing from the novel teachings and advantages of the present invention are intended to be included within the scope of the present invention.

(Variation of Variable Resistance Element Used in Nonvolatile Storage Device)

For example, although the embodiment has described, as an example, the nonvolatile storage device that uses a variable resistance element in which the upper electrode and the lower electrode both comprise Pt, it is also possible to use a variable resistance element in which the upper electrode and the lower electrode comprise different materials.

From another experiment conducted by the inventors of the present application, it was found that the mode of the resistance change characteristics is also unique in a variable resistance element formed by providing a variable resistance layer comprising a transition metal oxide having a uniform oxygen content percentage, between a second electrode comprising a material having a standard electrode potential which is higher than that of the transition metal of the transition metal oxide and a first electrode comprising a material having a standard electrode potential which is lower than that of the second electrode.

Although the details are omitted, the experiment showed a result that the above-described resistance changes in B mode occurred in, for example, a variable resistance element in which the upper electrode comprises Pt that is an example of the second electrode material and the lower electrode comprises W (tungsten) that is an example of the first electrode material. Here, as compared to W, Pt has a high standard electrode potential and is not easily oxidized.

In this case, when voltages having different polarities are alternately applied between the upper electrode and the lower electrode, the oxygen ions are not absorbed into the upper electrode comprising Pt that is not easily oxidized, but are absorbed into the lower electrode comprising W that is easily oxidized. Thus, the gathering and diffusion of the oxygen ions occur more actively near the interface between the variable resistance layer and the upper electrode, thereby causing the resistance changes in B mode.

In view of the above, the electrode provided in contact with a transition metal oxide layer having a higher oxygen content percentage may comprise Pt or the like having a higher standard electrode potential (not easily oxidized), whereas the electrode provided in contact with a transition metal oxide layer having a lower oxygen content percentage may comprise W or the like having a lower standard electrode potential (easily oxidized).

This way, the oxygen ions are not absorbed into the Pt electrode from the transition metal oxide layer having a higher oxygen content percentage, but are absorbed into the W electrode from the transition metal oxide layer having a lower oxygen content percentage, and thus there is a greater tendency in which the oxygen ions gather and diffuse in the transition metal oxide layer having a higher oxygen content percentage. As a result, the mode of the resistance change characteristics is strongly fixed.

This is more preferable in implementing a characteristic structure of the present invention in which a memory cell is formed by connecting a variable resistance element and a transistor in a direction in which a substrate bias effect in the transistor is smaller, depending on the mode of the variable resistance element.

Further, one may consider forming the first transition metal oxide layer and the second transition metal oxide layer included in the variable resistance layer of the variable resistance element, using oxide layers comprising different types of transition metals. In this case, according to the types of the transition metals used, the oxygen content percentage of each oxide layer is determined such that the resistance value of the first transition metal oxide layer is greater than that of the second transition metal oxide layer.

As described earlier, in the variable resistance layer, the second transition metal oxide layer whose resistance value is higher than that of the first transition metal oxide layer has a role of locally applying a large voltage. As described above, it appears that with this voltage, the gathering and diffusion of the oxygen ions playing a part in the resistance changes occur more actively in the second transition metal oxide layer, and as a result, the mode of the resistance change characteristics is fixed.

With this idea, even when different types of transition metals are used, it is probably possible, as in the embodiment, to obtain a variable resistance element which can fix the mode of the resistance change characteristics by making the resistance value of the second transition metal oxide layer larger than the resistance value of the first transition metal oxide layer.

That is to say, the present invention also includes the variable resistance element in which the first transition metal oxide layer and the second transition metal oxide layer of the variable resistance layer are oxide layers comprising different types of transition metals.

(Impurities in Variable Resistance Layer)

Although not described above, it is a known technique to implant predetermined impurities, such as an additive for adjusting the resistance value, into the variable resistance layer of the variable resistance element. This technique may be applied to the variable resistance element used in the variable resistance nonvolatile storage device of the present invention. For example, adding nitrogen to the variable resistance layer leads to an increase in the resistance value of the variable resistance layer, thereby improving the reactivity of the resistance changes.

More specifically, regarding the variable resistance element in which an oxygen-deficient transition metal oxide is used for the variable resistance layer, the limitation in the claims that the variable resistance layer includes: a first region containing a first oxygen-deficient transition metal oxide having a composition $MO_x$; and a second region containing a second oxygen-deficient transition metal oxide having a composition $MO_y$ (where x<y) is not intended to exclude the first region and the second region containing predetermined impurities (e.g. an additive for adjusting the resistance value) other than the corresponding compositional transition metal oxides.

INDUSTRIAL APPLICABILITY

As described above, the present invention makes it possible to provide, in a small layout area, a variable resistance nonvolatile storage device formed with 1T1R memory cells each using a variable resistance element. Thus, the present invention is useful in providing a memory which is high in integration and small in area, for example.

REFERENCE SIGNS LIST

100 Variable resistance element
101 Substrate
102 Oxide layer
103 Lower electrode
104 Variable resistance layer
104a, 104b Tantalum oxide layer
105 Upper electrode
106 Pattern
107 Element region
200 Nonvolatile storage device
201 Memory main portion
202 Memory array
203 Column selection circuit
204 Sense amplifier
205 Data input and output circuit
206 Write circuit
207 Row driver
208 Row selection circuit
209 Address input circuit
210 Control circuit
211 Power source for writing
212 Power source for low resistance (LR) writing
213 Power source for high resistance (HR) writing
300 Memory cells
301 Semiconductor substrate
302a, 302b N-type diffusion layer region
303a Gate insulator film
303b Gate electrode
304, 306, 308, 310 Via
305, 307, 311 Wiring layer
309 Variable resistance element
309a, 309d Lower electrode
309b, 309e Variable resistance layer
309b-1, 309e-1 Tantalum oxide layer having a lower oxygen content percentage
309b-2, 309e-2 Tantalum oxide layer having a higher oxygen content percentage
309c, 309f Upper electrode
317 Transistors
400 Memory cells
402a, 402b P-type diffusion layer region
409 Variable resistance element
417 Transistors
418 N well
1001 Semiconductor substrate
1002 Source region
1003 Drain region
1004 Gate oxide film
1005, 1031 Gate electrode
1006 Transistor
1007 Lower electrode
1008 Variable resistance layer
1009 Upper electrode
1010 Variable resistance element
1011, 1021 Memory cell
1012 Bit line
1013 Source line
1029, 1030 N-type diffusion layer region
1100, 1100A, 1100B Variable resistance element
1101 Substrate 1102 Oxide layer
1103 Lower electrode
1104, 1105, 1106 Hafnium oxide layer
1107, 1107A, 1107B Variable resistance layer
1108 Upper electrode
1109 Element region
2100, 2100A Variable resistance element
2101 Substrate
2102 Oxide layer
2103 Lower electrode
2104, 2105 Zirconium oxide layer
2106, 2106A Variable resistance layer
2107 Upper electrode
2108 Pattern
2109 Element region
3301 Lower electrode
3302 Variable resistance layer
3303 Upper electrode

The invention claimed is:

1. A variable resistance nonvolatile storage device comprising:
a semiconductor substrate;
a variable resistance element including: a first electrode; a second electrode; and a variable resistance layer which is provided between said first and second electrodes and in contact with said first and second electrodes and which has a resistance value that reversibly varies based on voltage signals each of which has a different polarity and is applied between said first and second electrodes; and
an N-type MOS transistor formed on a main surface of said semiconductor substrate, said N-type MOS transistor including: a first N-type diffusion layer region; a gate; and a second N-type diffusion layer region formed on a side of said gate opposite said first N-type diffusion layer region,
wherein said variable resistance layer includes: a first region which is in contact with said first electrode and contains a first oxygen-deficient transition metal oxide having a composition $MO_x$; and a second region which is in contact with said second electrode and contains a second oxygen-deficient transition metal oxide having a composition $MO_y$ (where x<y),
wherein said first N-type diffusion layer region of said N-type MOS transistor is connected with said first electrode included in said variable resistance element to form a memory cell so that a substrate bias effect in said N-type MOS transistor is smaller when one of the voltage signals having a polarity that causes a resistance change to high resistance state in said variable resistance layer is applied to said N-type MOS transistor and said variable resistance element, than when another one of the voltage signals having a polarity that causes a resistance change to low resistance state in said variable resistance layer is applied to said N-type MOS transistor and said variable resistance element, and
wherein the first region of the variable resistance layer and the first electrode of the variable resistance element are each connected between the first N-type diffusion layer region and the second region of the variable resistance layer.

2. The variable resistance nonvolatile storage device according to claim 1,
wherein said second electrode comprises a material having a standard electrode potential which is higher than a standard electrode potential of a transition metal of said first and second oxygen-deficient transition metal oxides, and
wherein said first electrode comprises a material having a standard electrode potential which is lower than the standard electrode potential of said second electrode.

3. The variable resistance nonvolatile storage device according to claim 1,
wherein said variable resistance layer has a layered structure in which at least two layers are stacked, the two layers being: a first oxygen-deficient tantalum oxide layer having a composition $TaO_x$ (where $0.8 \le x \le 1.9$) as said first region; and a second oxygen-deficient tantalum oxide layer having a composition $TaO_y$ (where $2.1 \le y < 2.5$) as said second region.

4. The variable resistance nonvolatile storage device according to claim 3,
wherein a thickness of said second oxygen-deficient tantalum oxide layer is between 1 nm and 8 nm inclusive.

5. The variable resistance nonvolatile storage device according to claim 1,
wherein said variable resistance layer has a layered structure in which at least two layers are stacked, the two layers being: a first oxygen-deficient hafnium oxide layer having a composition $HfO_x$ (where $0.9 \le x \le 1.6$) as said first region; and a second oxygen-deficient hafnium oxide layer having a composition $HfO_y$ (where $1.8 < y < 2$) as said second region.

6. The variable resistance nonvolatile storage device according to claim 5,
wherein a thickness of said second oxygen-deficient hafnium oxide layer is between 1 nm and 5 nm inclusive.

7. The variable resistance nonvolatile storage device according to claim 1,
wherein said variable resistance layer has a layered structure in which at least two layers are stacked, the two layers being: a first oxygen-deficient zirconium oxide layer having a composition $ZrO_x$ (where $0.9 \le x \le 1.4$) as said first region; and a second oxygen-deficient zirconium oxide layer having a composition $ZrO_y$ (where $1.9 < y < 2$) as said second region.

8. The variable resistance nonvolatile storage device according to claim 7,
wherein a thickness of said second oxygen-deficient zirconium oxide layer is between 1 nm and 5 nm inclusive.

9. The variable resistance nonvolatile storage device according to claim 1,
wherein said first electrode, said second electrode, and said variable resistance layer are stacked on the main surface of said semiconductor substrate,
wherein said first electrode is provided as a lower electrode closer to the main surface of said semiconductor substrate, and
wherein said second electrode is provided as an upper electrode farther from the main surface of said semiconductor substrate.

10. The variable resistance nonvolatile storage device according to claim 1,
wherein a resistance value of said variable resistance element changes in said second region of said variable resistance layer, said second region being in contact with said second electrode.

11. The variable resistance nonvolatile storage device according to claim 10,
wherein said second region changes into a high resistance state when an oxygen ion in said variable resistance layer moves towards said second electrode due to an electric field directed from said second electrode to said first electrode and combines with a transition metal oxide in said second region, and wherein said second region changes into a low resistance state when the combined oxygen ion moves towards said first electrode due to an electric field directed from said first electrode to said second electrode and leaves said second region.

12. The variable resistance nonvolatile storage device according to claim 1, wherein the resistance value of said variable resistance element changes to $R_H$ when a voltage higher than a positive voltage $V_{HR}$ is applied to said second electrode with reference to a voltage at said first electrode, and wherein the resistance value of said variable resistance element changes to $R_L$ that is smaller than $R_H$ when a voltage higher than a positive voltage $V_{LR}$ is applied to said first electrode with reference to a voltage at said second electrode.

13. The variable resistance nonvolatile storage device according to claim 1, further comprising a driving circuit electrically connected with the memory cell including said variable resistance element and said N-type MOS transistor, wherein said driving circuit:

changes the resistance value of said variable resistance element to $R_H$ by applying a voltage $V_1$ higher than a positive voltage $V_{HR}$ to said second electrode with reference to a voltage at said first electrode; and changes the resistance value of said variable resistance element to $R_L$ that is smaller than $R_H$ by applying a voltage $V_2$ higher than a positive voltage $V_{LR}$ to said first electrode with reference to a voltage at said second electrode, and wherein an absolute value $|V_2|$ of the voltage $V_2$ is larger than an absolute value $|V_1|$ of the voltage $V_1$.

14. A variable resistance nonvolatile storage device comprising:

a semiconductor substrate;

a variable resistance element including: a first electrode; a second electrode; and a variable resistance layer which is provided between said first and second electrodes and in contact with said first and second electrodes and which has a resistance value that reversibly varies based on voltage signals each of which has a different polarity and is applied between said first and second electrodes; and a P-type MOS transistor formed on a main surface of said semiconductor substrate and including: a first P-type diffusion layer region; a gate; and a second P-type diffusion layer region formed on a side of said gate opposite said first P-type diffusion layer region, wherein said variable resistance layer includes: a first region which is in contact with said first electrode and contains a first oxygen-deficient transition metal oxide having a composition $MO_x$; and a second region which is in contact with said second electrode and contains a second oxygen-deficient transition metal oxide having a composition $MO_y$ (where x<y), wherein said first P-type diffusion layer region of said P-type MOS transistor is connected with said second electrode included in said variable resistance element to form a memory cell so that a substrate bias effect in said P-type MOS transistor is smaller when one of the voltage signals having a polarity that causes a resistance change to high resistance state in said variable resistance layer is applied to said P-type MOS transistor and said variable resistance element, than when another one of the voltage signals having a polarity that causes a resistance change to low resistance state in said variable resistance layer is applied to said P-type MOS transistor and said variable resistance element, and wherein the second region of the variable resistance layer and the second electrode of the variable resistance element are each connected between the first P-type diffusion layer region and the first region of the variable resistance layer.

15. The variable resistance nonvolatile storage device according to claim 14, wherein said second electrode comprises a material having a standard electrode potential which is higher than a standard electrode potential of a transition metal of said first and second oxygen-deficient transition metal oxides, and wherein said first electrode comprises a material having a standard electrode potential which is lower than the standard electrode potential of said second electrode.

16. The variable resistance nonvolatile storage device according to claim 14, wherein said variable resistance layer has a layered structure in which at least two layers are stacked, the two layers being: a first oxygen-deficient tantalum oxide layer having a composition $TaO_x$ (where 0.8≤x≤1.9) as said first region; and a second oxygen-deficient tantalum oxide layer having a composition $TaO_y$ (where 2.1≤y<2.5) as said second region.

17. The variable resistance nonvolatile storage device according to claim 16, wherein a thickness of said second oxygen-deficient tantalum oxide layer is between 1 nm and 8 nm inclusive.

18. The variable resistance nonvolatile storage device according to claim 14, wherein said variable resistance layer has a layered structure in which at least two layers are stacked, the two layers being: a first oxygen-deficient hafnium oxide layer having a composition $HfO_x$ (where 0.9≤x≤1.6) as said first region; and a second oxygen-deficient hafnium oxide layer having a composition $HfO_y$ (where 1.8<y<2) as said second region.

19. The variable resistance nonvolatile storage device according to claim 18, wherein a thickness of said second oxygen-deficient hafnium oxide layer is between 1 nm and 5 nm inclusive.

20. The variable resistance nonvolatile storage device according to claim 14, wherein said variable resistance layer has a layered structure in which at least two layers are stacked, the two layers being: a first oxygen-deficient zirconium oxide layer having a composition $ZrO_x$ (where 0.9 ≤x≤1.4) as said first region; and a second oxygen-deficient zirconium oxide layer having a composition $ZrO_y$ (where 1.9<y<2) as said second region.

21. The variable resistance nonvolatile storage device according to claim 20, wherein a thickness of said second oxygen-deficient zirconium oxide layer is between 1 nm and 5 nm inclusive.

22. The variable resistance nonvolatile storage device according to claim 14, wherein said first electrode, said second electrode, and said variable resistance layer are stacked on the main surface of said semiconductor substrate, wherein said first electrode is provided as an upper electrode farther from the main surface of said semiconductor substrate, and wherein said second electrode is provided as a lower electrode closer to the main surface of said semiconductor substrate.

23. The variable resistance nonvolatile storage device according to claim 14,
   wherein a resistance value of said variable resistance element changes in said second region of said variable resistance layer, said second region being in contact with said second electrode.

24. The variable resistance nonvolatile storage device according to claim 23,
   wherein said second region changes into a high resistance state when an oxygen ion in said variable resistance layer moves towards said second electrode due to an electric field directed from said second electrode to said first electrode and combines with a transition metal oxide in said second region, and
   wherein said second region changes into a low resistance state when the combined oxygen ion moves towards said first electrode due to an electric field directed from said first electrode to said second electrode and leaves said second region.

25. The variable resistance nonvolatile storage device according to claim 14,
   wherein the resistance value of said variable resistance element changes to $R_H$ when a voltage higher than a positive voltage $V_{HR}$ is applied to said first electrode with reference to a voltage at said second electrode, and
   wherein the resistance value of said variable resistance element changes to $R_L$ that is smaller than $R_H$ when a voltage higher than a positive voltage $V_{LR}$ is applied to said second electrode with reference to a voltage at said first electrode.

26. The variable resistance nonvolatile storage device according to claim 14, further comprising
   a driving circuit electrically connected with the memory cell including said variable resistance element and said P-type MOS transistor,
   wherein said driving circuit:
      changes the resistance value of said variable resistance element to $R_H$ by applying a voltage $V_1$ higher than a positive voltage $V_{HR}$ to said second electrode with reference to a voltage at said first electrode; and
      changes the resistance value of said variable resistance element to $R_L$ that is smaller than $R_H$ by applying a voltage $V_2$ higher than a positive voltage $V_{LR}$ to said first electrode with reference to a voltage at said second electrode, and
   wherein an absolute value $|V_2|$ of the voltage $V_2$ is larger than an absolute value $|V_1|$ of the voltage $V_1$.

* * * * *